(12) United States Patent
Fukuo

(10) Patent No.: US 10,886,366 B2
(45) Date of Patent: Jan. 5, 2021

(54) SEMICONDUCTOR STRUCTURES FOR PERIPHERAL CIRCUITRY HAVING HYDROGEN DIFFUSION BARRIERS AND METHOD OF MAKING THE SAME

(71) Applicant: SANDISK TECHNOLOGIES LLC, Addison, TX (US)

(72) Inventor: Noritaka Fukuo, Ofuna (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 24 days.

(21) Appl. No.: 16/258,086

(22) Filed: Jan. 25, 2019

(65) Prior Publication Data
US 2020/0243642 A1  Jul. 30, 2020

(51) Int. Cl.
| H01L 29/06 | (2006.01) |
| H01L 27/11556 | (2017.01) |
| H01L 27/11582 | (2017.01) |
| H01L 21/765 | (2006.01) |
| H01L 27/11575 | (2017.01) |

(Continued)

(52) U.S. Cl.
CPC ........ *H01L 29/0638* (2013.01); *H01L 21/765* (2013.01); *H01L 21/823481* (2013.01); *H01L 27/11548* (2013.01); *H01L 27/11556* (2013.01); *H01L 27/11575* (2013.01); *H01L 27/11582* (2013.01)

(58) Field of Classification Search
CPC ........... H01L 29/0638; H01L 27/11556; H01L 27/11582; H01L 21/765; H01L 27/11575; H01L 21/823481; H01L 27/11548
See application file for complete search history.

(56) References Cited

U.S. PATENT DOCUMENTS 5,915,167 A  6/1999 Leedy
9,620,512 B1 * 4/2017 Nishikawa ........ H01L 27/11531
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Mohammed Shamsuzzaman
*Assistant Examiner* — Khatib A Rahman
(74) *Attorney, Agent, or Firm* — The Marbury Law Group PLLC

(57) ABSTRACT

A semiconductor structure includes a device region including field effect transistors located on a semiconductor substrate, and a planarization dielectric layer overlying the field effect transistors. A hydrogen-blocking structure can be formed to prevent subsequent hydrogen diffusion into the device region. A moat trench is formed through the planarization dielectric layer and into the semiconductor substrate around the device region. A ring-shaped hydrogen-diffusion-blocking material portion is formed within the moat trench. A horizontally-extending portion of a silicon nitride diffusion barrier layer is formed over the planarization dielectric layer. The ring-shaped hydrogen-diffusion-blocking material portion may include a vertically-extending annular portion of the silicon nitride layer, or may include an annular metal portion that is formed prior to formation of the silicon nitride diffusion barrier layer.

12 Claims, 47 Drawing Sheets

(51) Int. Cl.
  *H01L 21/8234* (2006.01)
  *H01L 27/11548* (2017.01)

(56) References Cited

U.S. PATENT DOCUMENTS

| | | |
|---|---|---|
| 9,991,280 B2 | 6/2018 | Nakamura et al. |
| 10,115,681 B1* | 10/2018 | Ariyoshi ............ H01L 27/11524 |
| 2007/0148908 A1* | 6/2007 | Byun ................ H01L 21/76235 |
| | | 438/435 |
| 2015/0371893 A1* | 12/2015 | Chou ................ H01L 21/76283 |
| | | 257/621 |
| 2016/0172314 A1* | 6/2016 | Cheng ................... H01L 23/564 |
| | | 257/509 |
| 2017/0179154 A1* | 6/2017 | Furihata .............. H01L 27/0288 |
| 2017/0236835 A1* | 8/2017 | Nakamura ........ H01L 21/31111 |
| | | 257/314 |
| 2018/0151497 A1 | 5/2018 | Makala et al. |
| 2018/0248013 A1* | 8/2018 | Chowdhury ........ H01L 29/1037 |
| 2018/0342455 A1 | 11/2018 | Nosho et al. |
| 2019/0006381 A1 | 1/2019 | Nakatsuji et al. |

OTHER PUBLICATIONS

U.S. Appl. No. 15/863,205, filed Jan. 5, 2018, SanDisk Technologies LLC.
U.S. Appl. No. 15/933,947, filed Mar. 23, 2018, SanDisk Technologies LLC.
U.S. Appl. No. 15/947,378, filed Apr. 6, 2018, SanDisk Technologies LLC.

\* cited by examiner

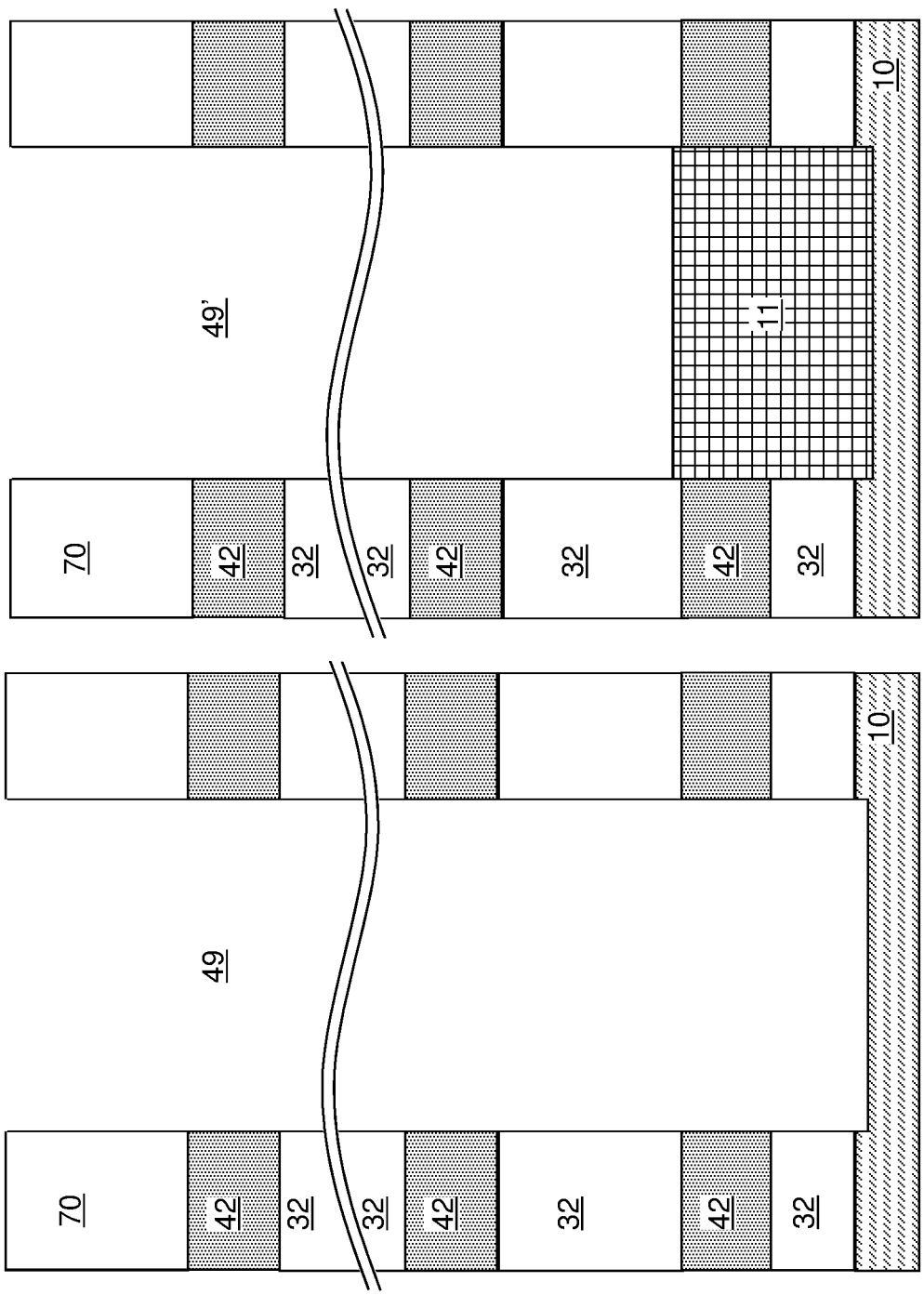

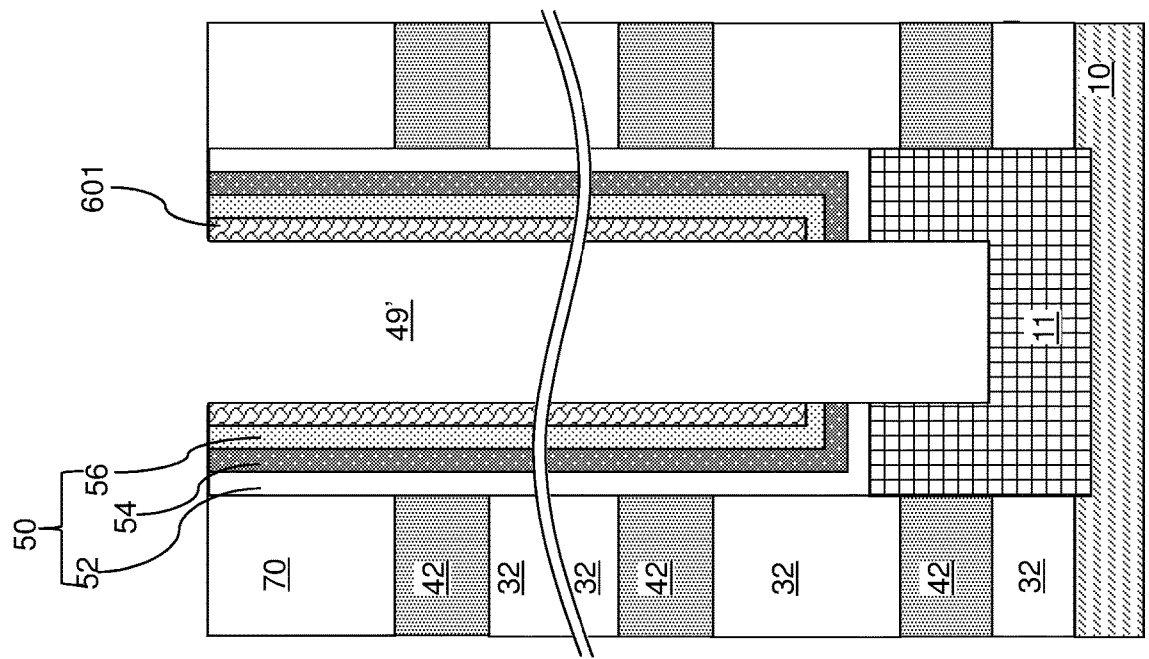
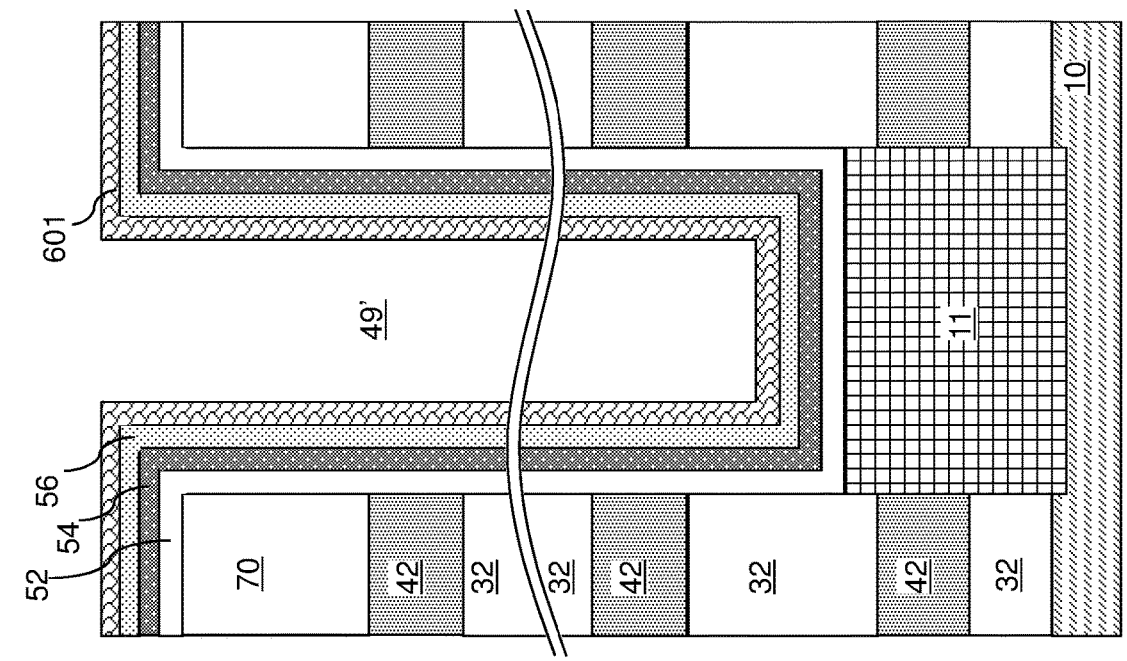

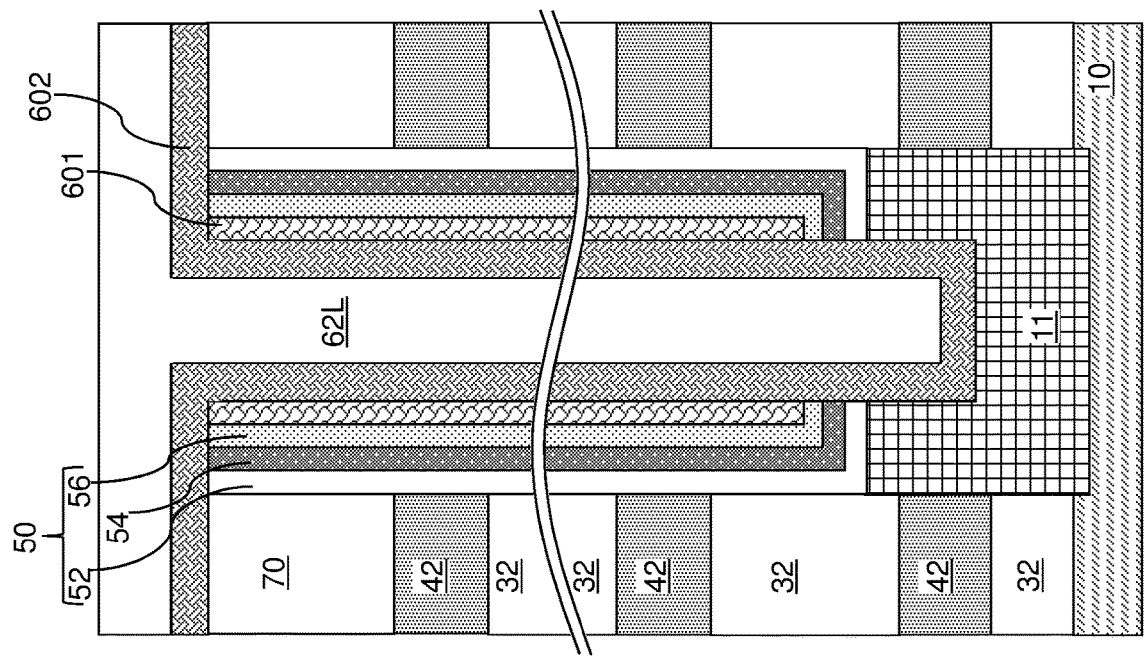
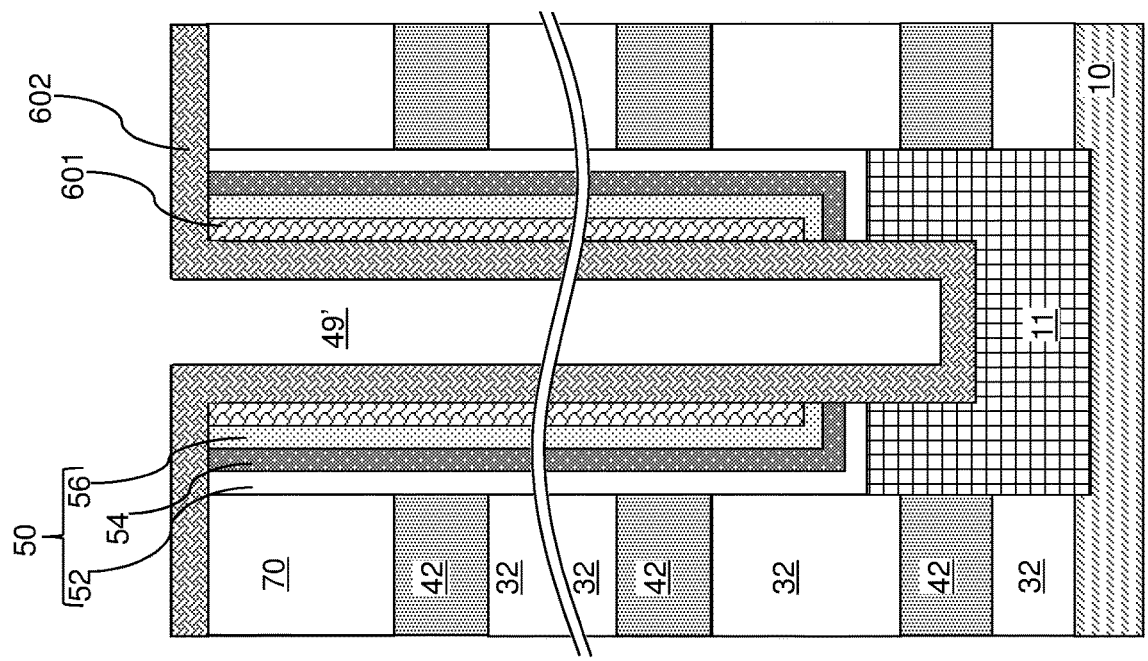

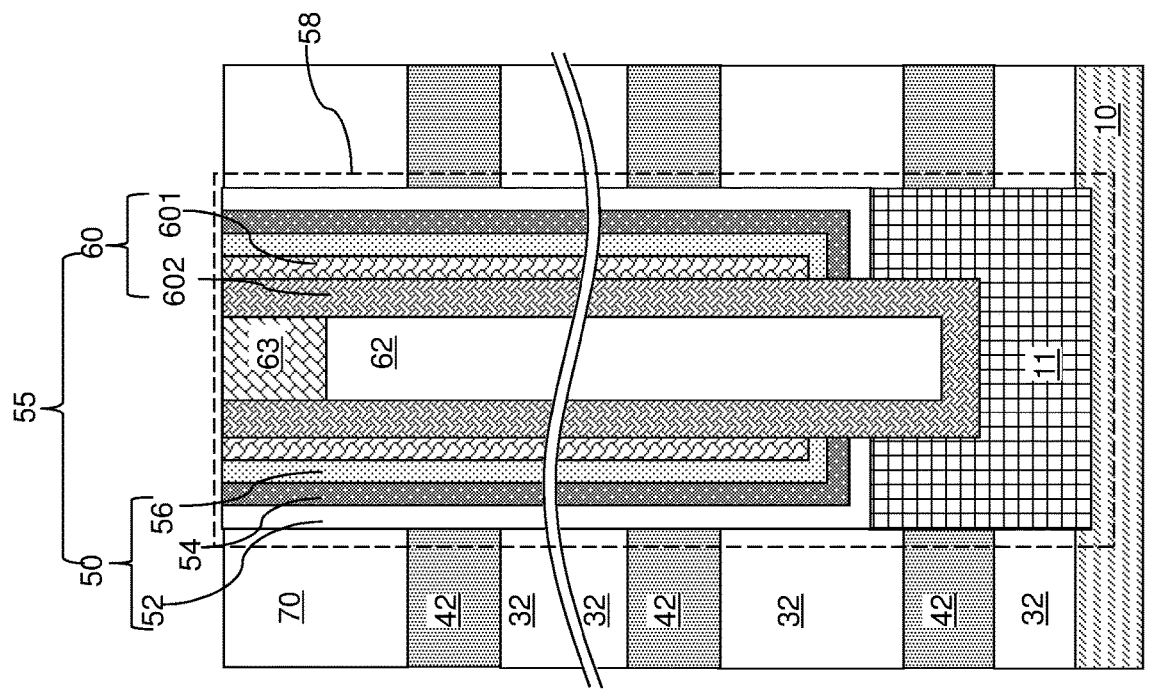
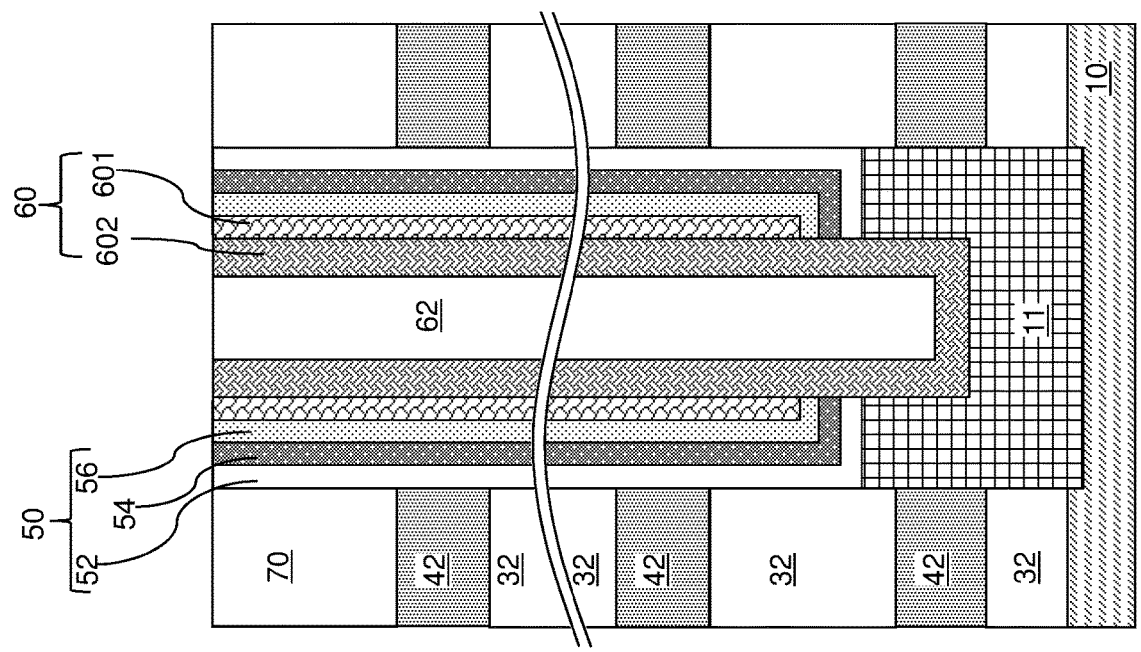

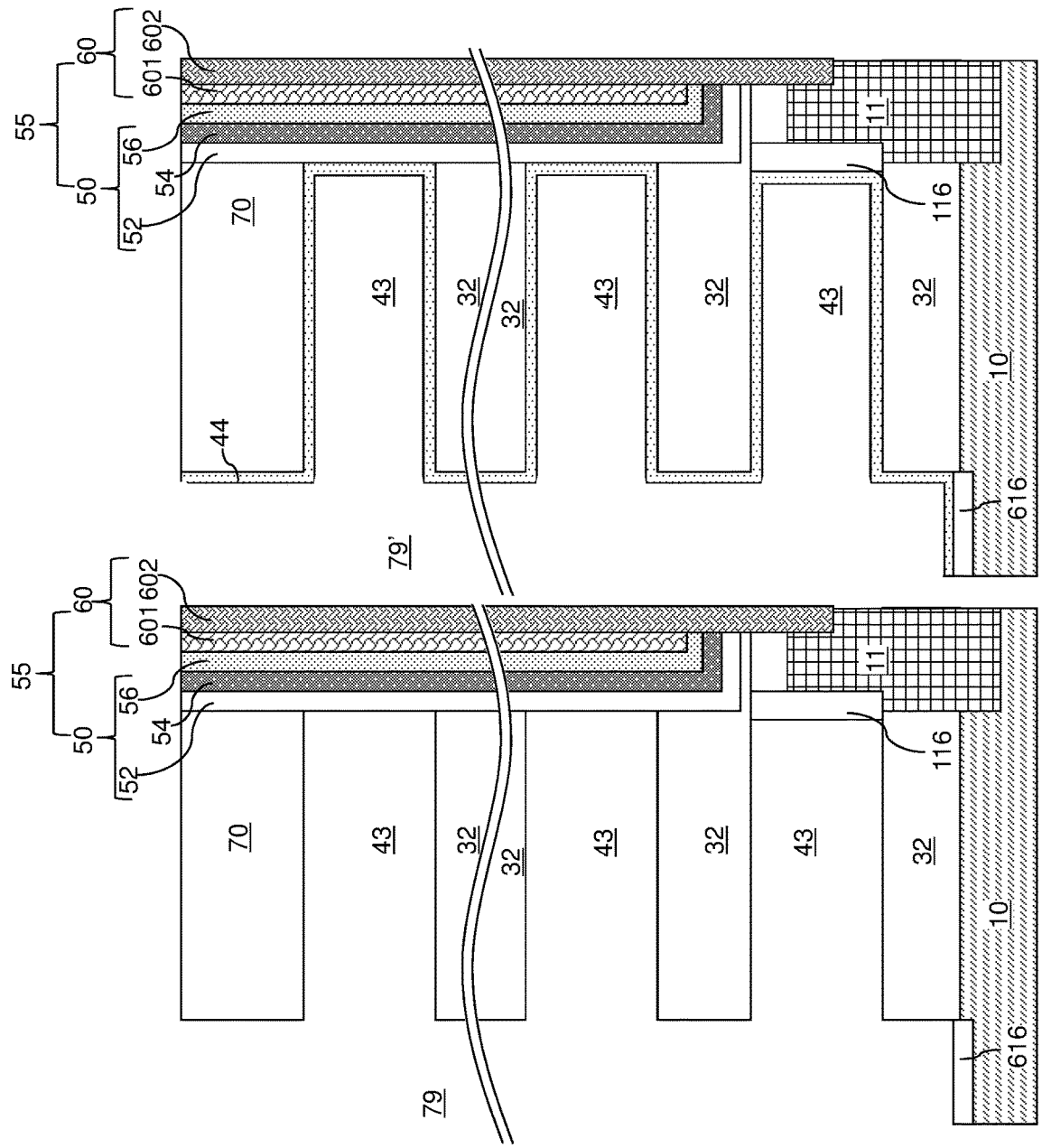

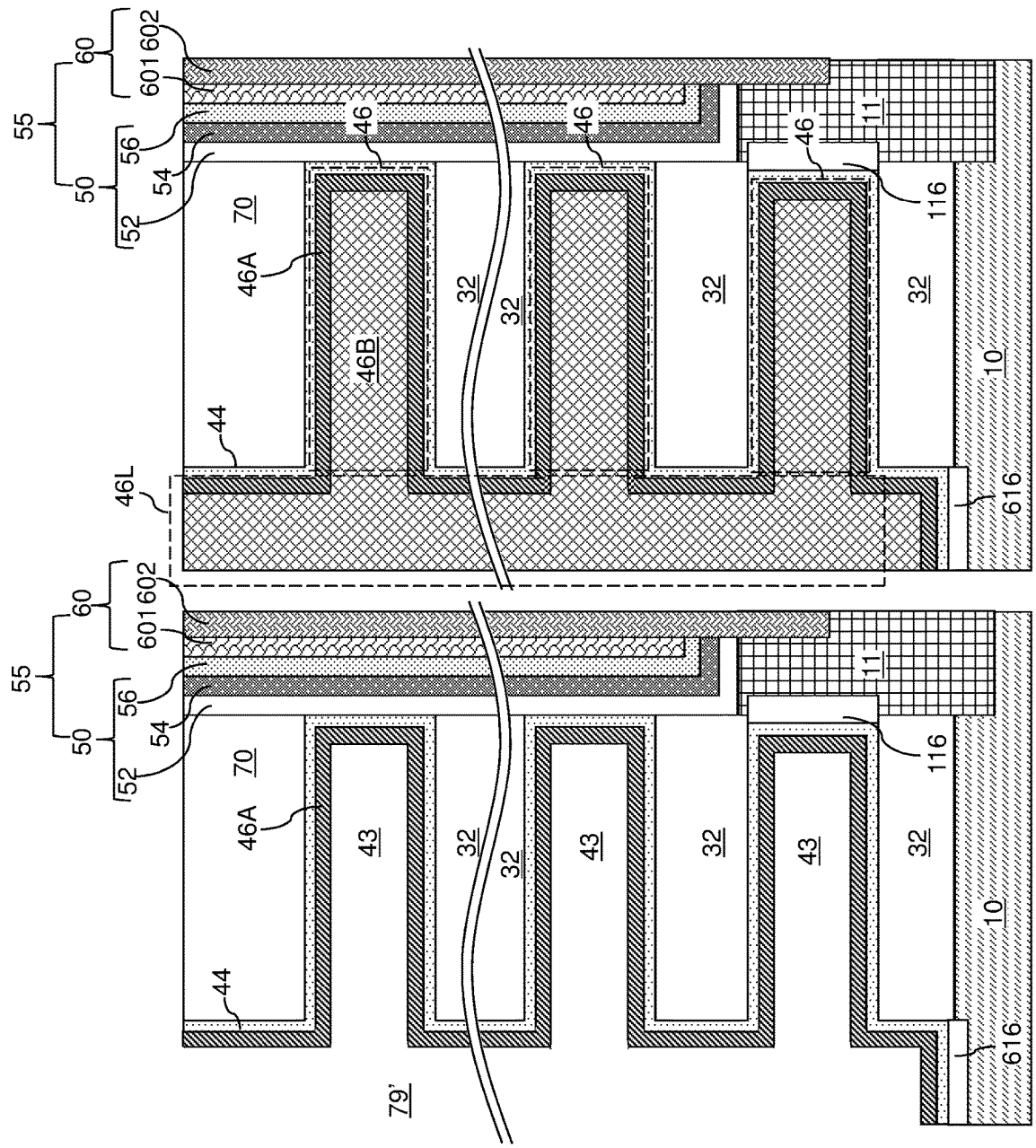

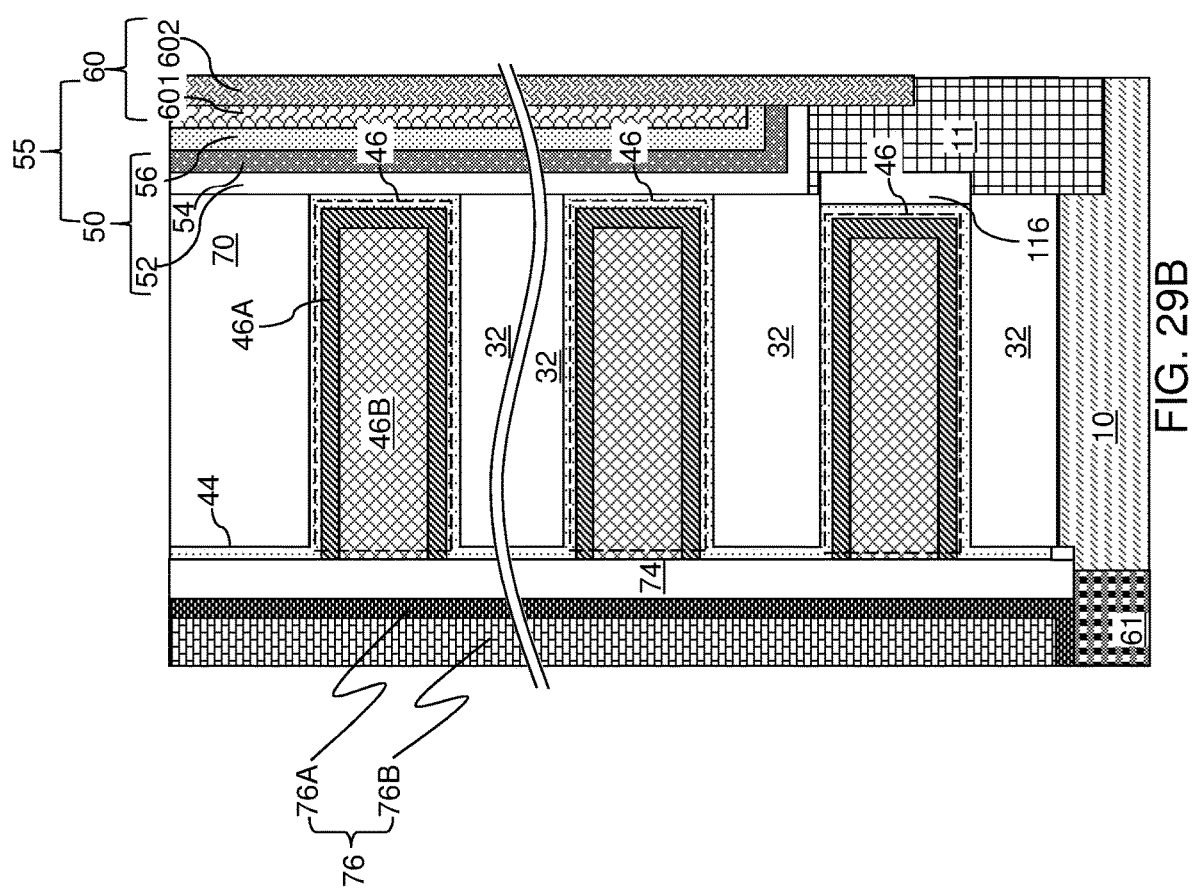

SEMICONDUCTOR STRUCTURES FOR PERIPHERAL CIRCUITRY HAVING HYDROGEN DIFFUSION BARRIERS AND METHOD OF MAKING THE SAME

FIELD

The present disclosure relates generally to the field of semiconductor devices, and particular to semiconductor structures with hydrogen diffusion barrier structures for peripheral circuits of three-dimensional memory devices and methods of manufacturing the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36. A support circuitry is used to perform write, read, and erase operations of the memory cells in the vertical NAND strings.

SUMMARY

According to an aspect of the present disclosure, a semiconductor structure is provided, which comprises: a device region including field effect transistors located on a semiconductor substrate; a planarization dielectric layer overlying the field effect transistors; a horizontally-extending portion of a silicon nitride diffusion barrier layer overlying the planarization dielectric layer; a moat trench that extends at least from a bottom surface of the silicon nitride diffusion barrier layer through the planarization dielectric layer and into the semiconductor substrate, and laterally encloses the device region, wherein a bottom surface of the moat trench is vertically recessed from a top surface of the semiconductor substrate by a recess depth; and a ring-shaped hydrogen-diffusion-blocking material portion located within the moat trench, and is adjoined to the horizontally-extending portion of the silicon nitride diffusion barrier layer.

According to another aspect of the present disclosure, a method of forming a semiconductor structure is provided, which comprises: forming field effect transistors in a device region on a semiconductor substrate; forming a planarization dielectric layer over the field effect transistors; forming a moat trench that laterally encloses the device region through the planarization dielectric layer and into the semiconductor substrate, wherein a bottom surface of the moat trench is vertically recessed from a top surface of the semiconductor substrate by a recess depth; forming a ring-shaped hydrogen-diffusion-blocking material portion within the moat trench; and forming a horizontally-extending portion of a silicon nitride diffusion barrier layer over the planarization dielectric layer concurrently with, or before, formation of the ring-shaped hydrogen-diffusion-blocking material portion, wherein the ring-shaped hydrogen-diffusion-blocking material portion vertically extends at least from a bottom surface of the silicon nitride diffusion barrier layer through the planarization dielectric layer and to the bottom surface of the moat trench.

BRIEF DESCRIPTION OF THE DRAWINGS

FIGS. 22A-22H are sequential schematic vertical cross-sectional views of a memory opening within the exemplary structure during formation of a memory stack structure, an optional dielectric core, and a drain region therein according to an embodiment of the present disclosure.

FIGS. 26A-26D are sequential vertical cross-sectional views of a region of the exemplary structure during formation of electrically conductive layers according to an embodiment of the present disclosure.

FIG. 29B is a magnified view of a region of the exemplary structure of FIG. 29A.

DETAILED DESCRIPTION

Figure 1:
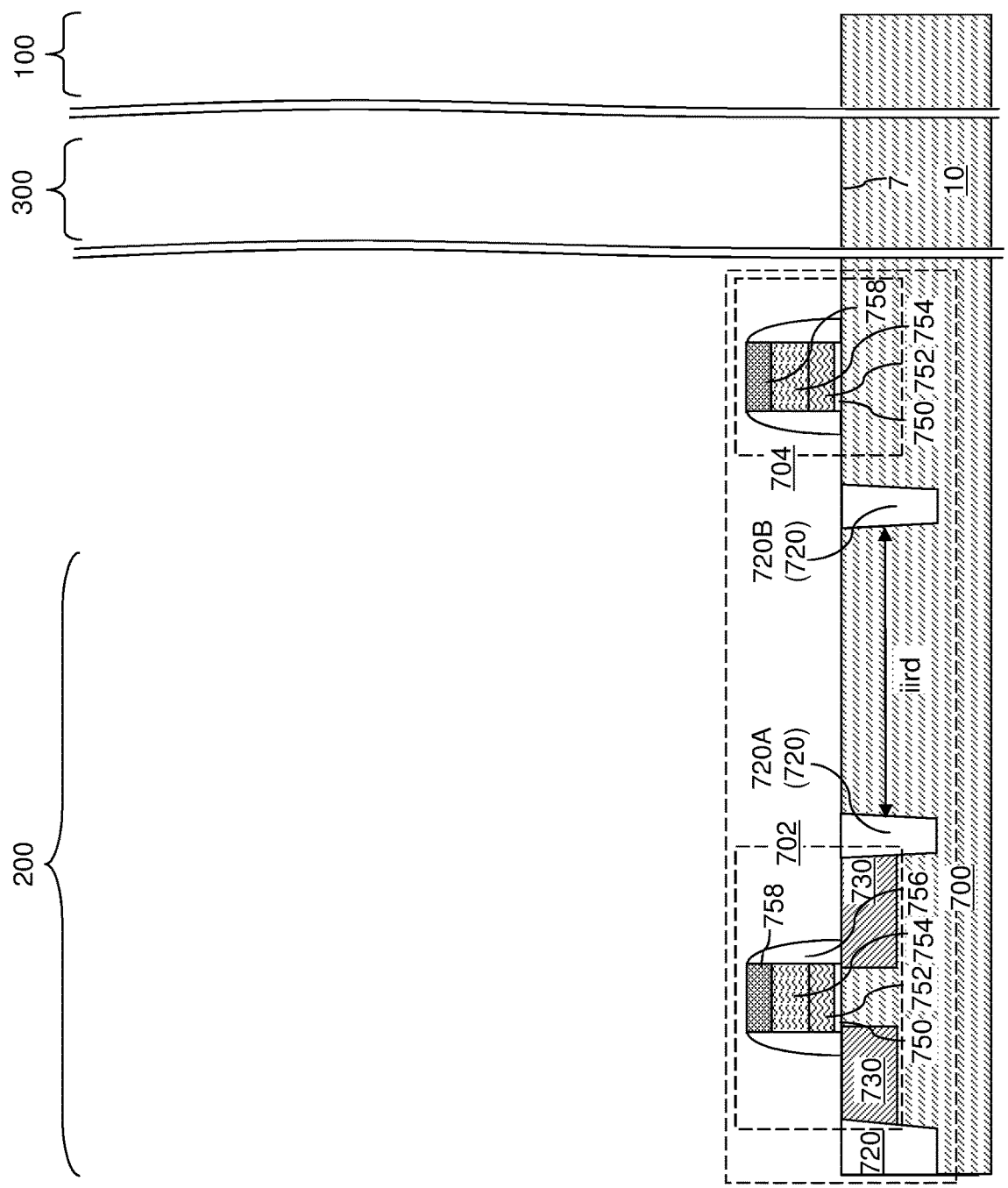
FIG. 1 is a schematic vertical cross-sectional view of a first configuration of an exemplary structure after formation of field effect transistors and a dummy gate structure according to a first embodiment of the present disclosure.

During manufacture of three-dimensional vertical NAND devices, an alternating stack of silicon nitride layers and silicon oxide layers can be formed, and the silicon nitride layers can be subsequently replaced with electrically conductive layers to form word lines. However, the silicon nitride layers release a significant amount of hydrogen atoms prior to replacement with the electrically conductive layers. Active hydrogen atoms can diffuse downward into a peripheral device region on a semiconductor substrate, and degrade device characteristics of CMOS peripheral (e.g., driver circuit) devices thereupon. Formation of dedicated hydrogen diffusion barrier structures generally include significant number of processing steps, and may still leave gaps between hydrogen diffusion barrier structures because silicon oxide layers function as hydrogen diffusion paths to the CMOS devices.

The embodiments of the present disclosure provide a low cost and simply hydrogen diffusion barrier structures for reducing or preventing diffusion of hydrogen atoms into peripheral devices on the semiconductor substrate without incurring device area penalty. Hydrogen diffusion into CMOS devices on a semiconductor substrate can be reduced or suppressed, and device characteristics of the CMOS devices can be enhanced. Hydrogen diffusion may be blocked both laterally and vertically using a combination of diffusion barrier structures. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices of various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased in a single erase operation. Each memory block contains a number of pages, which are the smallest units that can be selected for programming.

Referring to FIG. 1, a first configuration of an exemplary structure according to an embodiment of the present disclosure is illustrated, which can be used, for example, to fabricate a device structure containing field effect transistors and overlying semiconductor devices such as three-dimensional memory devices on a same semiconductor substrate. The exemplary structure includes a semiconductor substrate 10. As used herein, a semiconductor substrate 10 may be a semiconductor wafer, and can include at least one elemental semiconductor material (e.g., single crystal silicon wafer or layer), at least one III-V compound semiconductor material, or at least one II-VI compound semiconductor material. The semiconductor wafer may have one or more doped wells in its top surface and/or one or more semiconductor layers located over its top surface. Alternatively, the semiconductor substrate 10 may comprise a semiconductor layer formed on a top surface of an insulating or conductive substrate, such as a silicon-on-insulator type substrate. As used, herein, the term "semiconductor substrate" includes any substrate including a semiconductor material layer at an uppermost portion thereof. The semiconductor substrate 10 can have a major surface 7, which can be, for example, a topmost surface. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the semiconductor substrate 10. The peripheral circuitry may comprise sense amplifiers and/or other driver circuitry for the memory device. The at least one semiconductor device can include, for example, field effect transistors 702, such as field effect transistors arranged as CMOS device. For example, at least one shallow trench isolation structure 720 can be formed by etching portions of the semiconductor substrate 10 and depositing a dielectric material therein. A gate dielectric layer, at least one gate conductor layer, and a gate cap dielectric layer can be formed over the semiconductor substrate 10, and can be subsequently patterned to form at least one gate structure (750, 752, 754, 758), each of which can include a gate dielectric 750, a gate electrode (752, 754), and a gate cap dielectric 758. The gate cap dielectric 758 can comprise any suitable insulating material, such as silicon nitride, silicon oxide or silicon oxynitride. In one embodiment, the gate cap dielectric 758 comprises silicon nitride, and is referred to as a gate cap silicon nitride portion 758. Each set of a gate cap silicon nitride portion 758 and a gate electrode (752, 754) can be formed by depositing and patterning gate electrode layer(s) and a gate cap silicon nitride layer. An anisotropic etch process that uses a same mask pattern can be used to pattern the gate electrode layer(s) and the gate cap silicon nitride layer to provide the gate cap silicon nitride portions 758 and the gate electrodes (752, 754).

The gate electrode (752, 754) may include a stack of a first gate electrode portion 752 and a second gate electrode portion 754. For example, the first gate electrode portion 752 can include a doped semiconductor material such as doped polysilicon, and the second gate electrode portion 754 includes a metallic material such a metal (e.g., tungsten), metal nitride or metal silicide material. At least one gate spacer 756 including a dielectric material (such as silicon oxide) can be formed around the at least one gate structure (750, 752, 754, 758) by depositing and anisotropically etching a dielectric liner. Active regions 730 can be formed in upper portions of the semiconductor substrate 10, for example, by introducing electrical dopants using the at least one gate structure (750, 752, 754, 758) as masking structures. Additional masks may be used as needed. The active region 730 can include source regions and drain regions of field effect transistors.

At least one dummy gate structure 704 including a gate dielectric 750, a gate electrode (752, 754), a gate cap silicon nitride portion 758, and at least one gate spacer 756 can be formed in addition to the field effect transistors. The at least one dummy gate structure 704 may, or may not, include respective active regions 730. In one embodiment, the at least one dummy gate structure 704 can laterally surround the entire area of the field effect transistors 702. In one embodiment, the at least one dummy gate structure 704 can include an annular shape having a closed outer periphery that encircles the entire area of the field effect transistors 702.

In one embodiment, a first shallow trench isolation structure 720A (which is herein referred to as an inner shallow trench isolation structure) has an annular shape and laterally surrounds the entire area of the field effect transistors 702. A second shallow trench isolation structure 720B (which is herein referred to as an outer shallow trench isolation structure) is laterally offset outward from the first shallow trench isolation structure 720A at least by an inter-isolation region distance iird and laterally surrounds the entire area of the field effect transistors 702. The inter-isolation region distance iird can be in a range from 30 nm to 3,000 nm, such as from 100 nm to 1,000 nm, although lesser and greater distances can also be used. The area between the first shallow trench isolation structure 720A and the second shallow trench isolation structure 720B can have an annular configuration in which the top surface of the semiconductor substrate 10 is physically exposed.

The region (i.e., area) of the at least one semiconductor device 700 is herein referred to as a peripheral device region 200. The region in which a memory array is subsequently formed is herein referred to as a memory array region 100. The memory array region 100 can be a memory plane, for example. A contact region 300 for subsequently forming stepped terraces of electrically conductive layers (e.g., word lines) can be provided adjacent to the memory array region 100. The field effect transistors 702, the at least one dummy gate structure 704, and additional semiconductor devices (not shown) are provided in the peripheral device region 200.

Figure 2:
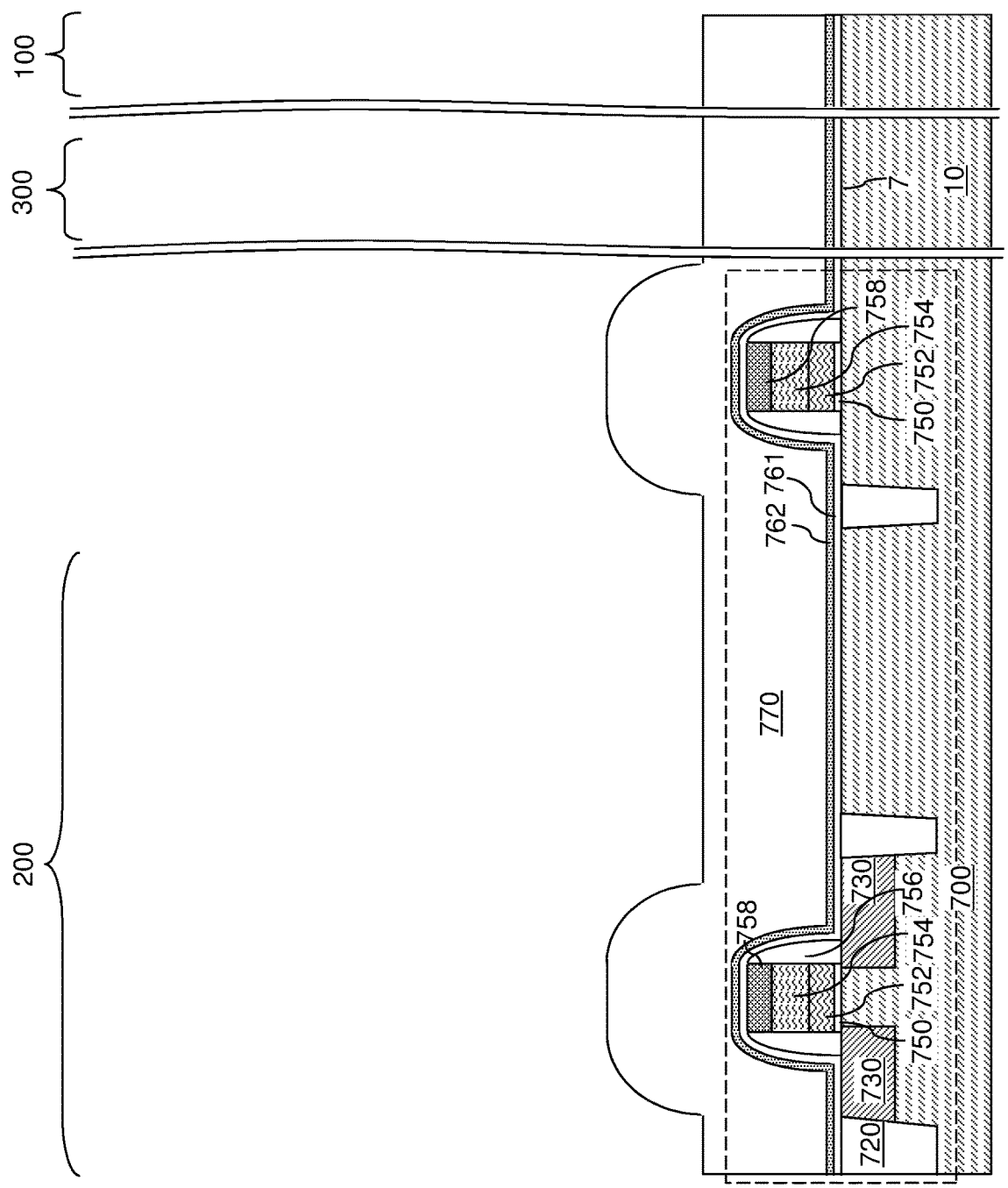
FIG. 2 is a schematic vertical cross-sectional view of the first configuration of the exemplary structure after formation of a silicon oxide liner, a silicon nitride liner, and a planarization dielectric layer according to an embodiment of the present disclosure.

Referring to FIG. 2, a silicon oxide liner 761 is formed by a conformal deposition process on the top surface of the semiconductor substrate 10, outer sidewalls of the gate spacers 756, and the top surfaces of the gate cap silicon nitride portion 758. Alternatively, the silicon oxide liner 761 can be formed prior to forming the gate spacers 756. In this configuration, the silicon oxide liner 761 extends on the sides of the gate structure (752, 754, 758) under the gate spacers 756 and on the top of the gate cap silicon nitride portion 758. The silicon oxide liner 761 can be formed, for example, by thermal decomposition of tetraethylorthosilicate (TEOS) in a low pressure chemical vapor deposition process. The thickness of the silicon oxide liner 761 can be in a range from 1.5 nm to 15 nm, such as from 2 nm to 10 nm, although lesser and greater thicknesses can also be used. An interface between the semiconductor material of the semiconductor substrate 10 and a silicon oxide material is more desirable than an interface between the semiconductor material and a silicon nitride material because an interface with silicon oxide generates less interfacial states than an interface with silicon nitride. Thus, direct contact between the silicon oxide liner 761 and the active regions 730 of the field effect transistors 702 has the beneficial effect of enhancing performance of the field effect transistors relative to comparative structures in which a silicon nitride material contacts the active regions 730.

A silicon nitride liner 762 is formed on the top surface of the silicon oxide liner 761. The silicon nitride liner 762 can be deposited as a continuous material layer without any opening therein by a conformal deposition process such as low pressure chemical vapor deposition (LPCVD). The thickness of the silicon nitride liner 762 can be in a range from 5 nm to 100 nm, such as from 30 nm to 50 nm, although lesser and greater thicknesses can also be used.

A planarization dielectric layer 770 can be deposited over the silicon nitride liner 762, the field effect transistors 702, and the dummy gate structure 704. The planarization dielectric layer 770 is an in-process structure that is subsequently modified. The planarization dielectric layer 770 includes a silicon oxide material such as undoped silicate glass, phosphosilicate glass, or borophosphosilicate glass. The planarization dielectric layer 770 can be deposited by sub-atmospheric chemical vapor deposition (SACVD) or low pressure chemical vapor deposition (LPCVD). The duration of the deposition process for depositing the planarization dielectric layer 770 is selected such that a bottommost portion of the top surface of the planarization dielectric layer 770 is formed above a horizontal plane including a topmost surface of the silicon nitride liner 762.

Figure 3:
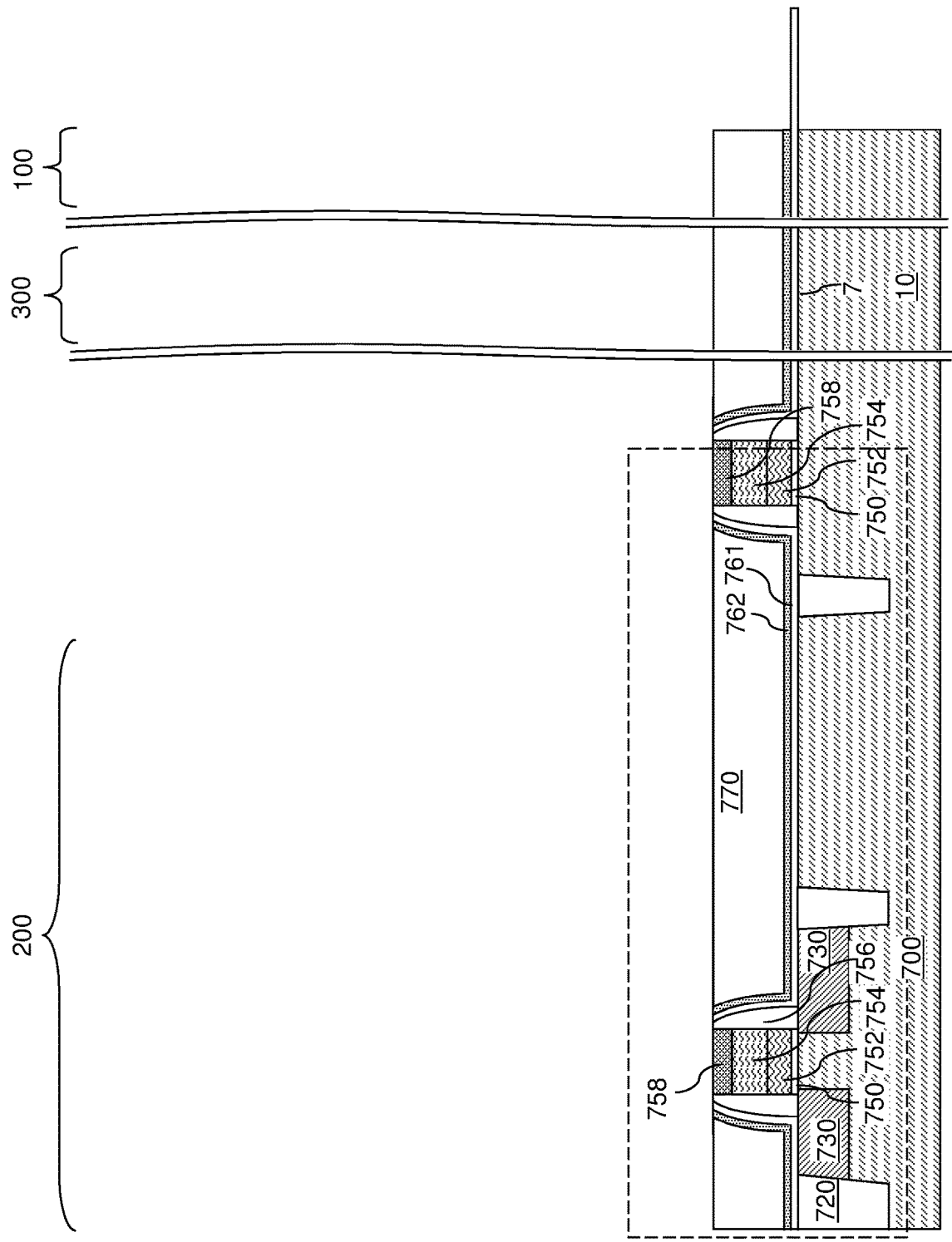
FIG. 3 is a schematic vertical cross-sectional view of the first configuration of the exemplary structure after planarization of the planarization dielectric layer, the silicon nitride liner, and the silicon oxide liner according to an embodiment of the present disclosure.

Referring to FIG. 3, a chemical mechanical planarization (CMP) process is performed to remove portions of the in-process planarization dielectric layer 770, the silicon nitride liner 762, and the silicon oxide liner 761 that overlie a horizontal plane including top surfaces of the gate cap silicon nitride portion 758. Complete removal of the silicon oxide liner 761 and physical exposure of the top surfaces of the gate cap silicon nitride portions 758 from above each gate electrode (752, 754) assists in subsequent formation of a continuous hydrogen diffusion barrier structure because the removal of the silicon oxide liner 761 from the top of the gate cap silicon nitride portions 758 eliminates a hydrogen diffusion path into the transistors 702.

In one embodiment, the gate cap silicon nitride portions 758 can be polished further after the top surfaces of the gate cap silicon nitride portions 758 are physically exposed, provided that the top surfaces of the gate electrodes (752, 754) are not physically exposed. The thickness of remaining portions of the gate cap silicon nitride portions 758 can be in a range from 20 nm to 60 nm, although the gate cap silicon nitride portions 758 may have a lesser or greater thickness after the planarization process. The top surfaces of the gate cap silicon nitride portions 758 can be coplanar with the top surface of the planarization dielectric layer 770 after the planarization process. Physically exposed top surfaces of the silicon nitride liner 762 and physically exposed top surfaces of the silicon oxide liner 761 can be within the same horizontal plane as the top surface of the planarization dielectric layer 770 and the top surfaces of the gate cap silicon nitride portions 758. The planarization dielectric layer 770 includes a planar top surface, and is located around each gate electrode (752, 754) and overlies portions of the silicon nitride liner 762 that laterally surround the gate electrodes (752, 754).

Figure 4:
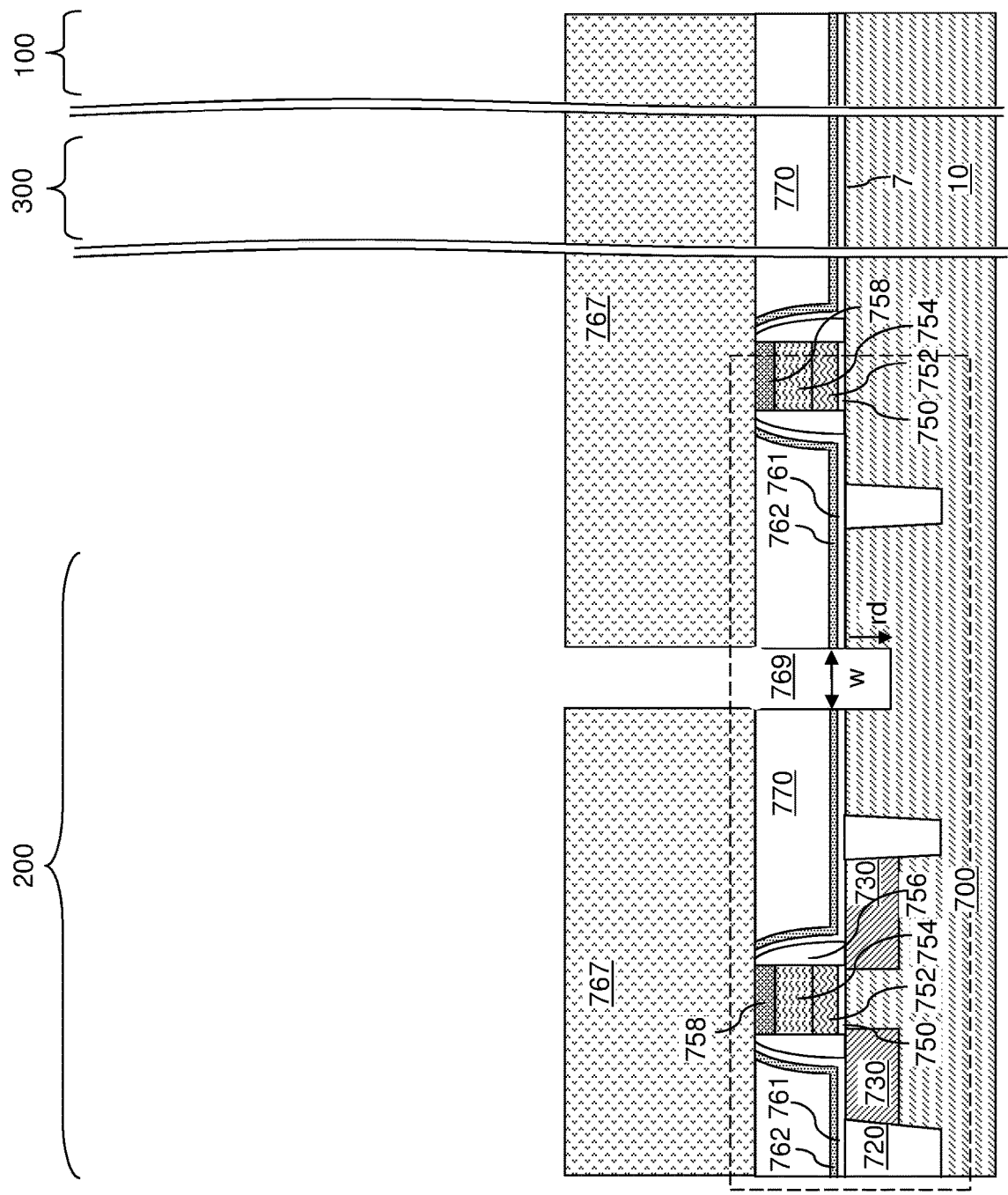
FIG. 4 is a schematic vertical cross-sectional view of the first configuration of the exemplary structure after formation of at least one moat trench according to an embodiment of the present disclosure.

Referring to FIGS. 4 and 5A-5E, a photoresist layer 767 is applied and patterned over the planarization dielectric layer 770 to form an annular opening through the photoresist layer 767. As used herein, an "annular opening" refers to an opening having a horizontal cross-sectional shape that is topologically homeomorphic to an annulus. Thus, each annular opening has an inner periphery that has a first closed shape and is laterally spaced from, and is entirely enclosed within, an outer periphery having a second closed shape. In one embodiment, each of the annular openings in the photoresist layer 767 can have a substantially uniform lateral separation distance between an inner sidewall and an outer sidewall. FIG. 4 is a vertical cross-sectional view of the first configuration of the exemplary structure, and FIGS. 5A-5E are top-down views of various plan views that illustrate layouts for the at least one annular opening in the photoresist layer 767.

Figure 5B:
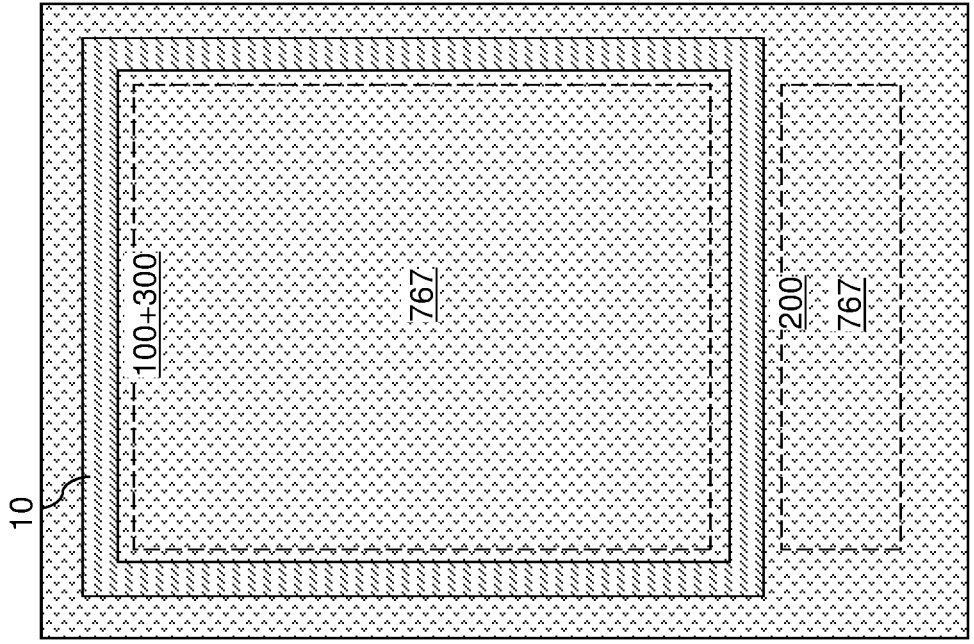
FIGS. 5A-5E illustrate top-down views of various layouts of the at least one moat trench at the processing steps of FIG. 4 according to an embodiment of the present disclosure.
Figure 5A:
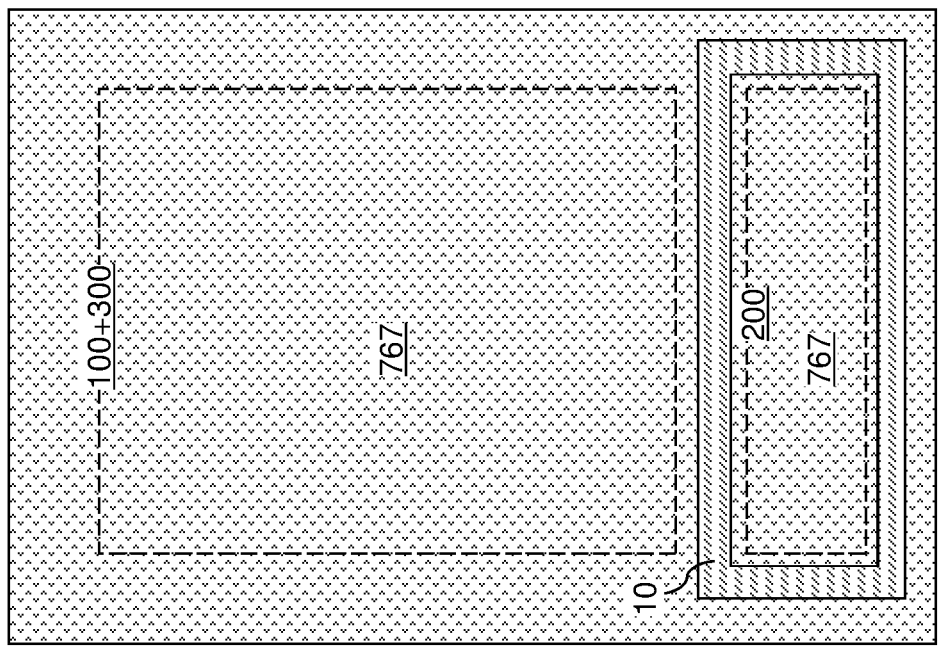
Figure 5D:
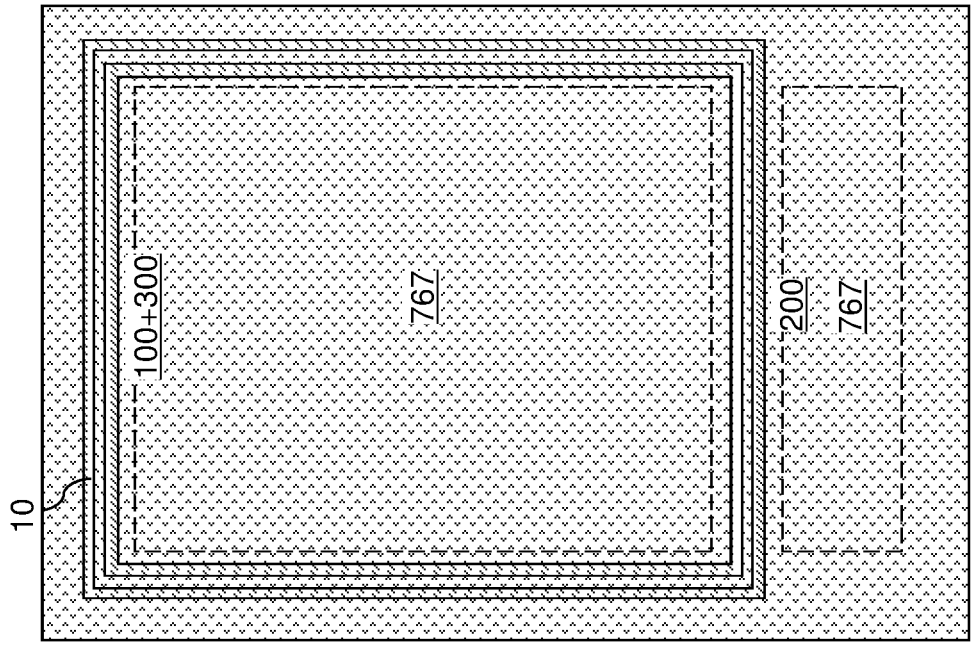
Figure 5C:
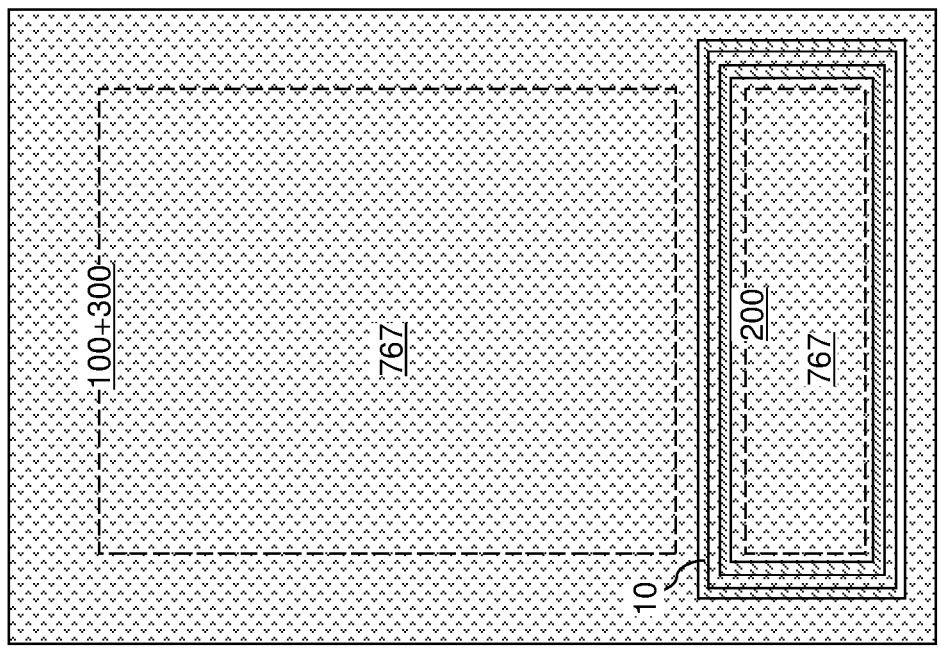
Figure 5E:
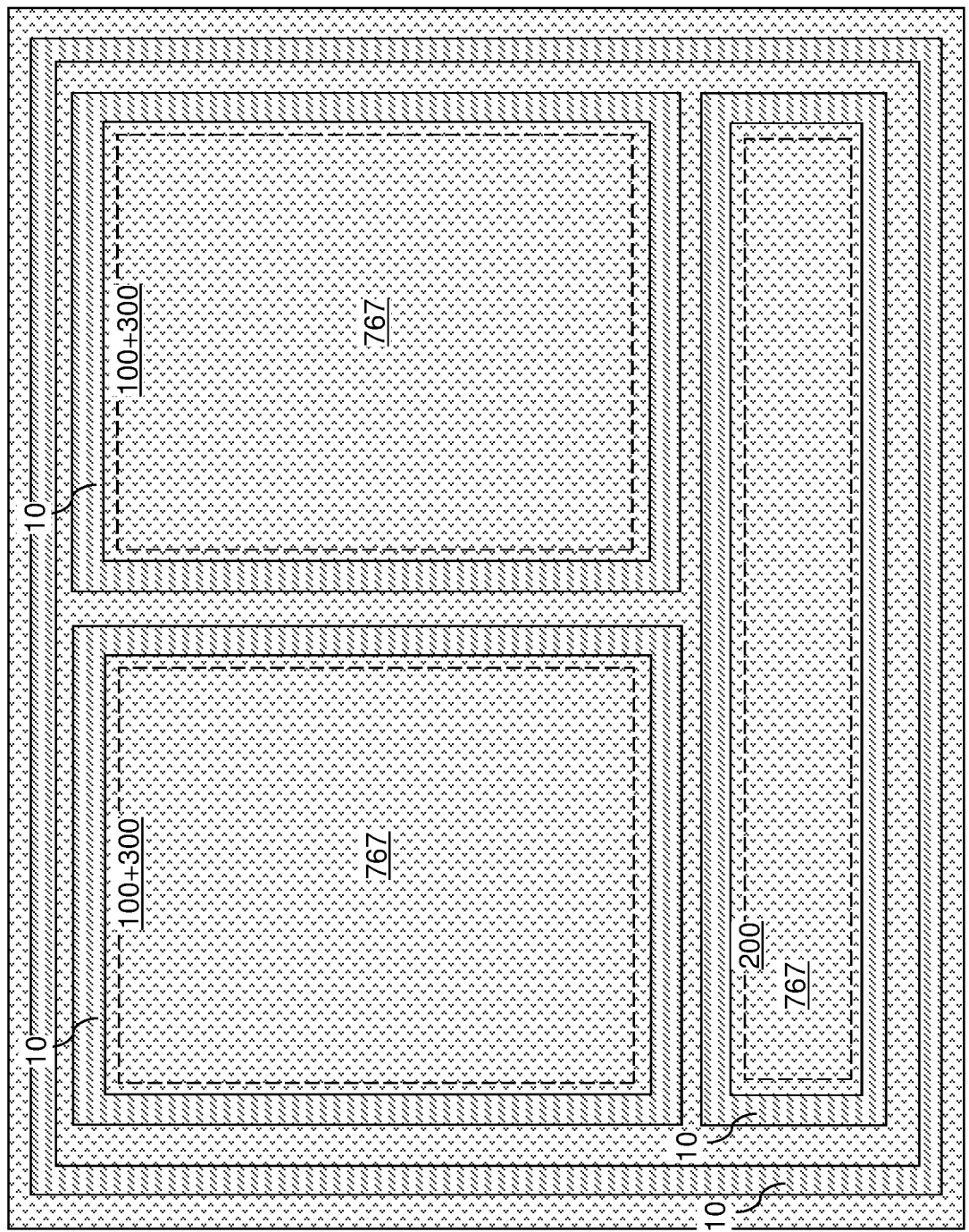

An annular opening in the photoresist layer 767 can laterally enclose the peripheral device region 200 as illustrated in FIG. 5A, and/or can laterally enclose the combination of a memory array region 100 and a contact region 300 as illustrated in FIG. 5B. In some embodiments, a plurality of nested annular openings can be formed in the photoresist layer 767 as illustrated in FIGS. 5C and 5D, and can laterally enclose the peripheral device region 200, and/or the combination of the memory array region 100 and the contact region 300. Further, if multiple memory array regions 100 (e.g., multiple memory planes) and associated contact regions 300 are formed on a same semiconductor die, and/or if a plurality of peripheral device regions 200 is formed on the same semiconductor die, multiple annular openings may laterally enclose a specific region and/or multiple regions as illustrated in FIG. 5E. In one embodiment, at least one annular opening in the photoresist layer 767 is formed such that each continuous path between a peripheral device region 200 and any of the memory array regions 100 is intersected by an area of the at least one annular opening in the photoresist layer 767. In other words, an area of the at least one annular opening in the photoresist layer 767 is interposed in every path connecting any peripheral device region 200 and any memory array region 100 in a same semiconductor die.

Portions of the planarization dielectric layer 770, the silicon nitride liner 762, the silicon oxide liner 761, and the semiconductor substrate 10 that are not masked by the photoresist layer 767 are anisotropically etched to form at least one moat trench 769. As used herein, a "moat trench" refers to a trench that extends into a substrate and laterally encircles a portion of the substrate. Each moat trench 769 can laterally enclose a device region (such as the peripheral device region 200 or a memory array region 100), and vertically extend through the planarization dielectric layer 770 and into the semiconductor substrate 10. A bottom surface of the moat trench 769 can be vertically recessed from a top surface of the semiconductor substrate 10 by a recess depth rd. The recess depth rd can be in a range from 25 nm to 1,000 nm, such as from 50 nm to 500 nm, although lesser and greater recess depths rd can also be used.

The anisotropic etching of the unmasked portions of the planarization dielectric layer 770, the silicon nitride liner 762, the silicon oxide liner 761, and the semiconductor substrate 10 can be performed by a reactive ion etch process that includes multiple steps that sequentially etch through the materials of the planarization dielectric layer 770, the silicon nitride liner 762, the silicon oxide liner 761, and the semiconductor substrate 10. Each moat trench 769 can have a width w between an inner sidewall and an outer sidewall. The width w of each moat trench 769 can be in a range from 25 nm to 1,000 nm, such as from 50 nm to 500 nm, although lesser and greater widths w can also be used. The photoresist layer 767 can be subsequently removed, for example, by ashing.

Figure 6:
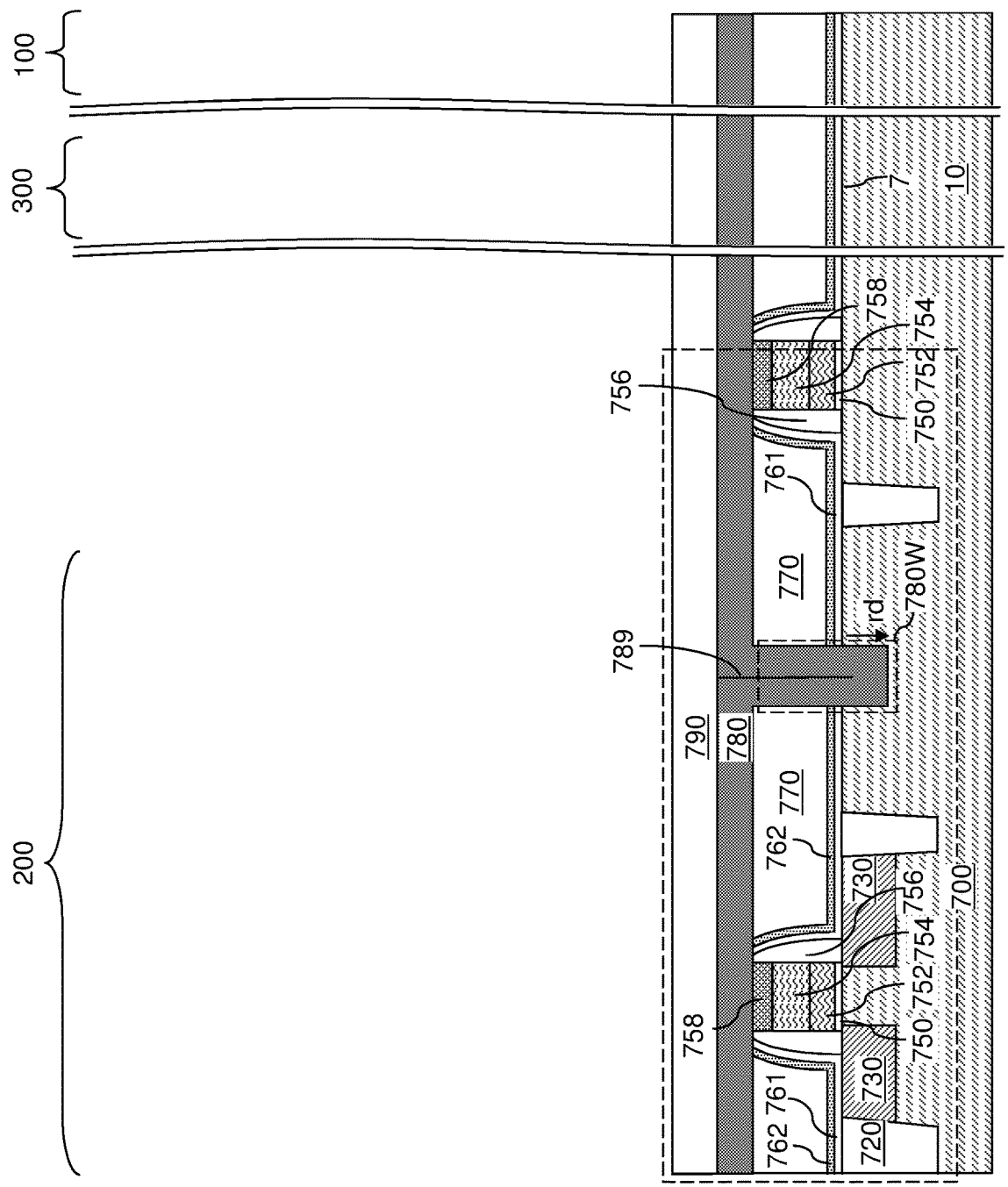
FIG. 6 is a schematic vertical cross-sectional view of the first configuration of the exemplary structure after formation of a silicon nitride diffusion barrier layer that includes a ring-shaped hydrogen-diffusion-blocking material portion and formation of an optional silicon oxide cap layer according to an embodiment of the present disclosure.

Referring to FIG. 6, a silicon nitride diffusion barrier layer 780 can be formed over the planarization dielectric layer 770 and the semiconductor substrate 10 and in each moat trench 769. The silicon nitride diffusion barrier layer 780 can be deposited by a conformal deposition process, such as a low pressure chemical vapor deposition (LPCVD) process. The thickness of the silicon nitride diffusion barrier layer 780 is greater than one half of the maximum width of the at least one moat trench 769. The thickness of the silicon nitride diffusion barrier layer 780 above the top surface of the planarization dielectric layer 770 can be in a range from 20 nm to 500 nm, such as from 40 nm to 250 nm, although lesser and greater thicknesses can also be used. A center seam 789 may vertically extend at a midpoint between an inner sidewall of each moat trench 769 and an outer sidewall of the same moat trench 769. The center seam 789 is equidistant from an inner sidewall of a moat trench 769 and from an outer sidewall of the moat trench 769.

The silicon nitride diffusion barrier layer 780 includes at least one ring-shaped hydrogen-diffusion-blocking material portion 780W that extends downward from the horizontal plane including a horizontal interface between the planarization dielectric layer 770 and an overlying portion of the silicon nitride diffusion barrier layer 780. As used herein, a "ring-shaped" element refers to an element that is topologically homeomorphic to a torus, i.e., an element having a geometrical shape can be continuously deformed into a shape of a torus without creation or destruction of a hole. As used herein, a "hydrogen-diffusion-blocking material" refers to a material that is effective in blocking hydrogen diffusion. Exemplary materials that are effective for blocking hydrogen diffusion include silicon nitride, tungsten, and tantalum nitride. As used herein, a "ring-shaped hydrogen-diffusion-blocking material portion" refers to a ring-shaped material portion that includes a hydrogen-diffusion-blocking material. Thus, each ring-shaped hydrogen-diffusion-blocking material portion 780W includes a vertically-protruding portion of the silicon nitride diffusion barrier layer 780 that is deposited simultaneously with deposition of the horizontally-extending portion of the silicon nitride diffusion barrier layer 780, and protrudes downward from the horizontally-extending portion of the silicon nitride diffusion barrier layer 780 to fill a respective moat trench 769. Each ring-shaped hydrogen-diffusion-blocking material portion 780W is adjoined to the horizontally-extending portion of the silicon nitride diffusion barrier layer 780, and is a portion of the silicon nitride diffusion barrier layer 780.

Each ring-shaped hydrogen-diffusion-blocking material portion 780W is a continuous structure that laterally surrounds a respective device region, which may be the peripheral device region 200 or the memory array region 100. Each ring-shaped hydrogen-diffusion-blocking material portion 780W is located within, and fills, a respective moat trench 769. Each ring-shaped hydrogen-diffusion-blocking material portion 780W vertically extends downward from a bottom surface of the silicon nitride diffusion barrier layer 780 through the planarization dielectric layer 770 and to the bottom surface of the respective moat trench 769. Each ring-shaped hydrogen-diffusion-blocking material portion 780W is formed directly on an annular recessed surface of the semiconductor substrate 10 underlying a respective moat trench 769, and directly on physically exposed sidewall surfaces of the semiconductor substrate 10 around the respective moat trench 769.

An optional silicon oxide cap layer 790 can be formed over the silicon nitride diffusion barrier layer 780. The silicon oxide cap layer 790 can include undoped silicate glass, a doped silicate glass, or organosilicate glass. The thickness of the optional silicon oxide cap layer 790 can be in a range from 30 nm to 600 nm, although lesser and greater thicknesses can also be used.

Figure 7:
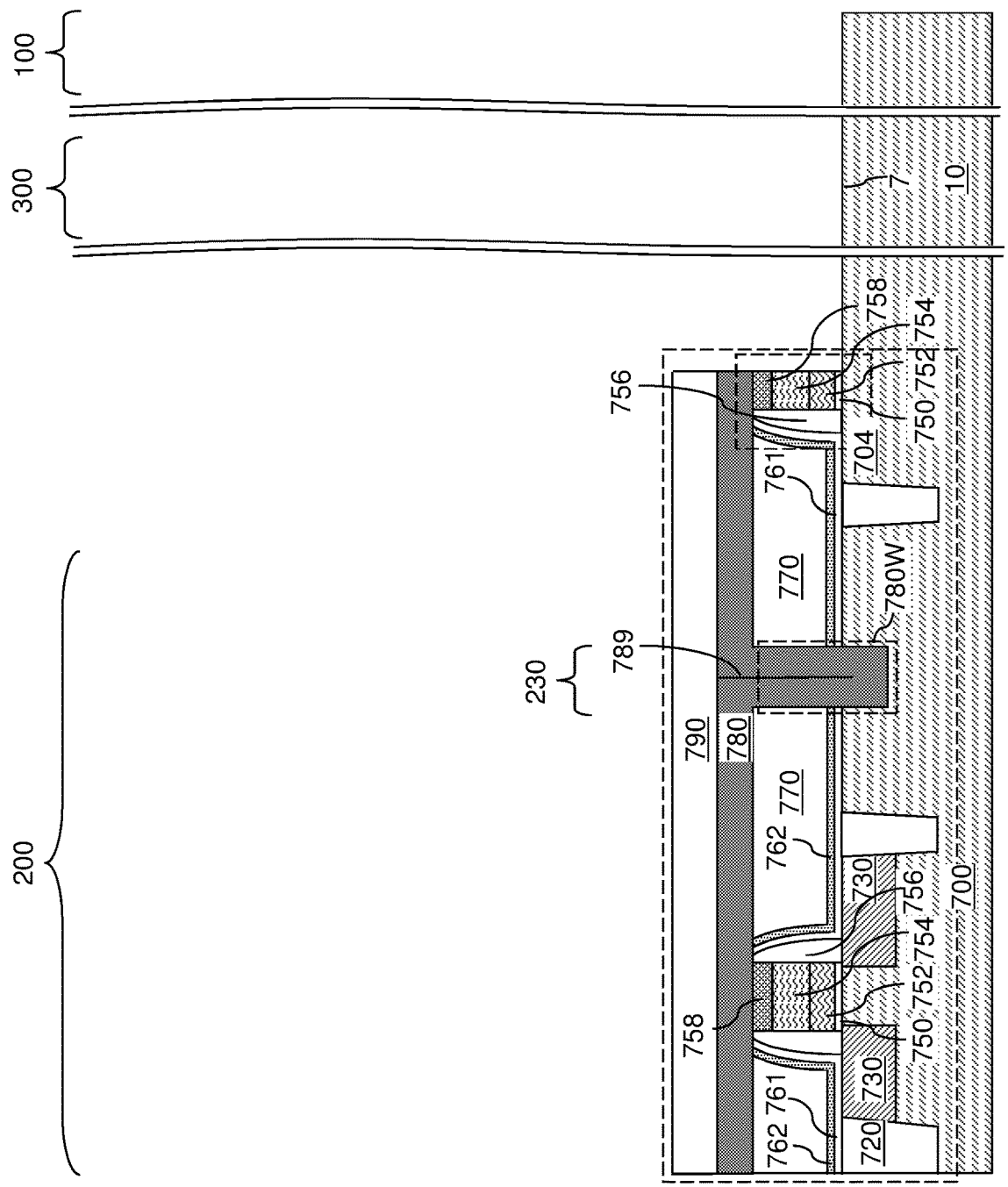
FIG. 7 is a schematic vertical cross-sectional view of the first configuration of the exemplary structure after patterning the silicon oxide cap layer, the silicon nitride diffusion barrier layer, and the dummy gate structure according to an embodiment of the present disclosure.

Referring to FIG. 7, a photoresist layer (not shown) can be applied over the optional silicon oxide cap layer 790, and can be lithographically patterned to cover the peripheral device region 200 without covering the memory array region 100 or the contact region 300. Various material portions overlying the top surface of the semiconductor substrate 10 and not covered by the photoresist layer can be removed by an etch process that uses the photoresist layer as an etch mask layer. In one embodiment, an anisotropic etch such as a reactive ion etch can sequentially etch the materials of the silicon oxide cap layer 790, the silicon nitride diffusion barrier layer 780, the planarization dielectric layer 770, the silicon nitride liner 762, the silicon oxide liner 761, the gate cap silicon nitride portions 758, the gate electrodes (752, 754), the gate dielectrics 750, and the gate spacers 756. The top surface of the semiconductor substrate 10 can be physically exposed in the memory array region 100 and the contact region 300. In one embodiment, the etch cuts through the dummy gate stack structure 704 along the entire length of the dummy gate stack structure 704 around the region enclosed by the dummy gate stack structure 704. The remaining portion of the dummy gate stack structure 704 can include a set of sidewalls that includes a closed periphery and encloses the region of the field effect transistors 702. The photoresist layer can be subsequently removed, for example, by ashing.

In one embodiment, the peripheral device region 200 can include a dummy gate stack structure 704 that continuously extends around a periphery of the peripheral device region 200 to laterally enclose a device region including the field effect transistors 702. The dummy gate stack structure 704 includes a same set of components (such as a gate dielectric 750, a gate electrode (752, 754), a gate cap silicon nitride portion 758) as a gate stack structure (750, 752, 754, 758) of the field effect transistor 702, but is not used as functional components of a field effect transistor 702. In this case, edges of the photoresist layer can be formed between an inner periphery of the dummy gate stack structure 704 and an outer periphery of the dummy gate stack structure (75, 752, 754, 758) by lithographic patterning of the photoresist layer. During the anisotropic etch process that removes material portions overlying the semiconductor substrate 10 within areas that are not covered by the photoresist layer, outer portions of the dummy gate stack structure 704 can be removed to provide outer sidewalls that are vertically coincident with sidewalls of the patterned silicon nitride diffusion barrier layer 780. As used herein, a first surface is vertically coincident with a second surface if the second surface overlies, or underlies, the first surface, and if there exists a vertical plane that includes the first surface and the second surface. The remaining portion of the dummy gate stack structure 704 constitutes an annular gate level barrier structure that defines the outer periphery of the peripheral device region 200.

The silicon nitride diffusion barrier layer 780 contacts the semiconductor substrate 10 in an annular seal region 230 and functions as a diffusion barrier structure that prevents diffusion of hydrogen atoms therethrough. The dummy gate stack structure 704 forms an annular gate level barrier structure and laterally encloses a device region, i.e., the peripheral device region 200, on the semiconductor substrate 10. A vertically extending portion of the silicon nitride liner 762 extends along an outer sidewall of a gate spacer 756 located on one side of the dummy gate stack structure 704 and contacts the silicon nitride diffusion barrier layer 780. The semiconductor substrate 10 and the silicon nitride diffusion barrier layer 780 collectively encapsulate the field effect transistors 702.

Figure 8:
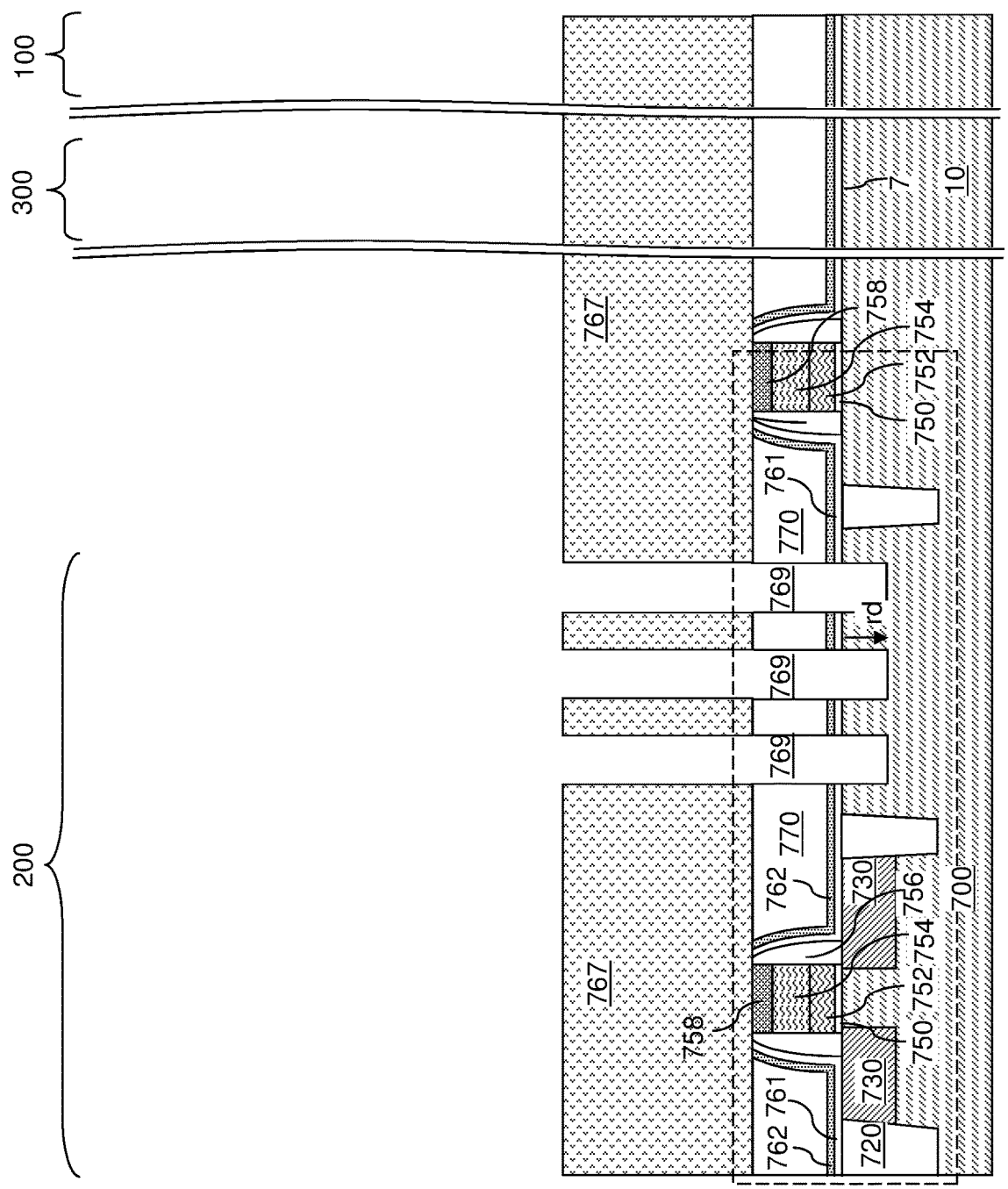
FIG. 8 is a schematic vertical cross-sectional view of a second configuration of the exemplary structure after formation of a set of nested moat trenches according to an embodiment of the present disclosure.

Referring to FIG. 8, a second configuration of the exemplary structure can be derived from the first configuration of the exemplary structure illustrated in FIG. 4 by forming a set of nested moat trenches 769 as at least one moat trench 769. The processing steps of FIG. 4 can be performed with a modification to the pattern of the photoresist layer 767 to provide a nested set of annular openings in the photoresist layer 767. The set of nested moat trenches 769 can laterally enclose the peripheral device region 200, and/or can laterally enclose the combination of a memory array region 100 and a contact region 300. Further, if multiple memory array regions 100 (e.g., multiple memory planes) and associated contact regions 300 are formed on a same semiconductor die, and/or if a plurality of peripheral device regions 200 is formed on the same semiconductor die, set of nested moat trenches 769 may laterally enclose a specific region and/or multiple regions. In one embodiment, the set of nested moat trenches 769 is formed such that each continuous path between a peripheral device region 200 and any of the memory array regions 100 is intersected by an area of the set of nested moat trenches 769. In other words, an area of the set of nested moat trenches 769 is interposed in every path connecting any peripheral device region 200 and any memory array region 100 in a same semiconductor die.

The set of nested moat trenches 769 can laterally enclose a device region (such as the peripheral device region 200 or a memory array region 100), and vertically extends through the planarization dielectric layer 770 and into the semiconductor substrate 10. A bottom surface of each moat trench 769 can be vertically recessed from a top surface of the semiconductor substrate 10 by a recess depth rd. The recess depth rd can be in a range from 25 nm to 1,000 nm, such as from 50 nm to 500 nm, although lesser and greater recess depths rd can also be used. Each moat trench 769 can have a width w between an inner sidewall and an outer sidewall. The width w of each moat trench 769 can be in a range from 25 nm to 1,000 nm, such as from 50 nm to 500 nm, although lesser and greater widths w can also be used.

Figure 9:
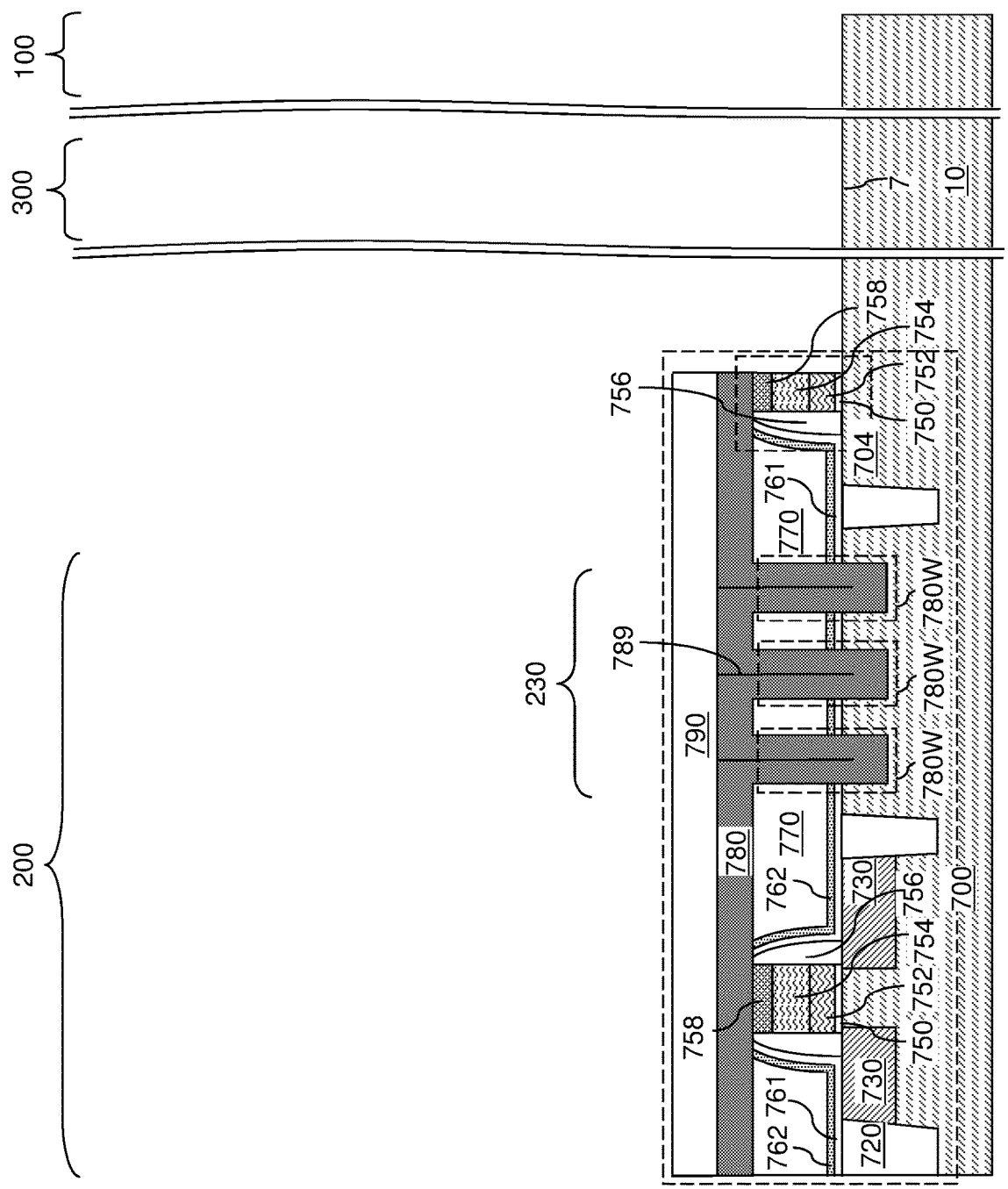
FIG. 9 is a schematic vertical cross-sectional view of the second configuration of the exemplary structure after patterning the silicon oxide cap layer, the silicon nitride diffusion barrier layer, and the dummy gate structure according to an embodiment of the present disclosure.

Referring to FIG. 9, the processing steps of FIGS. 6 and 7 can be performed to form and pattern a silicon nitride diffusion barrier layer 780 and a silicon oxide cap layer 790 and to pattern the dummy gate structure 704. The silicon nitride diffusion barrier layer 780 includes a plurality of nested ring-shaped hydrogen-diffusion-blocking material portions 780W. Each of the nested ring-shaped hydrogen-diffusion-blocking material portions 780W extends downward from the horizontal plane including a horizontal interface between the planarization dielectric layer 770 and an overlying portion of the silicon nitride diffusion barrier layer 780. Each ring-shaped hydrogen-diffusion-blocking material portion 780W includes a vertically-protruding portion of the silicon nitride diffusion barrier layer 780 that is deposited simultaneously with deposition of the horizontally-extending portion of the silicon nitride diffusion barrier layer 780, and protrudes downward from the horizontally-extending portion of the silicon nitride diffusion barrier layer 780 to fill a respective moat trench 769. Each ring-shaped hydrogen-diffusion-blocking material portion 780W is adjoined to the horizontally-extending portion of the silicon nitride diffusion barrier layer 780, and is a portion of the silicon nitride diffusion barrier layer 780.

Each ring-shaped hydrogen-diffusion-blocking material portion 780W is a continuous structure that laterally surrounds a respective device region, which may be the peripheral device region 200 or the memory array region 100. Each ring-shaped hydrogen-diffusion-blocking material portion 780W is located within, and fills, a respective moat trench 769. Each ring-shaped hydrogen-diffusion-blocking material portion 780W vertically extends downward from a bottom surface of the silicon nitride diffusion barrier layer 780 through the planarization dielectric layer 770 and to the bottom surface of the respective moat trench 769. Each ring-shaped hydrogen-diffusion-blocking material portion 780W is formed directly on an annular recessed surface of the semiconductor substrate 10 underlying a respective moat trench 769, and directly on physically exposed sidewall surfaces of the semiconductor substrate 10 around the respective moat trench 769.

An optional silicon oxide cap layer 790 can be formed over the silicon nitride diffusion barrier layer 780. The silicon oxide cap layer 790 can include undoped silicate glass, a doped silicate glass, or organosilicate glass. The thickness of the optional silicon oxide cap layer 790 can be in a range from 30 nm to 600 nm, although lesser and greater thicknesses can also be used. The optional silicon oxide cap layer 790, the silicon nitride diffusion barrier layer 780, the planarization dielectric layer 770, the silicon nitride liner 762, the silicon oxide liner 761, and the dummy gate stack structure 704 can be patterned in the same manner as in the first configuration of the exemplary structure.

The silicon nitride liner 762 contacts the semiconductor substrate 10 in an annular seal region 230 that includes a set of nested interfaces between a plurality of ring-shaped hydrogen-diffusion-blocking material portions 780W and the semiconductor substrate 10. The silicon nitride diffusion barrier layer 780 functions as a diffusion barrier structure that prevents diffusion of hydrogen atoms therethrough. The dummy gate stack structure 704 forms an annular gate level barrier structure and laterally encloses a device region, i.e., the peripheral device region 200, on the semiconductor substrate 10. A vertically extending portion of the silicon nitride liner 762 extends along an outer sidewall of a gate spacer 756 located on one side of the dummy gate stack structure 704 and contacts the silicon nitride diffusion barrier layer 780. The semiconductor substrate 10 and the silicon nitride diffusion barrier layer 780 collectively encapsulate the field effect transistors 702.

Figure 10:
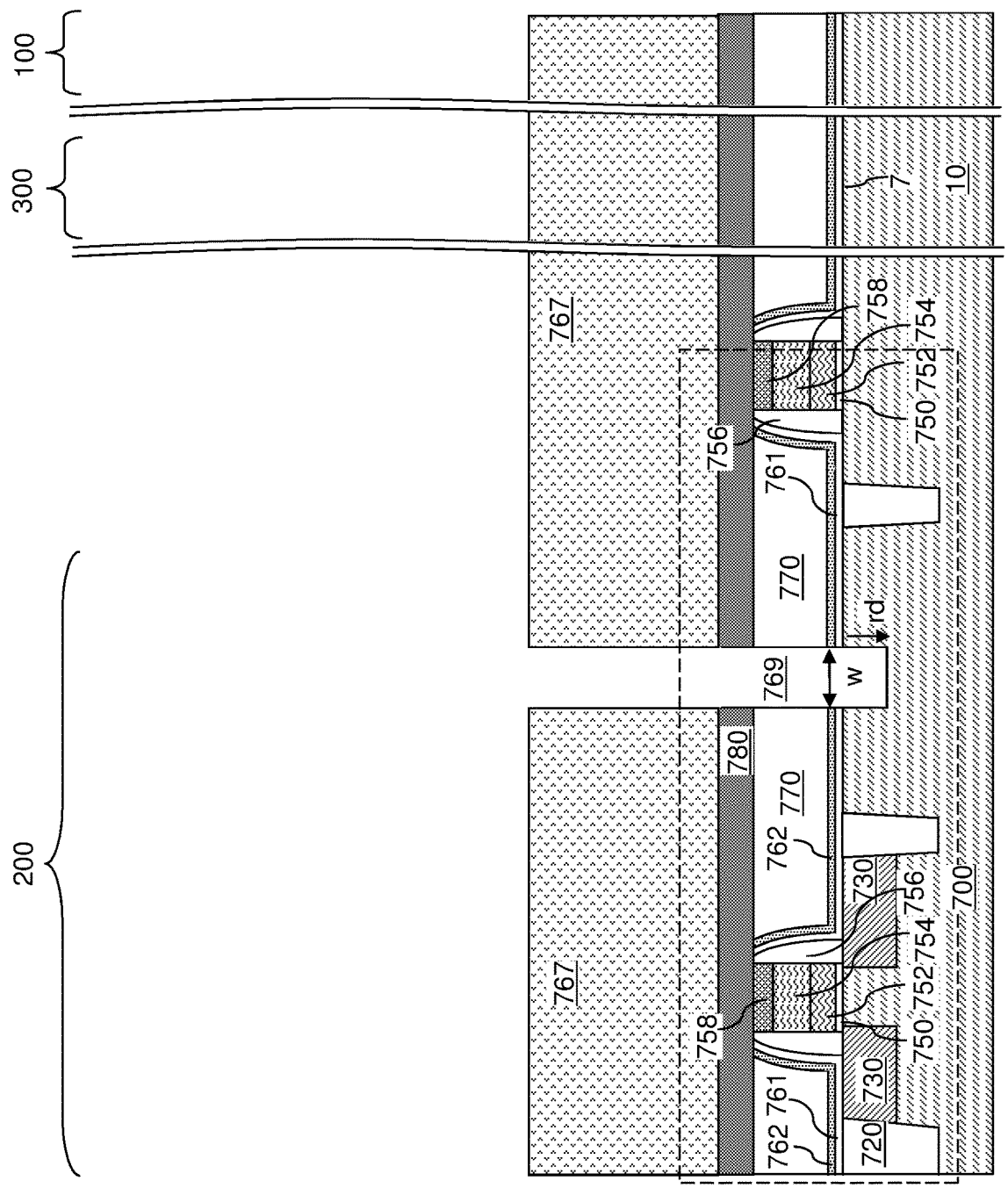
FIG. 10 is a schematic vertical cross-sectional view of a third configuration of the exemplary structure after formation of a silicon nitride diffusion barrier layer and a moat trench according to an embodiment of the present disclosure.

Referring to FIG. 10, a third configuration of the exemplary structure can be derived from the first configuration of the exemplary structure by applying and patterning the photoresist layer after formation of the silicon nitride diffusion barrier layer 780. In other words, the processing steps of FIGS. 4 and 5A-5E are performed after deposition of the silicon nitride diffusion barrier layer 780 as a planar unpatterned material layer over the planarization dielectric layer 770. The pattern formed in the photoresist layer 767 can be the same as in the first configuration of the exemplary structure. The anisotropic etch process that is performed after patterning the photoresist layer 767 is modified to insert an additional etch step prior to etching through the planarization dielectric layer 770. The additional etch step is a step for etching through unmasked portions of the silicon nitride diffusion barrier layer 780. The additional etch step may etch through the unmasked portions of the silicon nitride diffusion barrier layer 780 selective to the material of the planarization dielectric layer 770 to minimize an over-etch into the planarization dielectric layer 770. Subsequently, the processing steps of the anisotropic etch process of FIGS. 4 and 5A-5E can be performed to form the at least one moat trench 769. The at least one moat trench 769 is formed through the silicon nitride diffusion barrier layer 780, the planarization dielectric layer 770, the silicon nitride liner 762, and the silicon oxide liner 761, and into the semiconductor substrate 10.

Each moat trench 769 can laterally enclose a device region (such as the peripheral device region 200 or a memory array region 100), and vertically extends through the planarization dielectric layer 770 and into the semiconductor substrate 10. A bottom surface of the moat trench 769 can be vertically recessed from a top surface of the semiconductor substrate 10 by a recess depth rd. The recess depth rd can be in a range from 25 nm to 1,000 nm, such as from 50 nm to 500 nm, although lesser and greater recess depths rd can also be used. Each moat trench 769 can have a width w between an inner sidewall and an outer sidewall. The width w of each moat trench 769 can be in a range from 25 nm to 1,000 nm, such as from 50 nm to 500 nm, although lesser and greater widths w can also be used. The photoresist layer 767 can be subsequently removed, for example, by ashing. The remaining horizontally-extending portion of the silicon nitride diffusion barrier layer 780 is provided over the planarization dielectric layer 770 before formation of at least one ring-shaped hydrogen-diffusion-blocking material portion, which is performed in a subsequent processing step.

Figure 11:
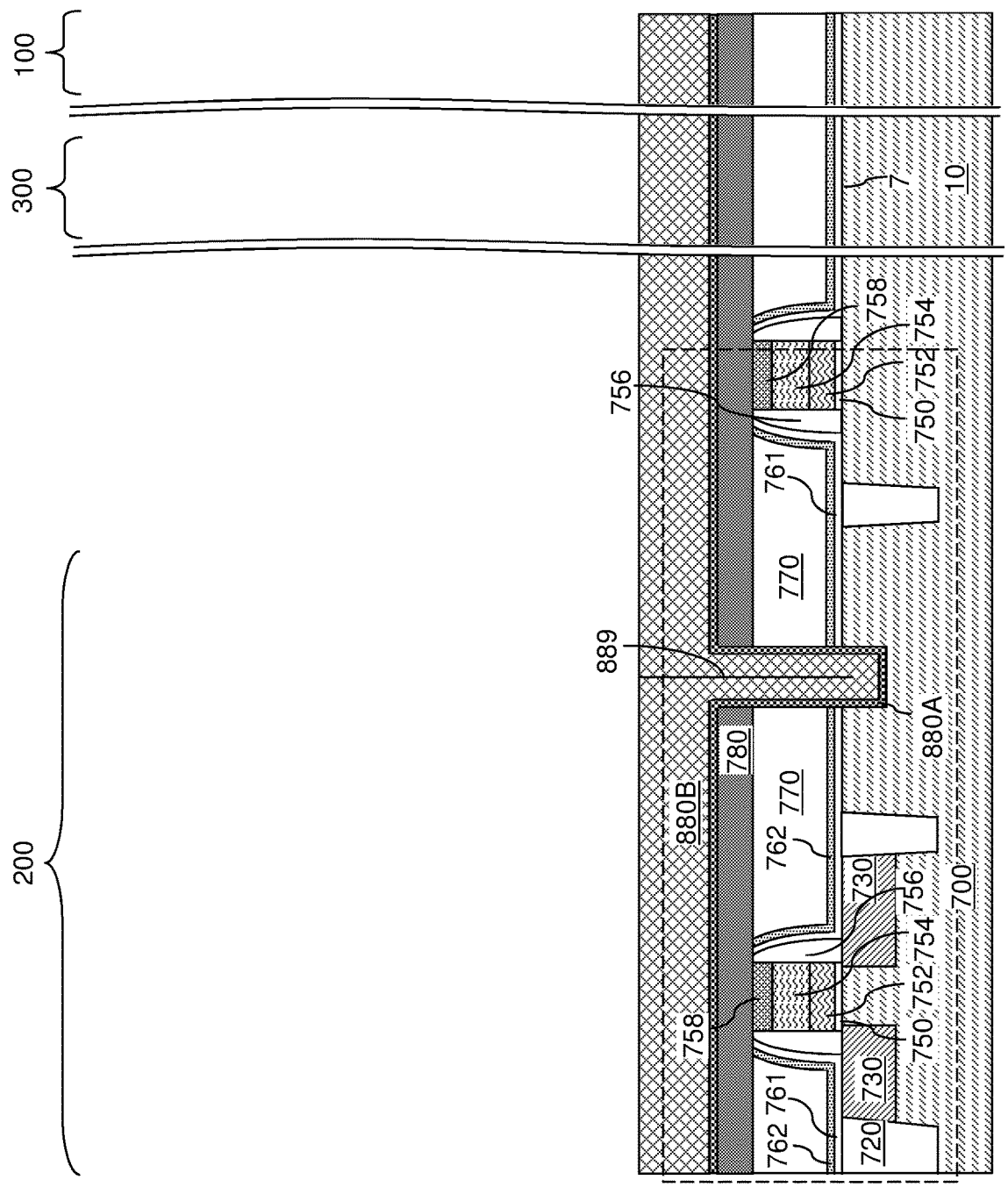
FIG. 11 is a schematic vertical cross-sectional view of the third configuration of the exemplary structure after deposition of at least one metallic material layer in the moat trench and over the silicon nitride diffusion barrier layer according to an embodiment of the present disclosure.

Referring to FIG. 11, at least one metallic material layer (880A, 880B) can be deposited in each moat trench 769 and over the silicon nitride diffusion barrier layer 780. Each of the at least one metallic material layer (880A, 880B) includes a respective metallic material. In one embodiment, the at least one metallic material layer (880A, 880B) may be deposited using a conformal deposition process, such as chemical vapor deposition. In embodiments in which each moat trench 769 includes tapered sidewalls having a taper angle (which can be, for example, in a range from 0 degree to 20 degrees), a non-conformal deposition process such as physical vapor deposition (PVD) may be used in lieu of, or in addition to, a conformal deposition process to deposit a metallic material of the at least one metallic material layer (880A, 880B). The at least one metallic material layer (880A, 880B) can fill each moat trench 769. A center seam 889 may vertically extend at a midpoint between an inner sidewall of each moat trench 769 and an outer sidewall of the same moat trench 769. The center seam 889 is approximately equidistant from an inner sidewall of a moat trench 769 and from an outer sidewall of the moat trench 769.

Each metallic material of the at least one metallic material layer (880A, 880B) can include an elemental metal, an intermetallic alloy, a metal-semiconductor alloy, or a compound of at least one elemental metal and at least one non-metal element. Non-limiting examples of elemental metals that can be used for the at least one metallic material layer (880A, 880B) include tungsten, copper, ruthenium, cobalt, and molybdenum. Non-limiting examples of intermetallic alloys that can be used for the at least one metallic material layer (880A, 880B) include alloys of tungsten, copper, ruthenium, cobalt, molybdenum, and at least another elemental metal. Non-limiting examples of metal-semiconductor alloys that can be used for the at least one metallic material layer (880A, 880B) include metal silicides, metal germanides, and metal germane-silicides. Non-limiting examples of compounds of at least one elemental metal and at least one non-metal element that can be used for the at least one metallic material layer (880A, 880B) include alloys of TiN, TaN, WN, TiC, TaC, and WC. In an illustrative example, the at least one metallic material layer (880A, 880B) can include a first metallic material layer 880A containing, and/or consisting essentially of, a conductive metal nitride (such as TiN, TaN, and/or WN) and a second metallic material layer 880B containing, and/or consisting essentially of tungsten. The thickness of the at least one metallic material layer (880A, 880B) can be selected such that the entire volume of each moat trench 769 is filled by the at least one metallic material layer (880A, 880B).

Figure 12:
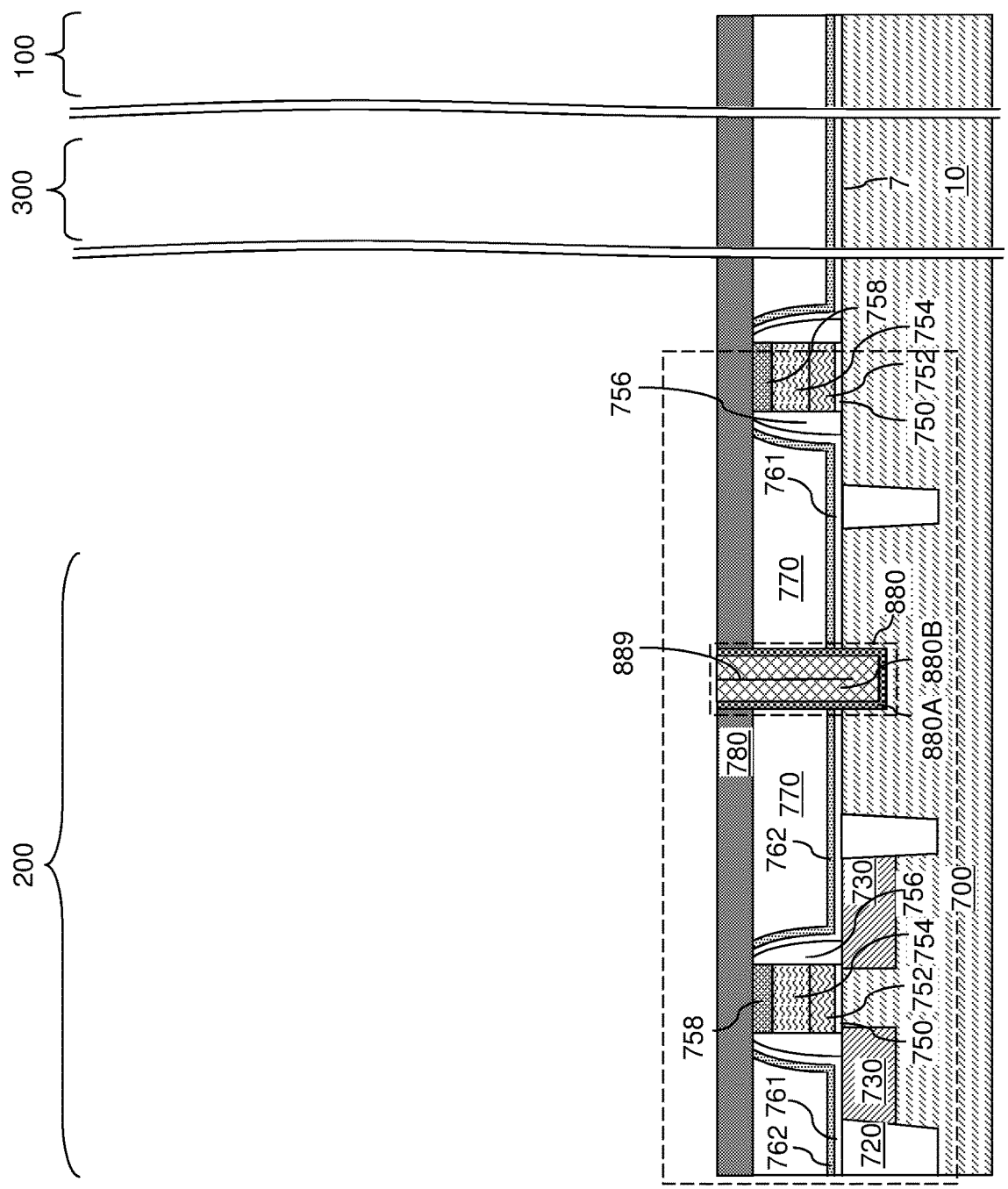
FIG. 12 is a schematic vertical cross-sectional view of the third configuration of the exemplary structure after formation of a ring-shaped hydrogen-diffusion-blocking material portion by planarization of the at least one metallic material layer according to an embodiment of the present disclosure.

Referring to FIG. 12, horizontal portions of the at least one metallic material layer (880A, 880B) can be removed from above the horizontal plane including the top surface of the silicon nitride diffusion barrier layer 780 by chemical mechanical planarization (CMP). Each remaining portion of the at least one metallic material layer (880A, 880B) constitutes a ring-shaped hydrogen-diffusion-blocking material portion 880. The horizontally-extending portion of the silicon nitride diffusion barrier layer 780 laterally surrounds an upper region of the ring-shaped hydrogen-diffusion-blocking material portion 880. Each ring-shaped hydrogen-diffusion-blocking material portion 880 contacts sidewalls of the silicon nitride diffusion barrier layer 780.

Each ring-shaped hydrogen-diffusion-blocking material portion 880 is a continuous structure that laterally surrounds a respective device region, which may be the peripheral device region 200 or the memory array region 100. Each ring-shaped hydrogen-diffusion-blocking material portion 880 is located within, and fills, a respective moat trench 769. Each ring-shaped hydrogen-diffusion-blocking material portion 880 vertically extends downward from a bottom surface of the silicon nitride diffusion barrier layer 780 through the planarization dielectric layer 770 and to the bottom surface of the respective moat trench 769. Each ring-shaped hydrogen-diffusion-blocking material portion 880 is formed directly on an annular recessed surface of the semiconductor substrate 10 underlying a respective moat trench 769, and directly on physically exposed sidewall surfaces of the semiconductor substrate 10 around the respective moat trench 769. In one embodiment, each ring-shaped hydrogen-diffusion-blocking material portion 880 can include a first metallic material layer 880A containing, and/or consisting essentially of, a conductive metal nitride (such as TiN, TaN, and/or WN) and a second metallic material layer 880B containing, and/or consisting essentially of, tungsten.

Figure 13:
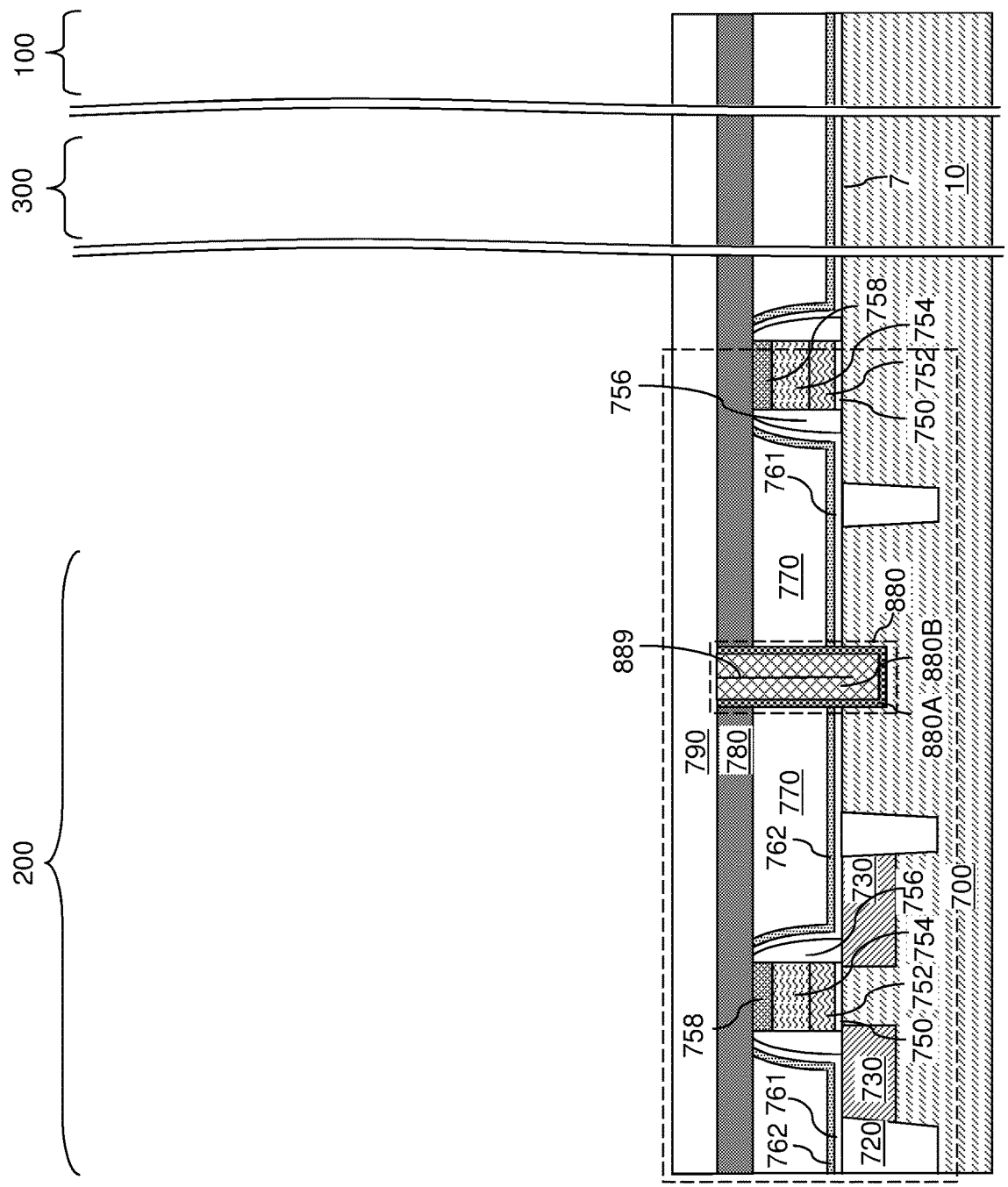
FIG. 13 is a schematic vertical cross-sectional view of the third configuration of the exemplary structure after formation of an optional silicon oxide cap layer according to an embodiment of the present disclosure.

Referring to FIG. 13, an optional silicon oxide cap layer 790 can be formed over the silicon nitride diffusion barrier layer 780. The silicon oxide cap layer 790 can include undoped silicate glass, a doped silicate glass, or organosilicate glass. The thickness of the optional silicon oxide cap layer 790 can be in a range from 30 nm to 600 nm, although lesser and greater thicknesses can also be used.

Figure 14:
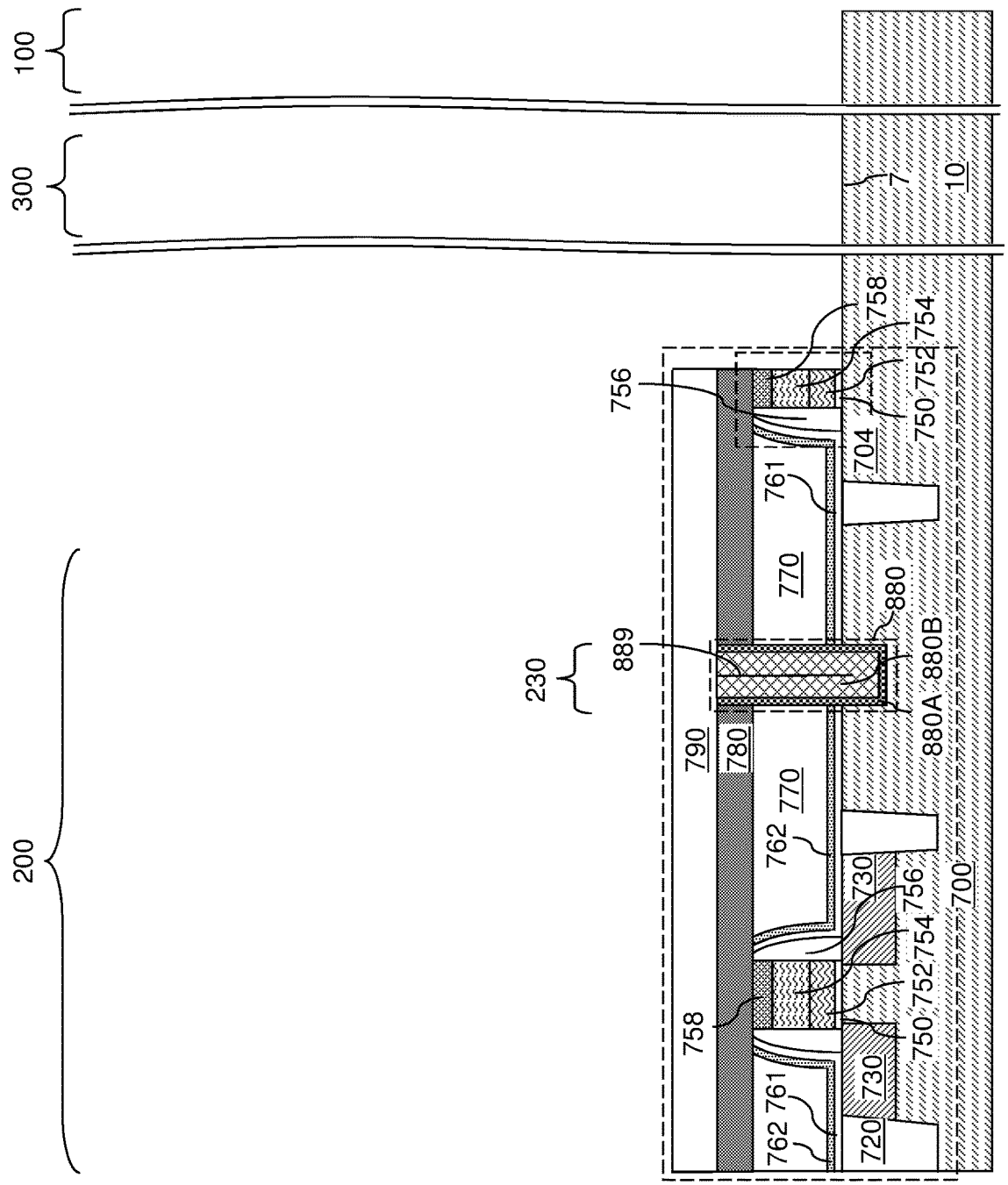
FIG. 14 is a schematic vertical cross-sectional view of the third configuration of the exemplary structure after patterning the silicon oxide cap layer, the silicon nitride diffusion barrier layer, and the dummy gate structure according to an embodiment of the present disclosure.

Referring to FIG. 14, the processing steps of FIG. 7 can be performed to pattern the silicon oxide cap layer 790 and the silicon nitride diffusion barrier layer 780 and to pattern the dummy gate structure 704.

Each ring-shaped hydrogen-diffusion-blocking material portion 880 contacts the semiconductor substrate 10 in an annular seal region 230. An annular interface is formed between each ring-shaped hydrogen-diffusion-blocking material portion 880 and the semiconductor substrate 10. The combination of the silicon nitride diffusion barrier layer 780 and the at least one ring-shaped hydrogen-diffusion-blocking material portion 880 functions as a diffusion barrier structure that prevents diffusion of hydrogen atoms therethrough. The dummy gate stack structure 704 forms an annular gate level barrier structure and laterally encloses a device region, i.e., the peripheral device region 200, on the semiconductor substrate 10. A vertically extending portion of the silicon nitride liner 762 extends along an outer sidewall of a gate spacer 756 located on one side of the dummy gate stack structure 704 and contacts the silicon nitride diffusion barrier layer 780. The semiconductor substrate 10 and the silicon nitride diffusion barrier layer 780 collectively encapsulate the field effect transistors 702.

Figure 15:
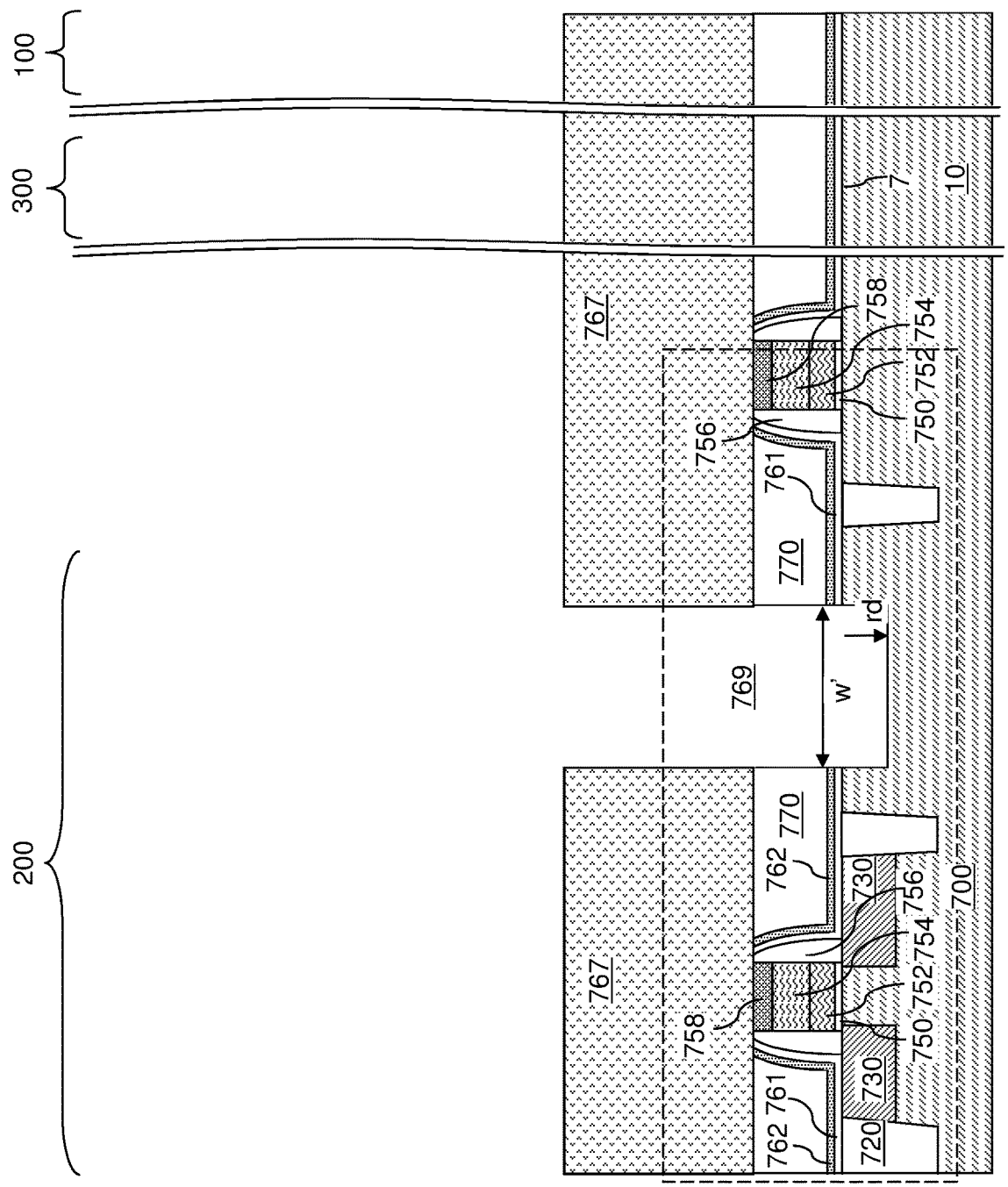
FIG. 15 is a schematic vertical cross-sectional view of a fourth configuration of the exemplary structure after formation of at least one moat trench according to an embodiment of the present disclosure.

Referring to FIG. 15, a fourth configuration of the exemplary structure can be derived from the first configuration of the exemplary structure illustrated in FIG. 4 or from the second configuration of the exemplary structure illustrated in FIG. 8 by widening the width of at least one annular opening to a dimension that is greater than twice the thickness of a silicon nitride diffusion barrier layer 780 to be subsequently formed. At least one moat trench 769 is formed around each device region to be protected from hydrogen diffusion. Each moat trench 769 can laterally enclose a device region (such as the peripheral device region 200 or a memory array region 100), and vertically extends through the planarization dielectric layer 770 and into the semiconductor substrate 10. A bottom surface of the moat trench 769 can be vertically recessed from a top surface of the semiconductor substrate 10 by a recess depth rd. The recess depth rd can be in a range from 25 nm to 1,000 nm, such as from 50 nm to 500 nm, although lesser and greater recess depths rd can also be used.

The anisotropic etching of the unmasked portions of the planarization dielectric layer 770, the silicon nitride liner 762, the silicon oxide liner 761, and the semiconductor substrate 10 can be performed by a reactive ion etch process that includes multiple steps the sequentially etch through the materials of the planarization dielectric layer 770, the silicon nitride liner 762, the silicon oxide liner 761, and the semiconductor substrate 10. Each moat trench 769 can have a width w' between an inner sidewall and an outer sidewall. The width w' of each moat trench 769 can be in a range from 50 nm to 6,000 nm, such as from 100 nm to 1,000 nm, although lesser and greater widths w' can also be used. The photoresist layer 767 can be subsequently removed, for example, by ashing.

Figure 16:
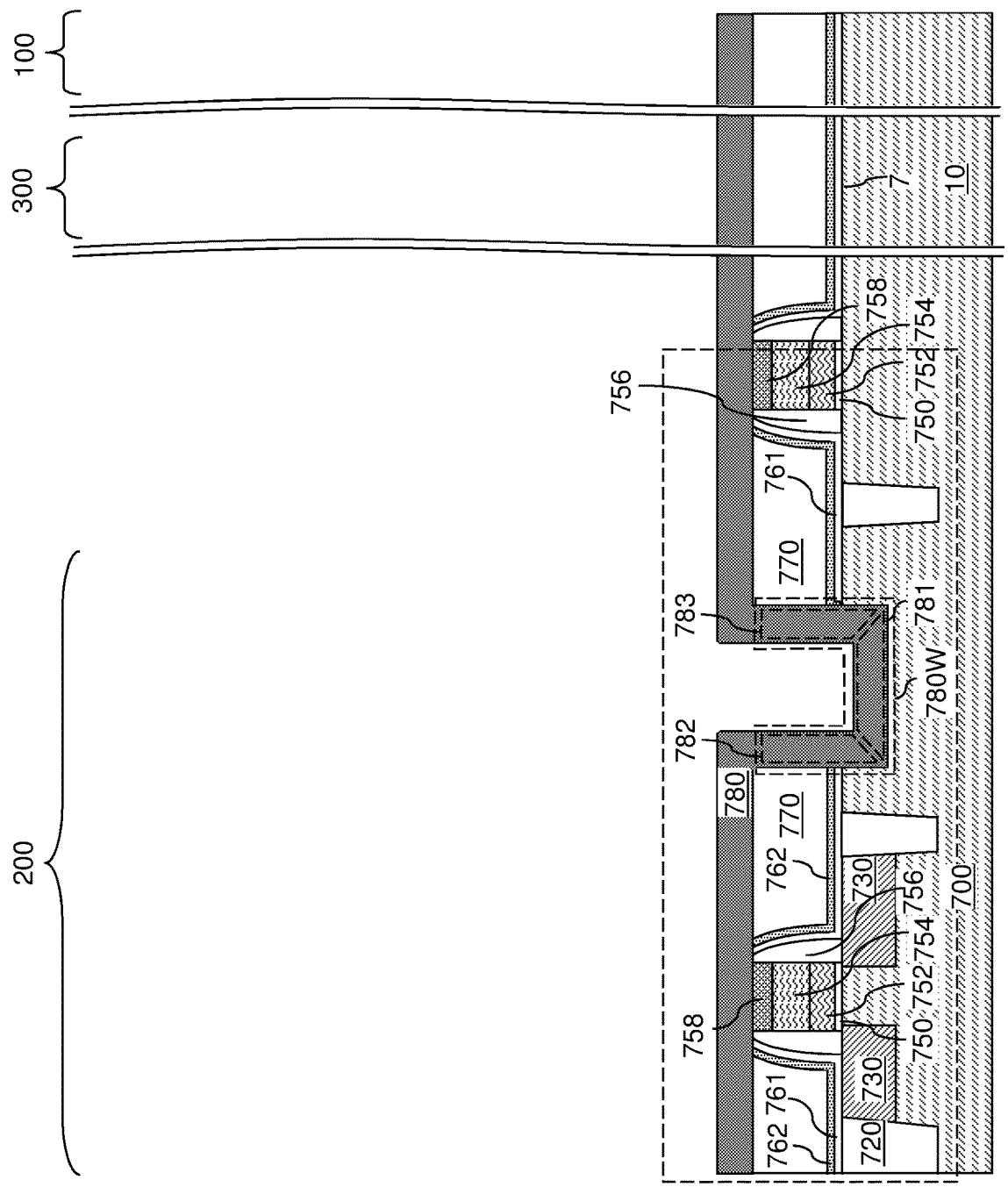
FIG. 16 is a schematic vertical cross-sectional view of the fourth configuration of the exemplary structure after formation of a silicon nitride diffusion barrier layer that includes a ring-shaped hydrogen-diffusion-blocking material portion according to an embodiment of the present disclosure.

Referring to FIG. 16, a silicon nitride diffusion barrier layer 780 can be formed over the planarization dielectric layer 770 and the semiconductor substrate 10 and in each moat trench 769. The silicon nitride diffusion barrier layer 780 can be deposited by a conformal deposition process such as low pressure chemical vapor deposition (LPCVD) process. The thickness of the silicon nitride diffusion barrier layer 780 is less than one half of the minimum width of the at least one moat trench 769. The thickness of the silicon nitride diffusion barrier layer 780 above the top surface of the planarization dielectric layer 770 can be in a range from 20 nm to 500 nm, such as from 40 nm to 250 nm, although lesser and greater thicknesses can also be used. A void, i.e., an unfilled volume, is present between an inner sidewall of each moat trench 769 and an outer sidewall of the same moat trench 769.

The silicon nitride diffusion barrier layer 780 includes at least one ring-shaped hydrogen-diffusion-blocking material portion 780W that extends downward from the horizontal plane including a horizontal interface between the planarization dielectric layer 770 and an overlying portion of the silicon nitride diffusion barrier layer 780. Each ring-shaped hydrogen-diffusion-blocking material portion 780W can have a U-shaped vertical cross-sectional shape within a vertical plane that is parallel to a widthwise direction of a respective moat trench 769. Thus, each ring-shaped hydrogen-diffusion-blocking material portion 780W includes a vertically-protruding portion of the silicon nitride diffusion barrier layer 780 that is deposited simultaneously with deposition of the horizontally-extending portion of the silicon nitride diffusion barrier layer 780, and protrudes downward from the horizontally-extending portion of the silicon nitride diffusion barrier layer 780 with a U-shaped vertical cross-sectional profile to partially fill a respective moat trench 769. Each ring-shaped hydrogen-diffusion-blocking material portion 780W is adjoined to the horizontally-extending portion of the silicon nitride diffusion barrier layer 780, and is a portion of the silicon nitride diffusion barrier layer 780.

Each ring-shaped hydrogen-diffusion-blocking material portion 780W is a continuous structure that laterally surrounds a respective device region, which may be the peripheral device region 200 or the memory array region 100. Each ring-shaped hydrogen-diffusion-blocking material portion 780W is located within, and partially but not completely fills, a respective moat trench 769. Each ring-shaped hydrogen-diffusion-blocking material portion 780W vertically extends downward from a bottom surface of the silicon nitride diffusion barrier layer 780 through the planarization dielectric layer 770 and to the bottom surface of the respective moat trench 769. Each ring-shaped hydrogen-diffusion-blocking material portion 780W is formed directly on an annular recessed surface of the semiconductor substrate 10 underlying a respective moat trench 769, and directly on physically exposed sidewall surfaces of the semiconductor substrate 10 around the respective moat trench 769.

Each ring-shaped hydrogen-diffusion-blocking material portion 780W is a portion of the silicon nitride diffusion barrier layer 780. As such, each ring-shaped hydrogen-diffusion-blocking material portion 780W is formed concurrently with formation of the horizontally-extending portion of the silicon nitride diffusion barrier layer 780 that is formed over the planarization dielectric layer 770. Each ring-shaped hydrogen-diffusion-blocking material portion 780W is formed directly on an annular recessed surface of the semiconductor substrate 10 underlying a respective moat trench 769, and directly on physically exposed sidewall surfaces of the semiconductor substrate 10 around the respective moat trench 769. A ring-shaped hydrogen-diffusion-blocking material portion 780W can comprise an annular horizontal portion 781 that contacts an annular bottom surface of the moat trench 769, an inner sidewall portion 782 adjoined to an inner periphery of the annular horizontal portion 781, and an outer sidewall portion 783 adjoined to an outer periphery of the annular horizontal portion 781. An annular cavity can be present within a moat trench 769 after formation of the silicon nitride diffusion barrier layer 780 between a respective pair of an inner sidewall portion 782 and an outer sidewall portion 783 and above an annular horizontal portion 781 of each ring-shaped hydrogen-diffusion-blocking material portion 780W.

Figure 17:
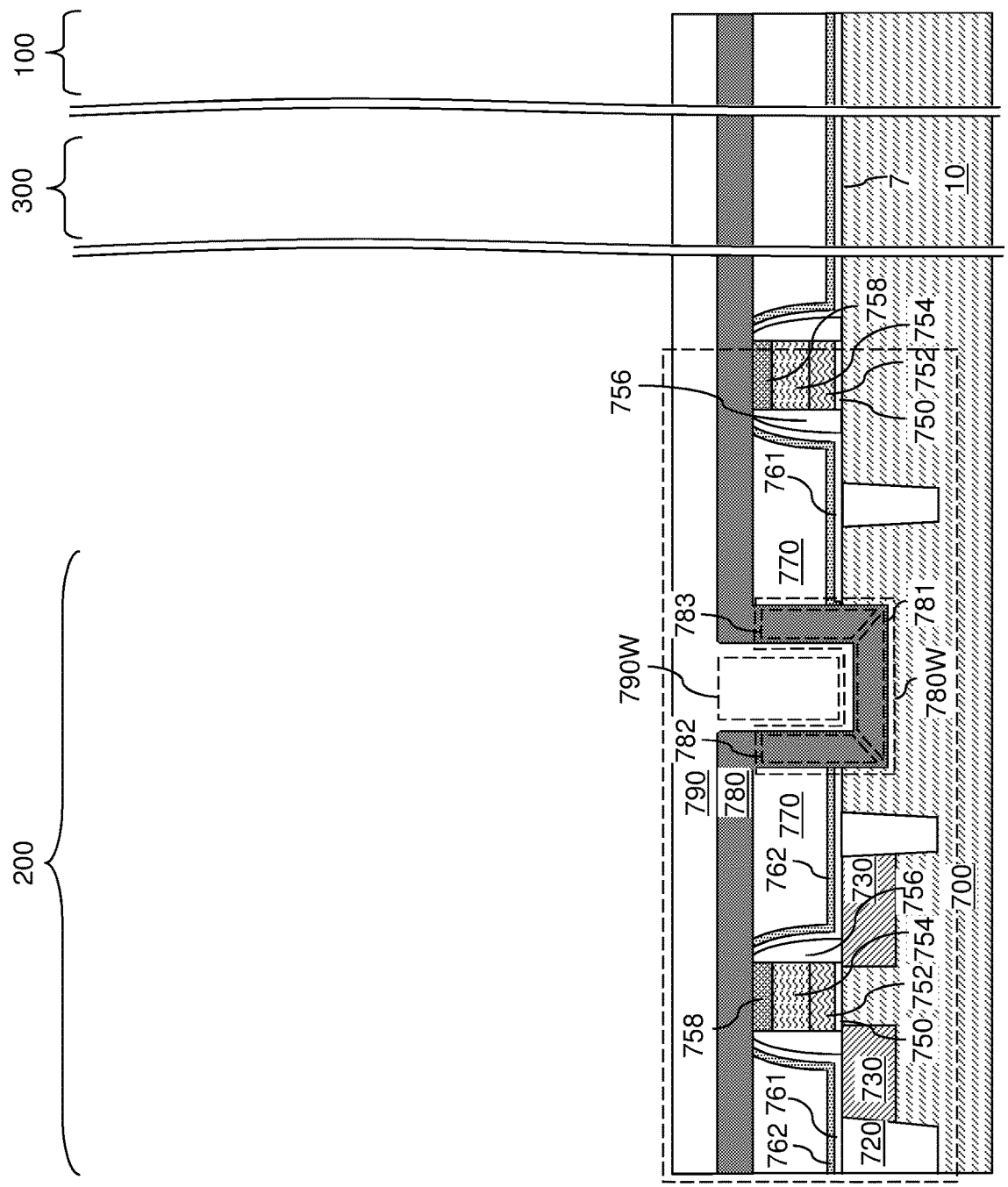
FIG. 17 is a schematic vertical cross-sectional view of the fourth configuration of the exemplary structure after formation of an optional silicon oxide cap layer according to an embodiment of the present disclosure.

Referring to FIG. 17, a silicon oxide cap layer 790 can be formed over the silicon nitride diffusion barrier layer 780. The silicon oxide cap layer 790 can include undoped silicate glass, a doped silicate glass, or organosilicate glass. The thickness of the silicon oxide cap layer 790 is selected such that the silicon oxide cap layer 790 fills the remaining volumes of each moat trench 769 that is not filled with the silicon nitride diffusion barrier layer 780. For example, the silicon oxide cap layer 790 can have a thickness in a range from 100 nm to 1,000 nm above the topmost surface of the silicon nitride diffusion barrier layer 780, although lesser and greater thicknesses can also be used.

The silicon oxide cap layer 790 includes at least one downward-protruding annular portion 790W that protrudes into a respective moat trench 769 and fills a respective annular cavity therein. Each downward-protruding annular portion 790W protrudes downward from, and is adjoined to, the horizontally extending portion of the silicon oxide cap layer 790. In one embodiment, each downward-protruding annular portion 790W of the silicon oxide cap layer 790 is located between an inner sidewall portion 782 and an outer sidewall portion 783 of a respective ring-shaped hydrogen-diffusion-blocking material portion 780W.

Figure 18:
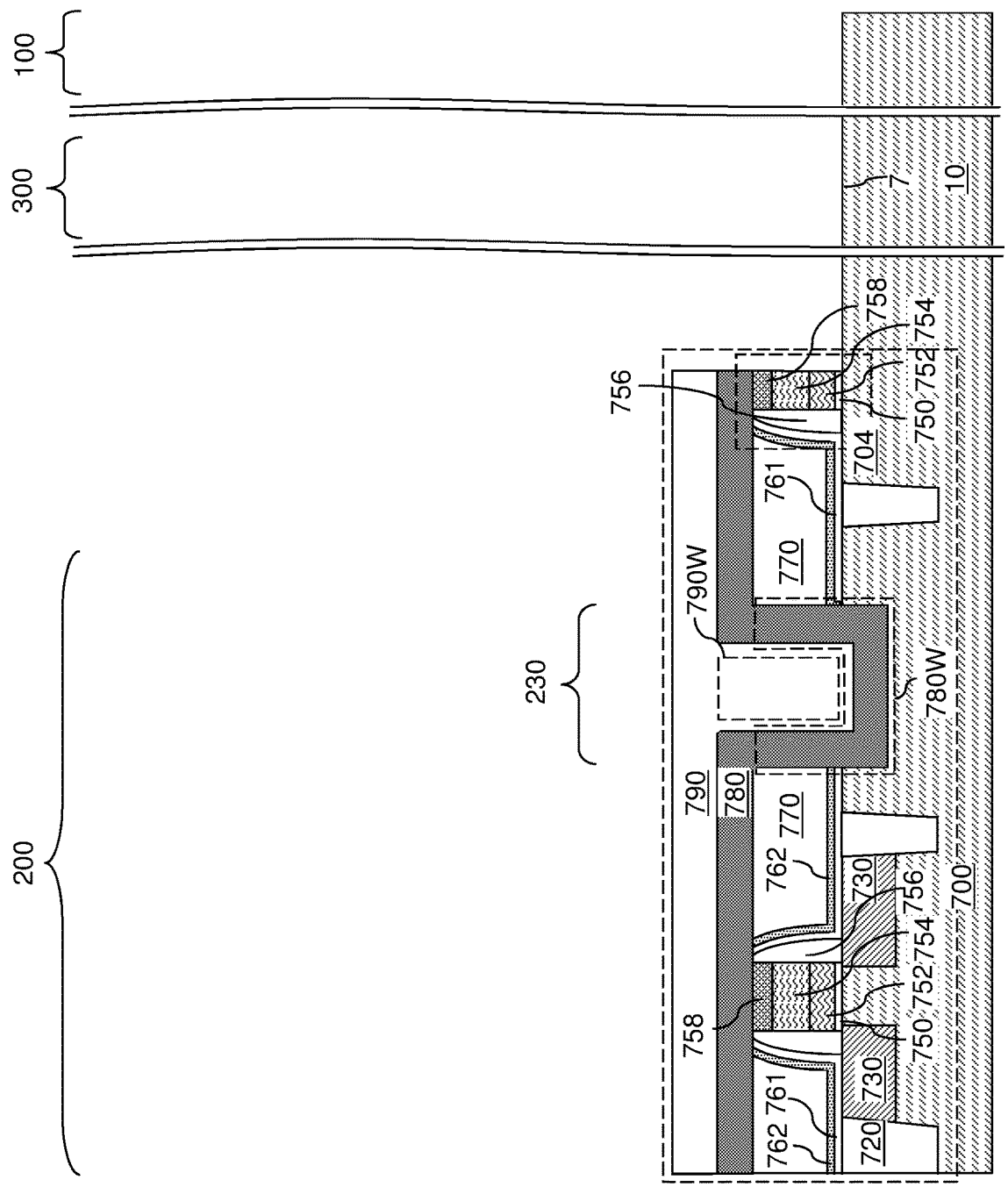
FIG. 18 is a schematic vertical cross-sectional view of the fourth configuration of the exemplary structure after patterning the silicon oxide cap layer, the silicon nitride diffusion barrier layer, and the dummy gate structure according to an embodiment of the present disclosure.

Referring to FIG. 18, the processing steps of FIG. 7 can be performed to pattern the silicon oxide cap layer 790 and the silicon nitride diffusion barrier layer 780 and to pattern the dummy gate structure 704.

Each ring-shaped hydrogen-diffusion-blocking material portion 780W contacts the semiconductor substrate 10 in an annular seal region 230. An annular interface is formed between each ring-shaped hydrogen-diffusion-blocking material portion 780W and the semiconductor substrate 10. The silicon nitride diffusion barrier layer 780 functions as a diffusion barrier structure that prevents diffusion of hydrogen atoms therethrough. The dummy gate stack structure 704 forms an annular gate level barrier structure and laterally encloses a device region, i.e., the peripheral device region 200, on the semiconductor substrate 10. A vertically extending portion of the silicon nitride liner 762 extends along an outer sidewall of a gate spacer 756 located on one side of the dummy gate stack structure 704 and contacts the silicon nitride diffusion barrier layer 780. The semiconductor substrate 10 and the silicon nitride diffusion barrier layer 780 collectively encapsulate the field effect transistors 702.

Figure 19:
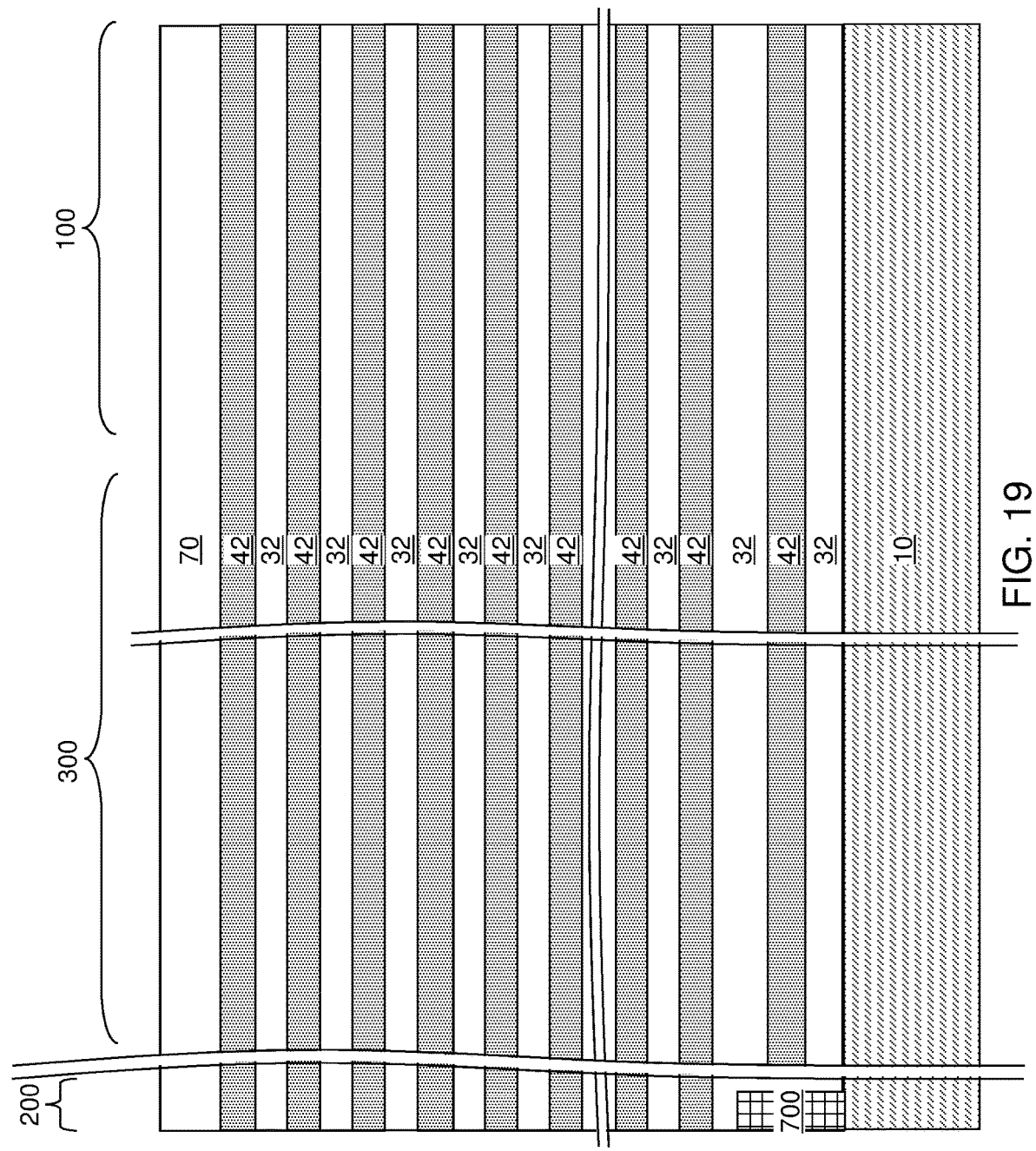
FIG. 19 is a schematic vertical cross-sectional view of the exemplary structure after formation of an alternating stack of insulating layers and sacrificial material layers according to an embodiment of the present disclosure.

Referring to FIG. 19, a stack of an alternating plurality of first material layers (which can be insulating layers 32) and second material layers (which can be sacrificial material layer 42) is formed over the top surface of the semiconductor substrate 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 20:
FIG. 20 is a schematic vertical cross-sectional view of the exemplary structure after formation of stepped terraces and a retro-stepped dielectric material portion according to an embodiment of the present disclosure.

Referring to FIG. 20, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 21A:
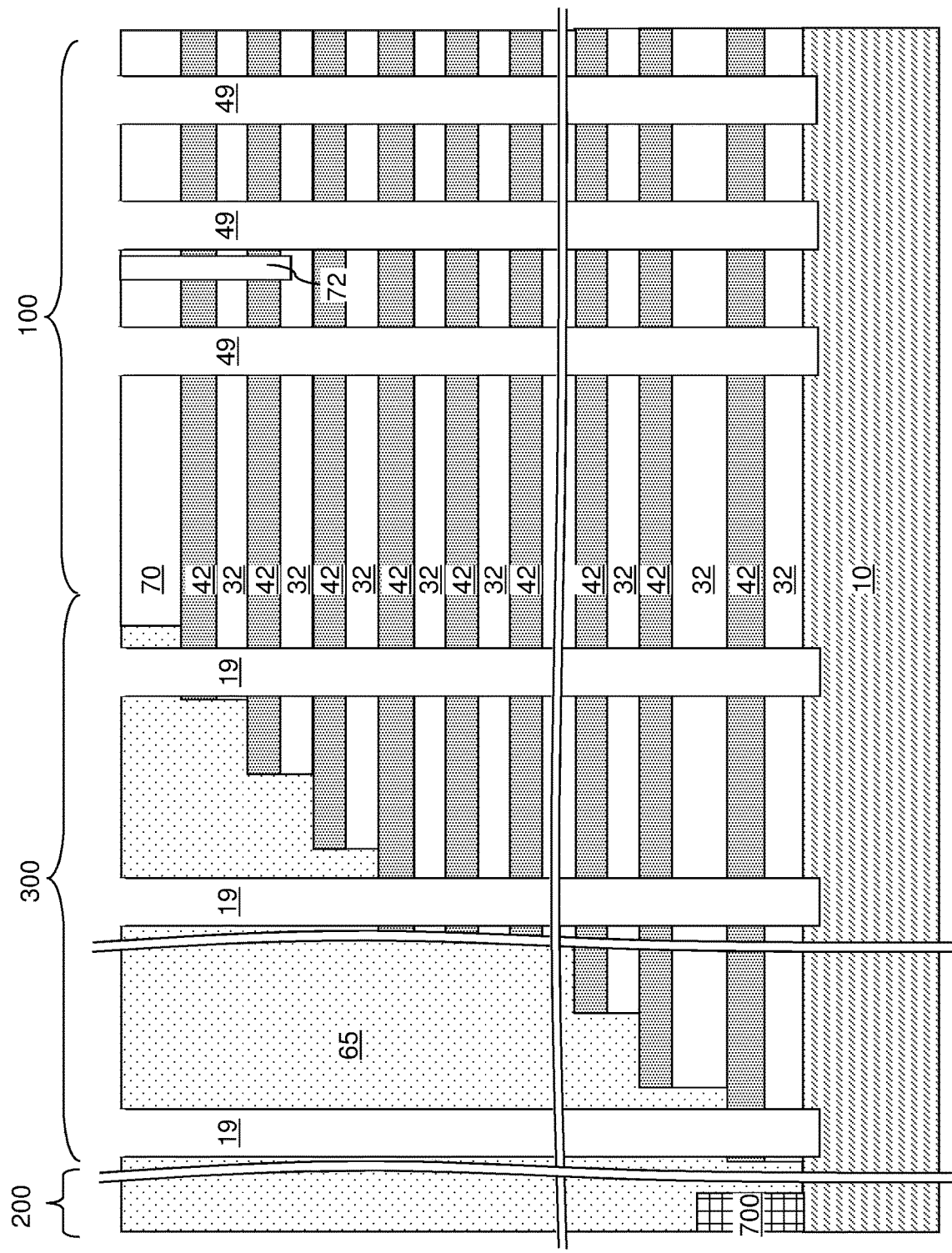
FIG. 21A is a schematic vertical cross-sectional view of the exemplary structure after formation of memory openings and support openings according to an embodiment of the present disclosure.
Figure 21B:
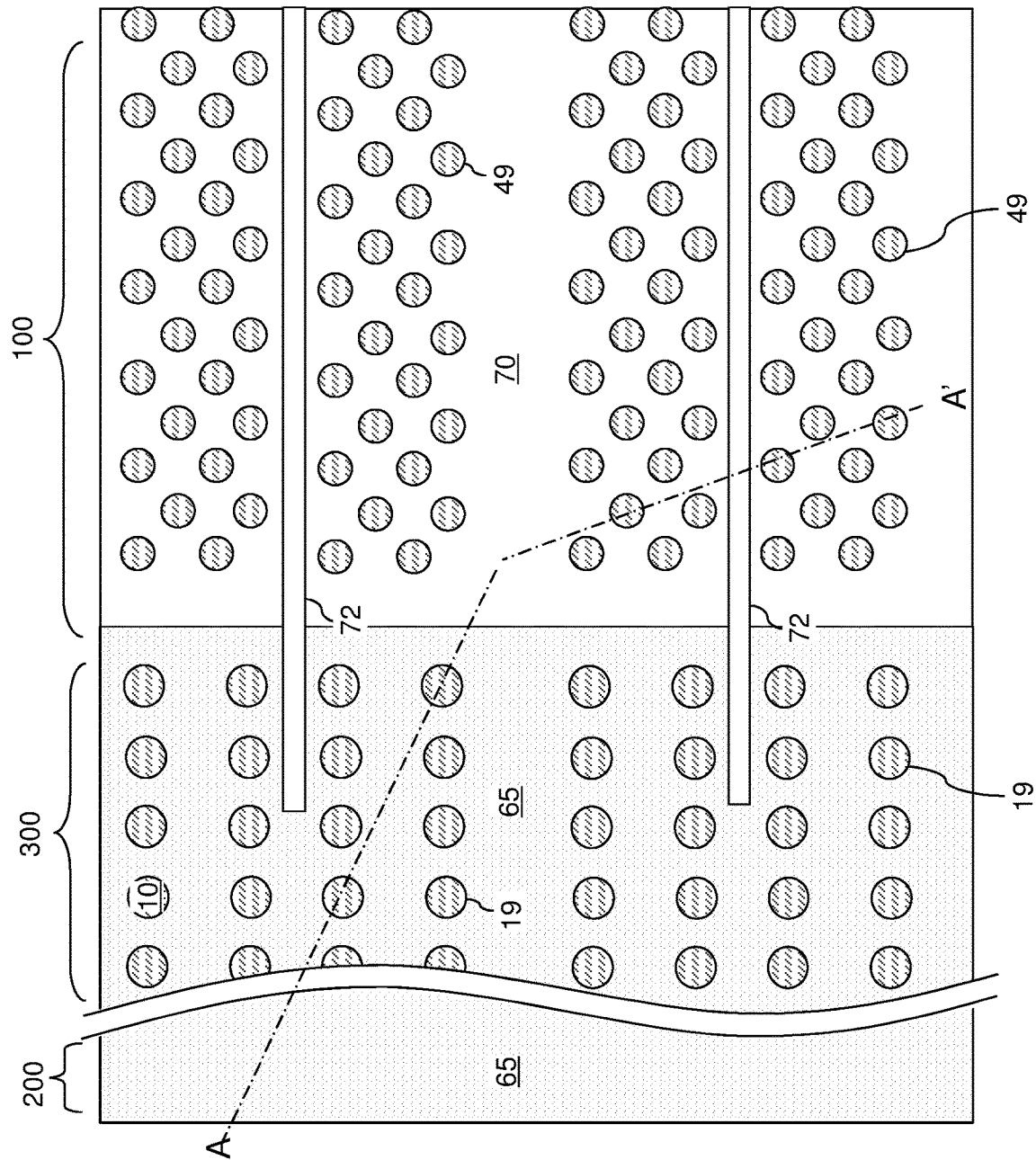
FIG. 21B is a top-down view of the exemplary structure of FIG. 21A. The vertical plane A-A' is the plane of the cross-section for FIG. 21A.

Referring to FIGS. 21A and 21B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor substrate 10. In one embodiment, an overetch into the semiconductor substrate 10 may be optionally performed after the top surface of the semiconductor substrate 10 is physically exposed at a bottom of each memory opening 49 and each support opening 19. The overetch may be performed prior to, or after, removal of the lithographic material stack. In other words, the recessed surfaces of the semiconductor substrate 10 may be vertically offset from the un-recessed top surfaces of the semiconductor substrate 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor substrate 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The semiconductor substrate 10 and the semiconductor substrate 10 collectively constitutes a semiconductor substrate 10, which can be a semiconductor substrate. Alternatively, the semiconductor substrate 10 may be omitted, and the memory openings 49 and the support openings 19 can be extend to a top surface of the semiconductor substrate 10.

FIGS. 22A-22H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 22A, a memory opening 49 in the exemplary device structure of FIGS. 21A and 21B is illustrated. The memory opening 49 extends through the insulating cap layer 70, the alternating stack (32, 42), and optionally into an upper portion of the semiconductor substrate 10. At this processing step, each support opening 19 can extend through the retro-stepped dielectric material portion 65, a subset of layers in the alternating stack (32, 42), and optionally through the upper portion of the semiconductor substrate 10. The recess depth of the bottom surface of each memory opening with respect to the top surface of the semiconductor substrate 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 22B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor substrate 10. In one embodiment, the pedestal channel portion 11 can be doped with electrical dopants of the same conductivity type as the semiconductor substrate 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the semiconductor substrate 10 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor substrate 10 that the pedestal channel portion contacts. If a semiconductor substrate 10 is not present, the pedestal channel portion 11 can be formed directly on the semiconductor substrate 10, which can have a doping of the first conductivity type.

Referring to FIG. 22C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 22D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor substrate 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 22E, a second semiconductor channel layer 602 can be deposited directly on the semiconductor surface of the pedestal channel portion 11 or the semiconductor substrate 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 22F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 22G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 22H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Figure 23:
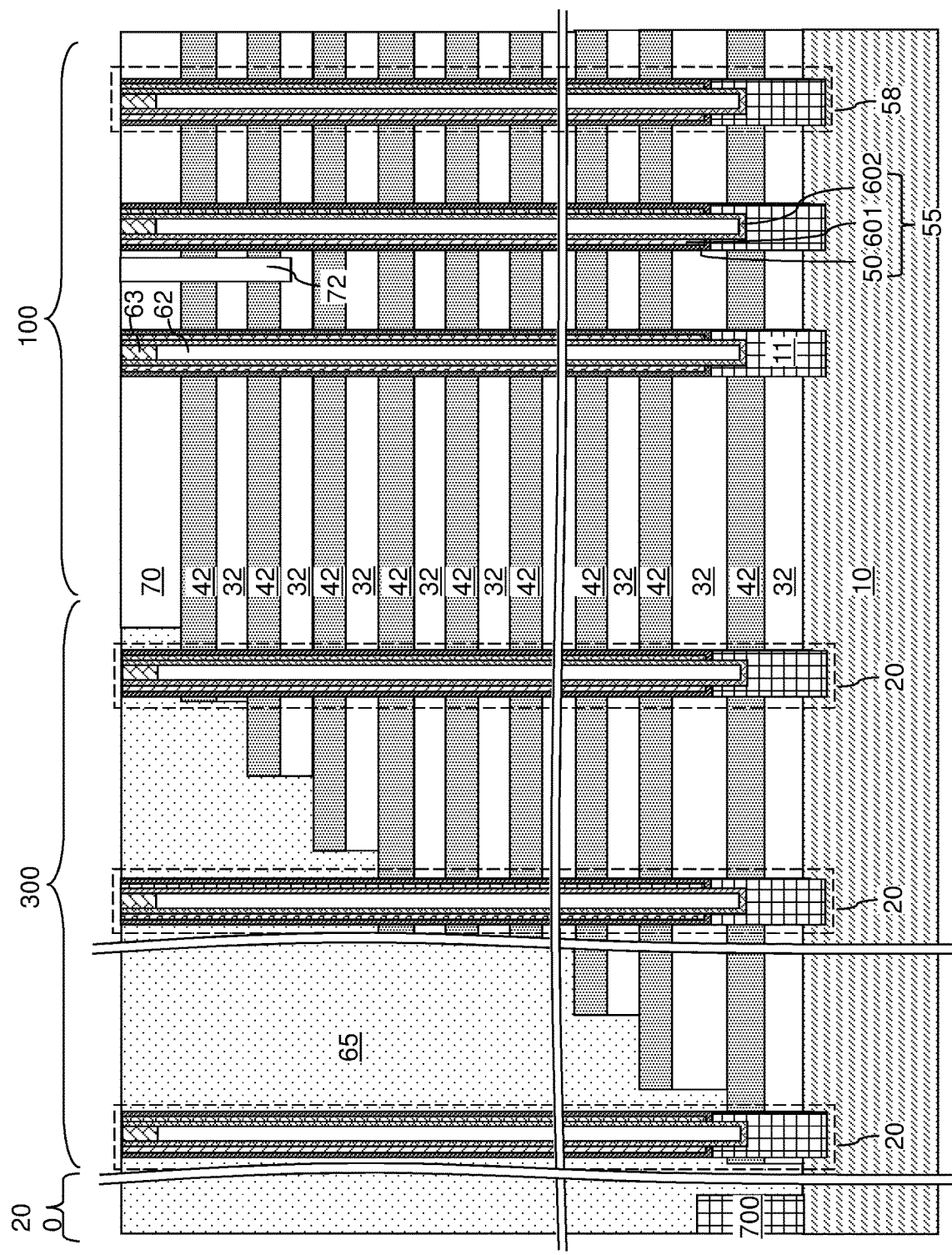
FIG. 23 is a schematic vertical cross-sectional view of the exemplary structure after formation of memory stack structures and support pillar structures according to an embodiment of the present disclosure.

Referring to FIG. 23, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 21A and 21B. An instance of the support pillar structure 20 can be formed within each support opening 19 of the structure of FIGS. 21A and 21B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising a charge storage layer 54) and an optional blocking dielectric layer 52. While the present disclosure is described using the illustrated configuration for the memory stack structure, the methods of various embodiments of the present disclosure can be applied to alternative memory stack structures including different layer stacks or structures for the memory film 50 and/or for the vertical semiconductor channel 60.

Figure 24A:
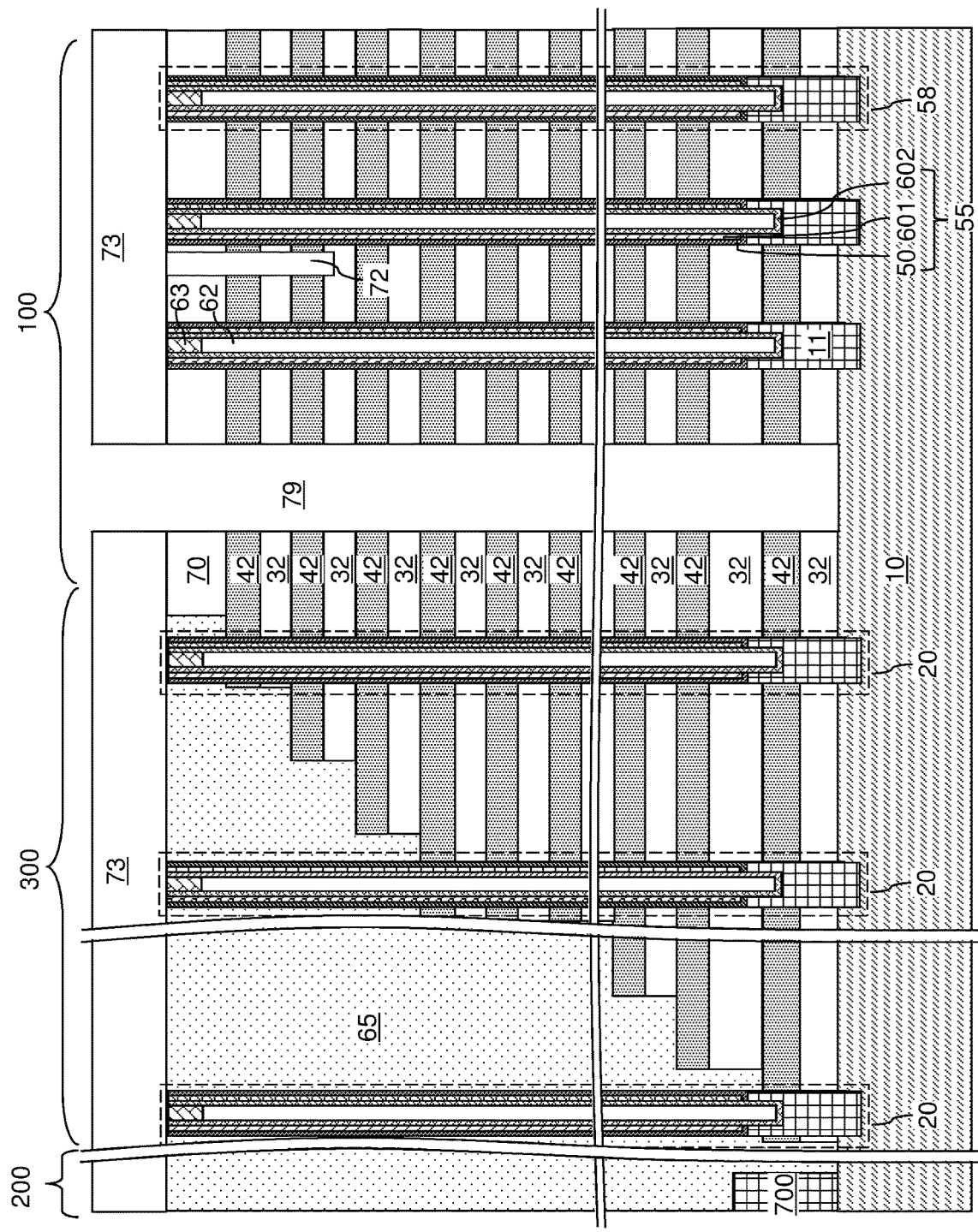
FIG. 24A is a schematic vertical cross-sectional view of the exemplary structure after formation of backside trenches according to an embodiment of the present disclosure.
Figure 24B:
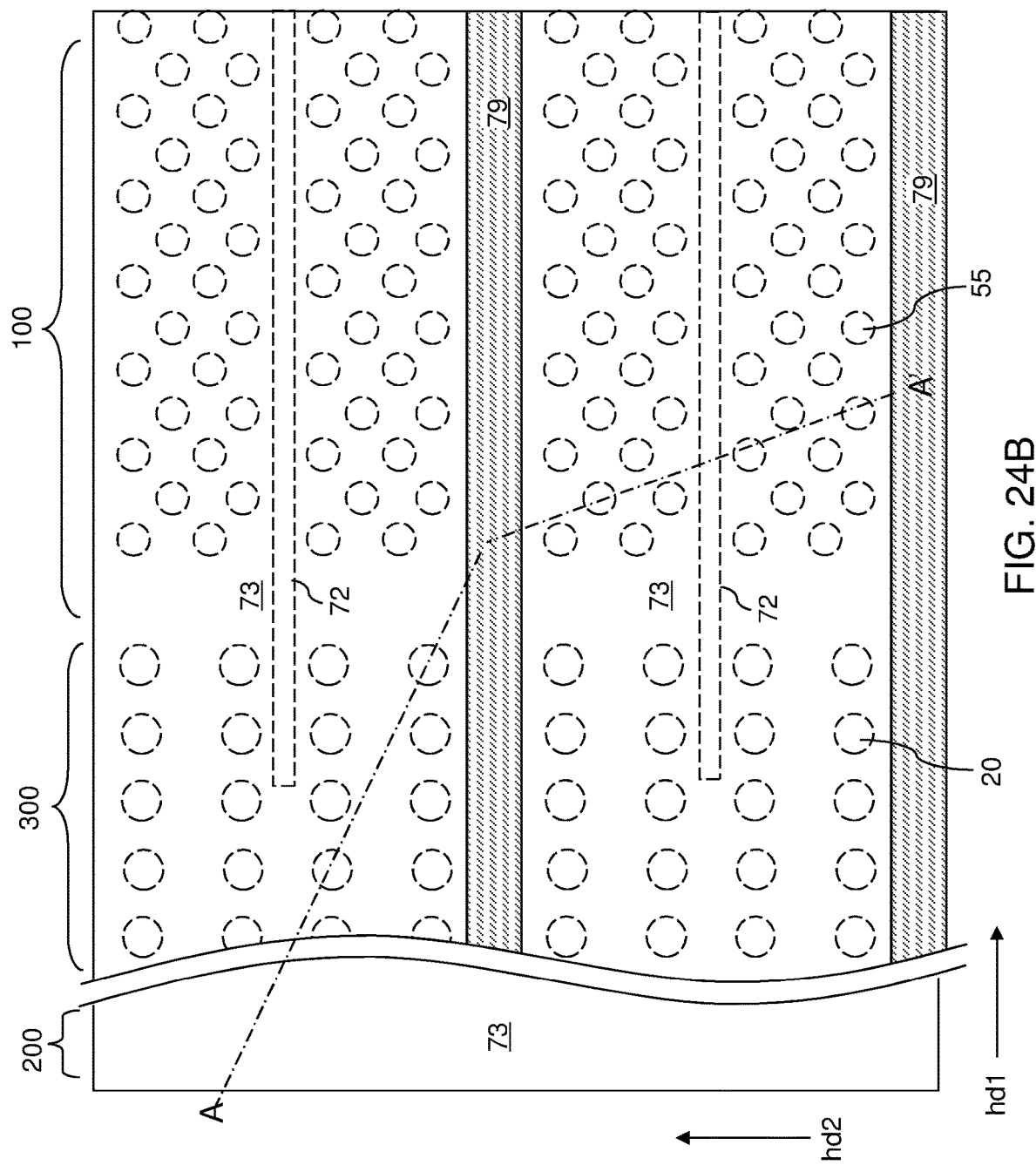
FIG. 24B is a partial see-through top-down view of the exemplary structure of FIG. 24A. The vertical plane A-A' is the plane of the schematic vertical cross-sectional view of FIG. 24A.

Referring to FIGS. 24A and 24B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the semiconductor substrate 10, and laterally extend through the memory array region 100 and the contact region 300.

In one embodiment, the backside trenches 79 can laterally extend along a first horizontal direction hd1 (e.g., word line direction) and can be laterally spaced apart one from another along a second horizontal direction hd2 (e.g., bit line direction) that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. The memory stack structures 55 located between each neighboring pair of backside trenches 79 can be configured as a memory block or string. In one embodiment, the backside trenches 79 can include a source contact opening in which a source contact via structure can be subsequently formed. The photoresist layer can be removed, for example, by ashing.

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. For example, two columns of staircases are formed for each block of memory stack structures such that one column of staircases provide physically exposed top surfaces for odd-numbered sacrificial material layers 42 (as counted from the bottom) and another column of staircases provide physically exposed top surfaces for even-numbered sacrificial material layers 42 (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

Figure 25:
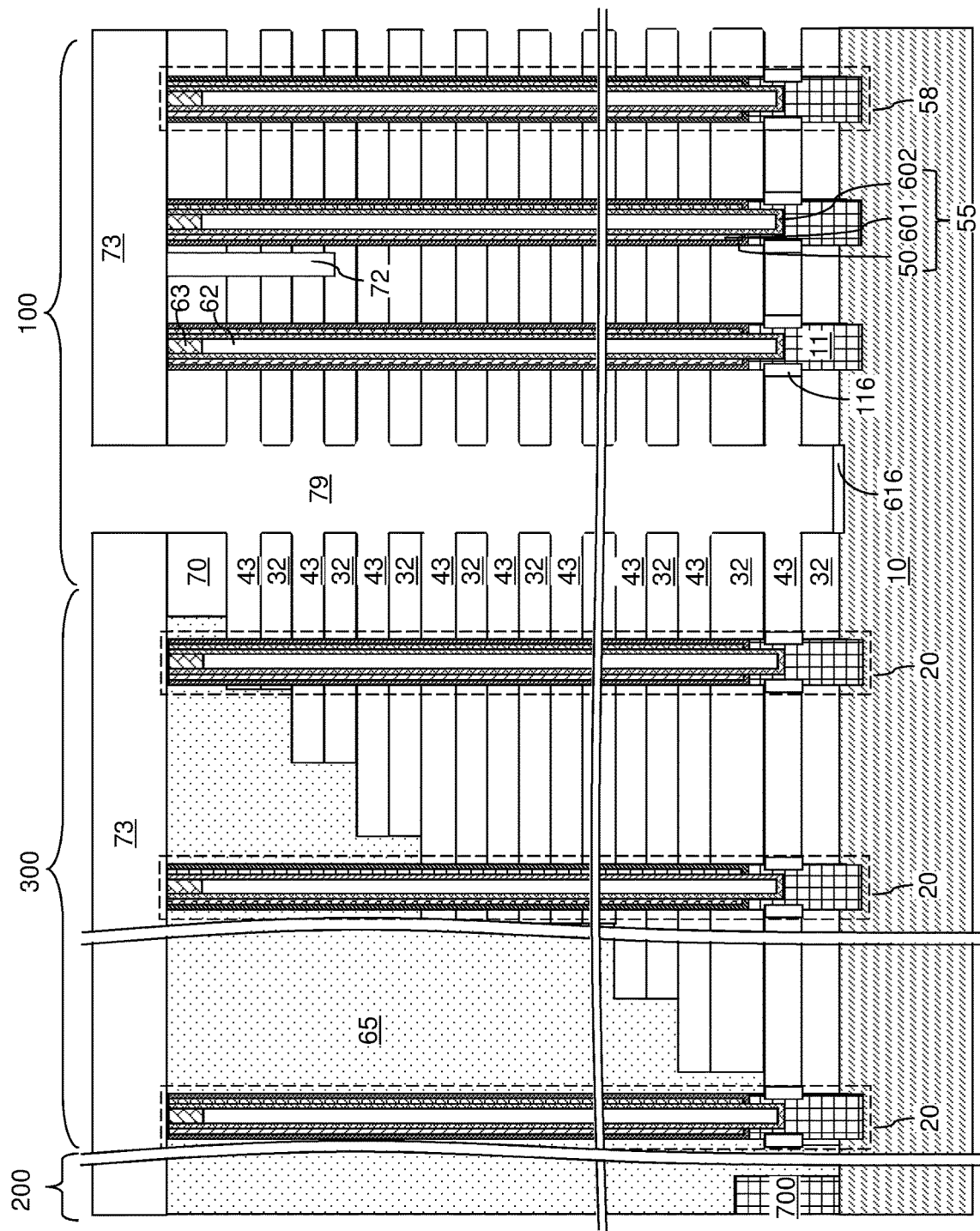
FIG. 25 is a schematic vertical cross-sectional view of the exemplary structure after formation of backside recesses according to an embodiment of the present disclosure.

Referring to FIGS. 25 and 26A, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor substrate 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the semiconductor substrate 10. In this case, each backside recess 43 can define a space for receiving a respective word line of the array of monolithic three-dimensional NAND strings.

Each of the plurality of backside recesses 43 can extend substantially parallel to the top surface of the semiconductor substrate 10. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor substrate 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor substrate 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor substrate and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor substrate 10.

Referring to FIG. 26B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 26C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 27:
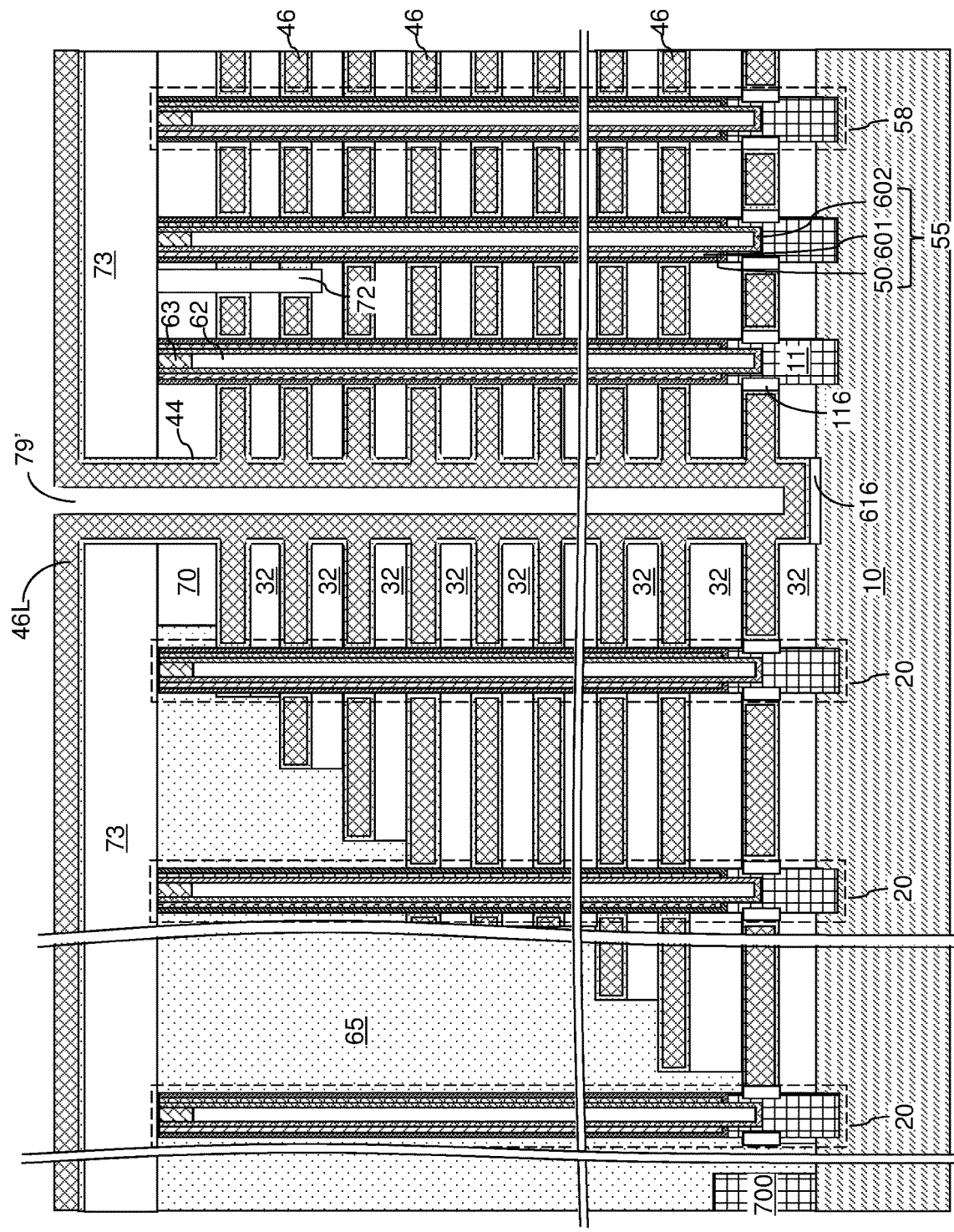
FIG. 27 is a schematic vertical cross-sectional view of the exemplary structure at the processing step of FIG. 20D.

Referring to FIGS. 26D and 27, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 28A:
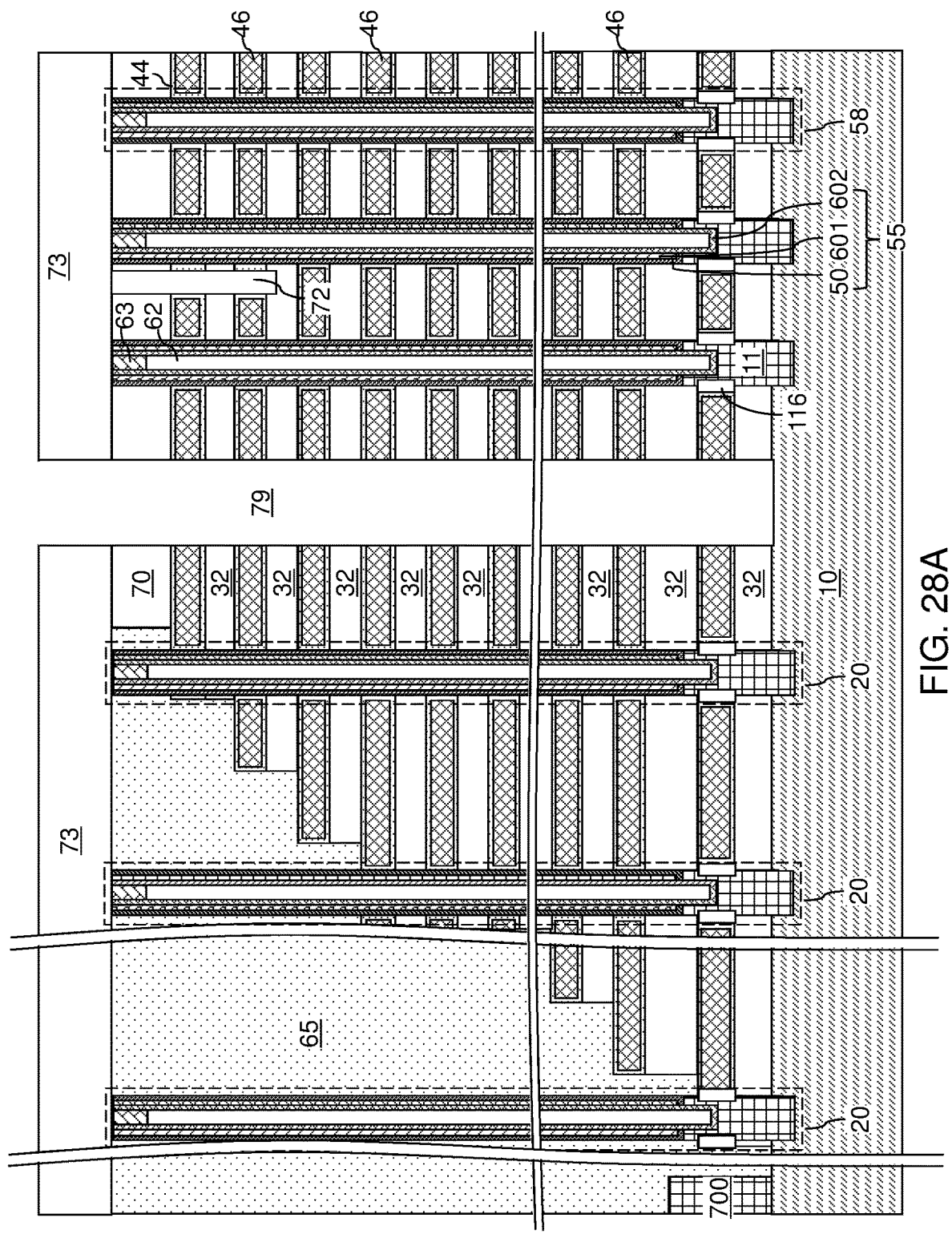
FIG. 28A is a schematic vertical cross-sectional view of the exemplary structure after removal of a deposited conductive material from within the backside trench according to an embodiment of the present disclosure.
Figure 28B:
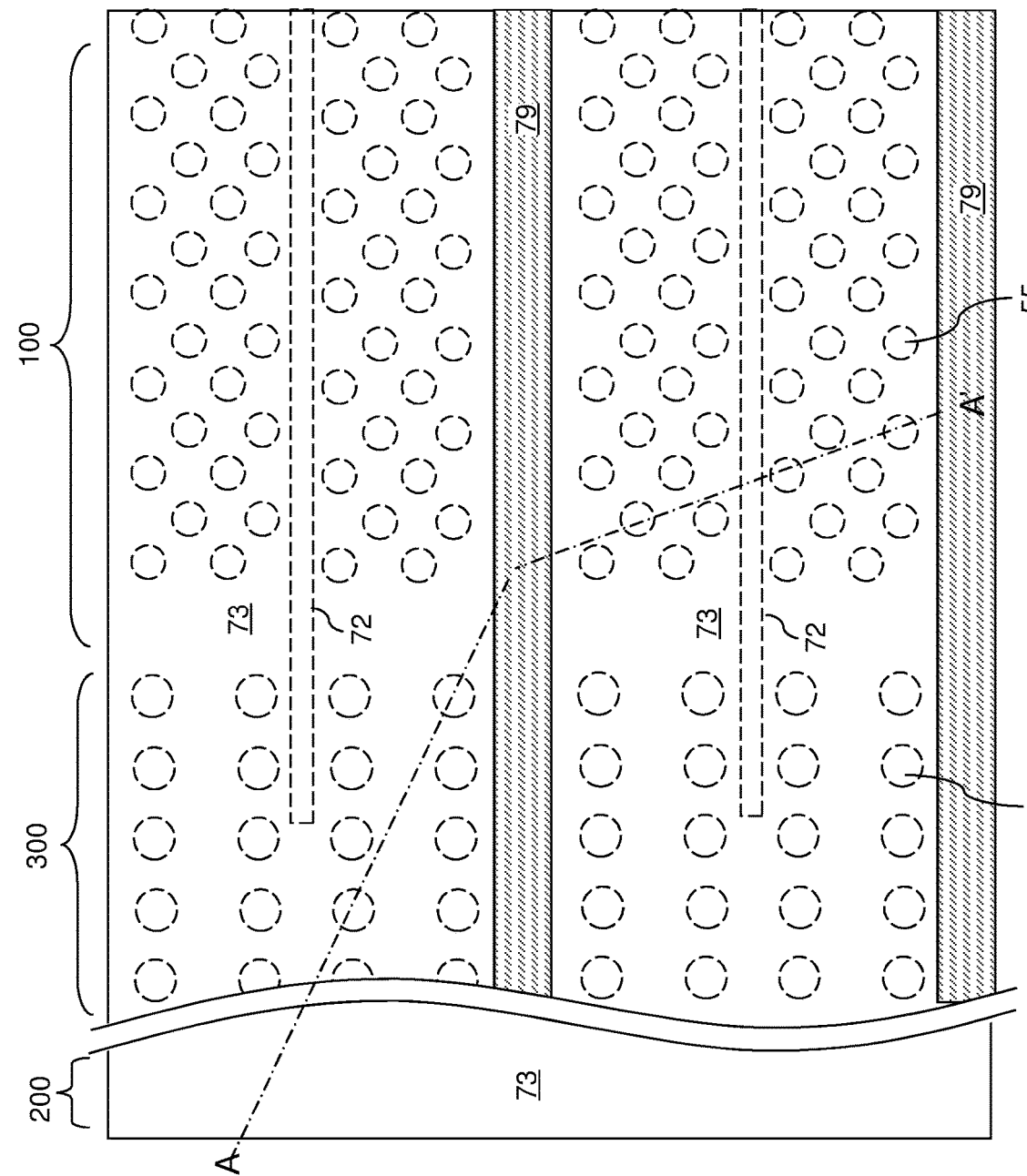
FIG. 28B is a top-down view of the exemplary structure of FIG. 28A.

Referring to FIGS. 28A and 28B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 29A:
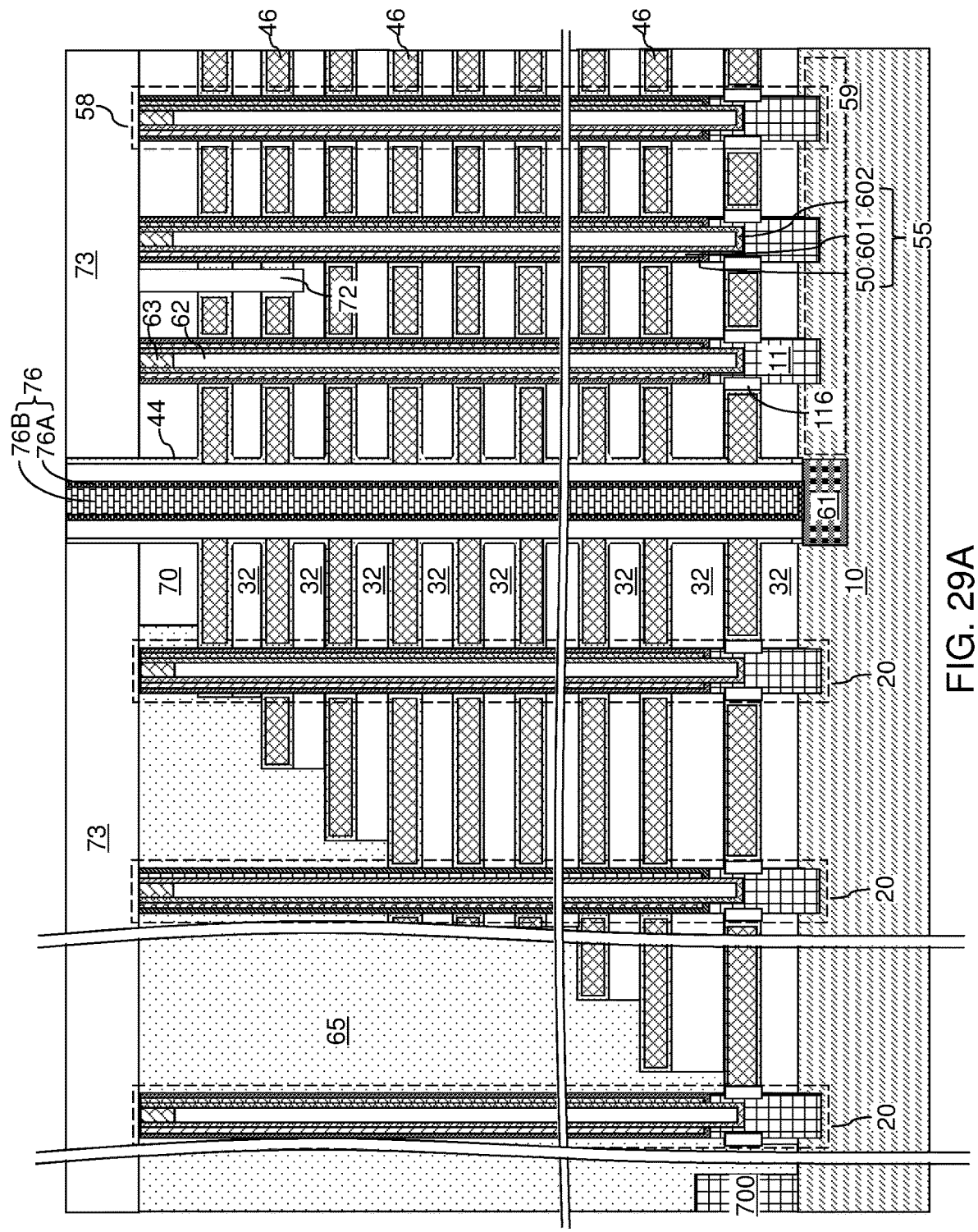
FIG. 29A is a schematic vertical cross-sectional view of the exemplary structure after formation of an insulating spacer and a backside contact structure according to an embodiment of the present disclosure.

Referring to FIGS. 29A and 29B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor substrate 10 can be physically exposed at the bottom of each backside trench 79.

A source region 61 can be formed at a surface portion of the semiconductor substrate 10 under each backside cavity 79' by implantation of electrical dopants into physically exposed surface portions of the semiconductor substrate 10. Each source region 61 is formed in a surface portion of the semiconductor substrate 10 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor substrate 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate 10. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the alternating stack (32, 46) as a stopping layer. If chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

The backside contact via structures 76 extend through the alternating stack (32, 46), and contact a top surface of the source region 61. If a backside blocking dielectric layer 44 is used, the backside contact via structures 76 can contact a sidewall of the backside blocking dielectric layer 44.

Figure 30A:
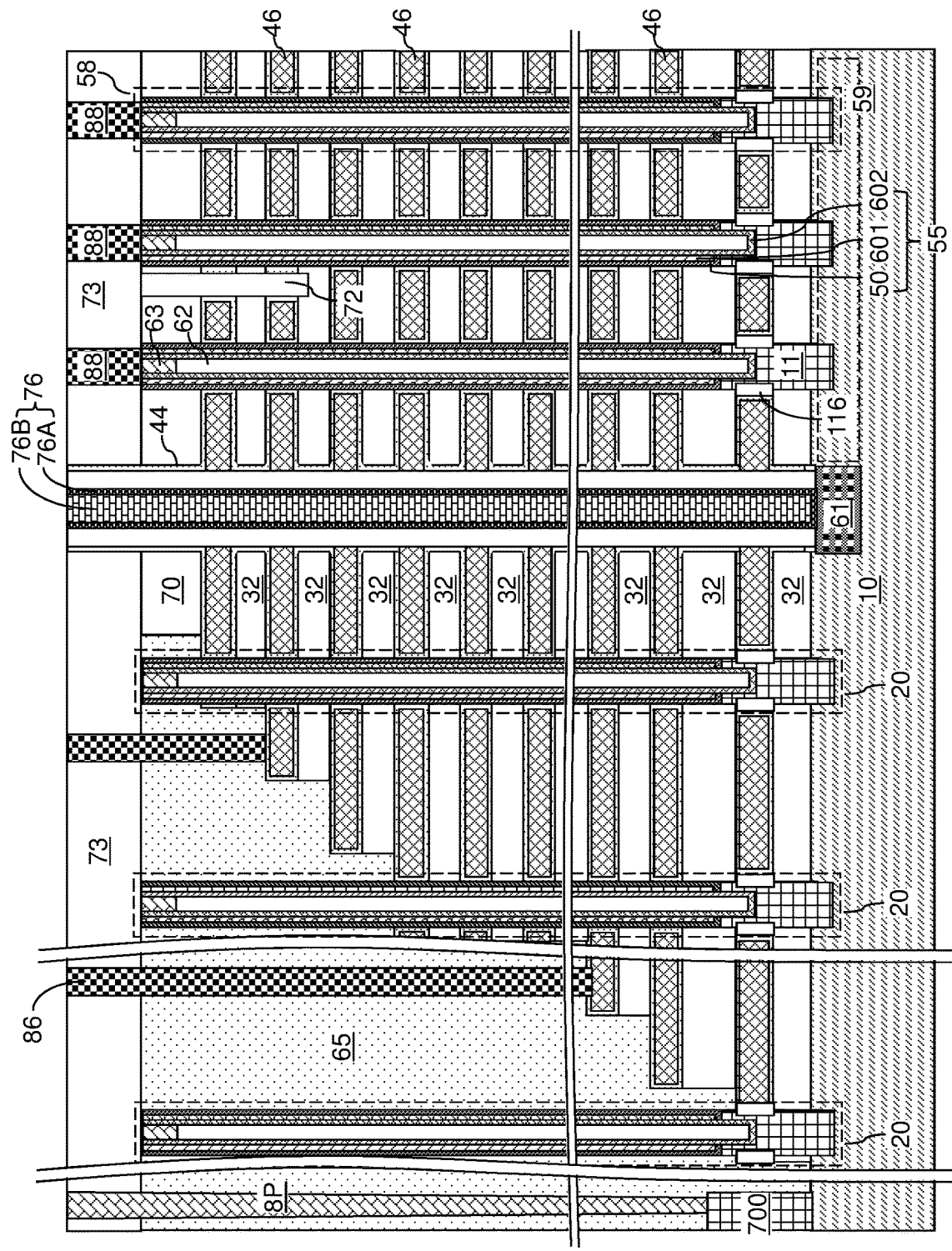
FIG. 30A is a schematic vertical cross-sectional view of the exemplary structure after formation of additional contact via structures according to an embodiment of the present disclosure.
Figure 30B:
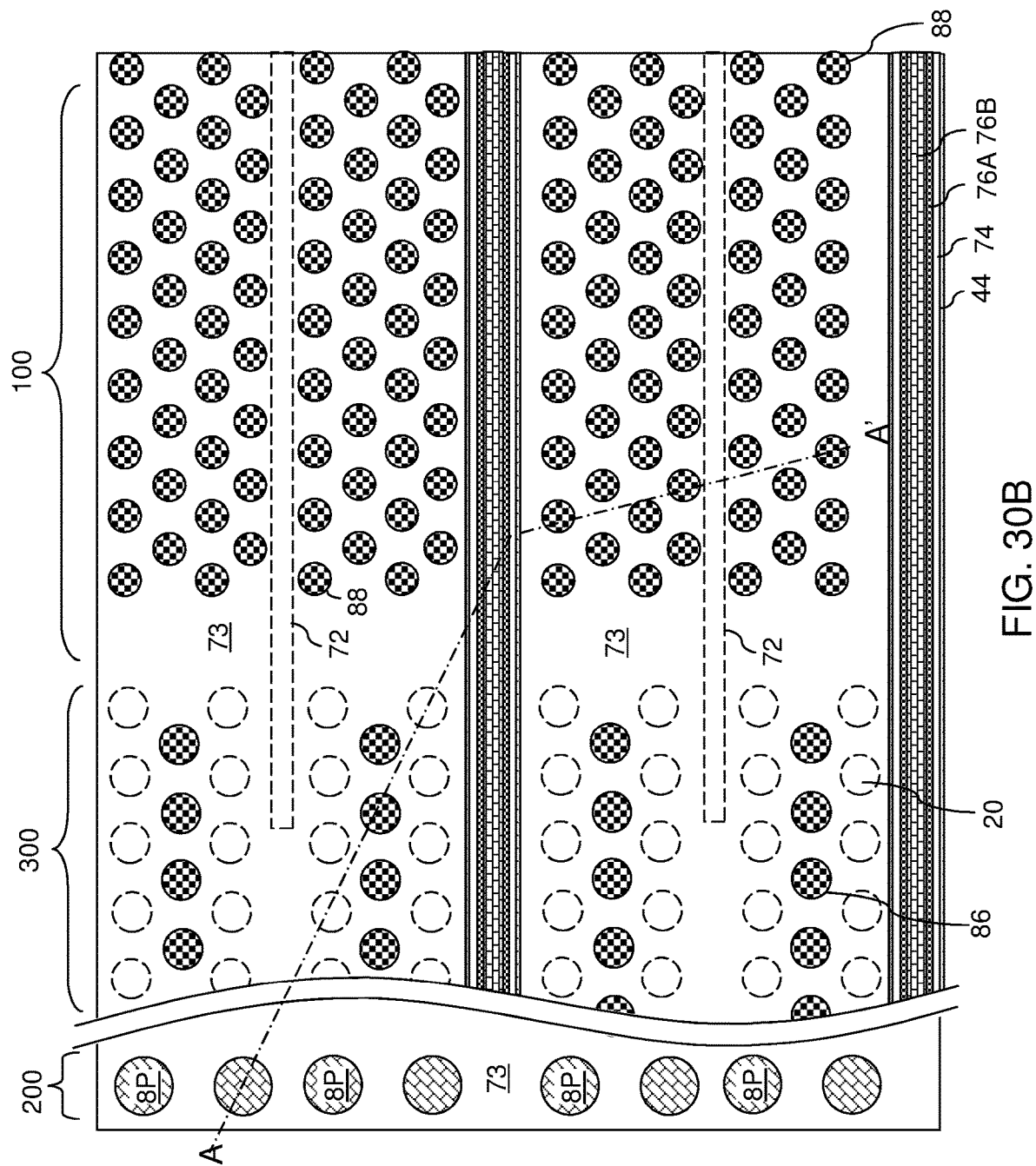
FIG. 30B is a top-down view of the exemplary structure of FIG. 30A. The vertical plane A-A' is the plane of the schematic vertical cross-sectional view of FIG. 30A.

Referring to FIGS. 30A and 30B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. The three-dimensional memory structure including an array of memory stack structures 55 is located in the memory array region 100, and is laterally spaced from the field effect transistors in the peripheral device region 200 by a silicon oxide material portion such as the retro-stepped dielectric material portion 65.

Figure 31A:
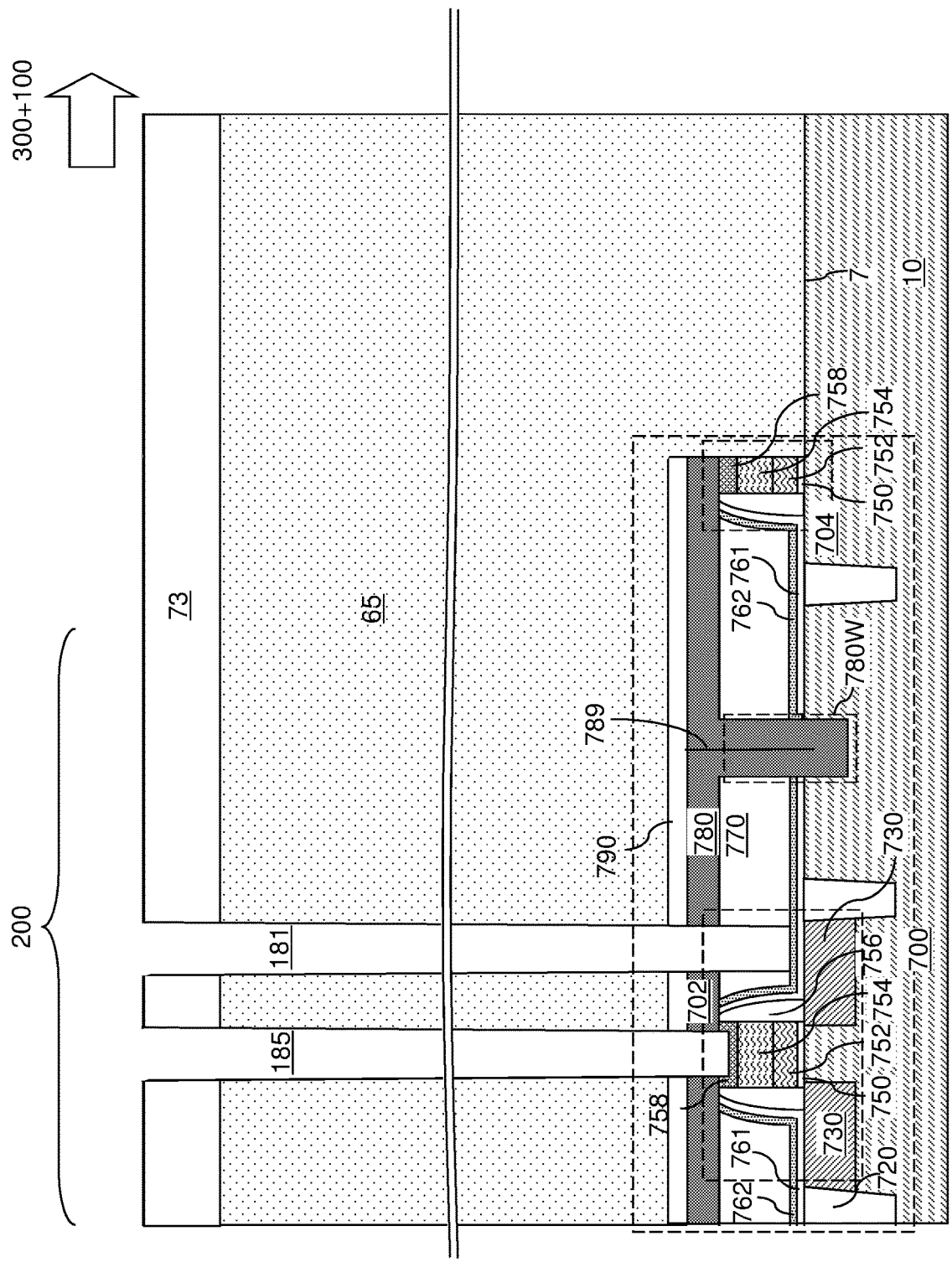
FIG. 31A is a vertical cross-sectional view of a peripheral device region of the first configuration of the exemplary structure during formation of peripheral contact via cavities according to an embodiment of the present disclosure.
Figure 31B:
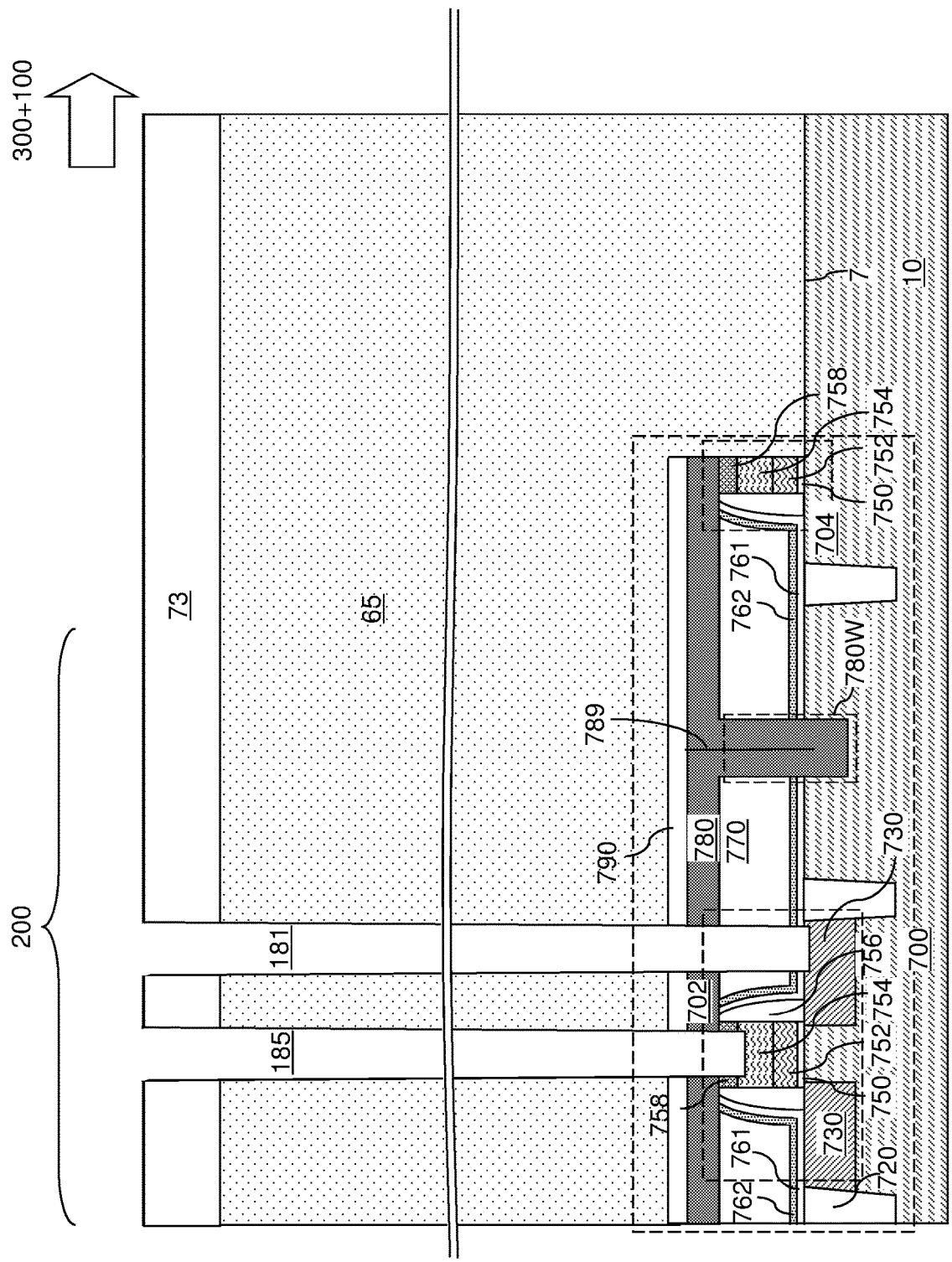
FIG. 31B is a vertical cross-sectional view of the peripheral device region of the first configuration of the exemplary structure after formation of the peripheral contact via cavities according to an embodiment of the present disclosure.
Figure 31C:
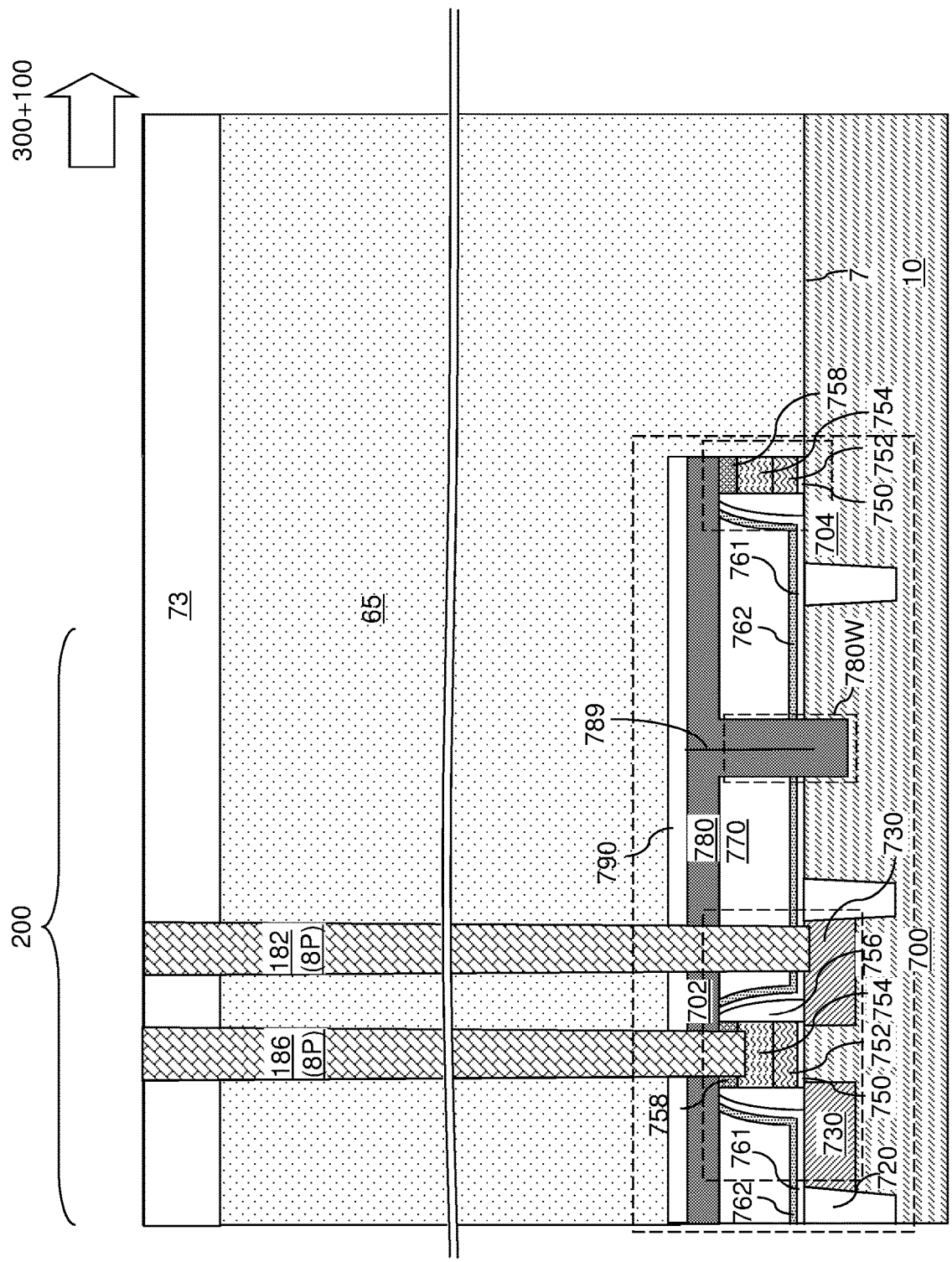
FIG. 31C is a vertical cross-sectional view of the peripheral device region of the first configuration of the exemplary structure after formation of peripheral contact via structures according to an embodiment of the present disclosure.

A processing sequence that can be used to form the peripheral device contact via structures 8P is illustrated in FIGS. 31A-31C.

Referring to FIG. 31A, the first configuration of the exemplary structure is illustrated. Peripheral device contact via cavities (181, 185) can be formed through the retro-stepped dielectric material portion 65, the optional silicon oxide cap layer 790, and the silicon nitride diffusion barrier layer 780, and into an underlying dielectric material portion. The peripheral device contact via cavities (181, 185) can include a gate contact via cavity 185 that extends into an upper portion of a gate cap silicon nitride portion 758, and an active region contact via cavity 181 that extends through the planarization dielectric layer 770 and the silicon nitride liner 762. The peripheral device contact via cavities (181, 185) can be formed by applying and patterning a photoresist layer (not shown) over the exemplary structure and lithographically patterning openings in the photoresist layer, and subsequently transferring the pattern of the openings in the photoresist layer through underlying dielectric material portions using an anisotropic etch process. The silicon nitride diffusion barrier layer 780 can be used as an etch stop layer during extension of the peripheral device contact via cavities (181, 185) through the retro-stepped dielectric material portion 65 and the optional silicon oxide cap layer 790, and the silicon nitride liner 762 can be used as an silicon oxide cap layer during extension of the active region contact via cavity 181 through the planarization dielectric layer 770.

Referring to FIG. 31B, the peripheral device contact via cavities (181, 185) are further vertically extended downward by extension of the anisotropic etch process. In one embodiment, the etching step shown in FIG. 25 occurs after removal of the sacrificial silicon nitride layers 42 shown in FIG. 18 to reduce the likelihood that hydrogen from the sacrificial silicon nitride layers 42 diffuses into the gate electrodes (752, 754) and the active regions 730 of the field effect transistors 702. The gate contact via cavity 185 extends through the gate cap silicon nitride portion 758 into an upper portion of a gate electrode (752, 754). The active region contact via cavity 181 extends through the silicon nitride liner 762 and the silicon oxide liner 761 to expose the active regions 730.

Referring to FIG. 31C, at least one conductive material can be deposited in the peripheral device contact via cavities (181, 185). The at least one conductive material can include, for example, a metal nitride liner material such as titanium nitride and a metal fill material such as tungsten. Excess portions of the at least one conductive material overlying the top surface of the contact level dielectric layer 73 can be removed, for example, by a recess etch. A remaining portion of the at least one conductive material in the gate contact via cavity 185 constitutes a gate contact via structure 186, and a remaining portion of the at least one conductive material in the active region contact via cavity 181 constitutes an active region contact via structure 182. The gate contact via structure 186 and the active region contact via structure 182 are peripheral contact via structures 8P. While only two peripheral contact via structures 8P are illustrated herein, it is understood that multiple instances of the gate contact via structure 186 and the active region contact via structure 182 can be formed.

Figure 32:
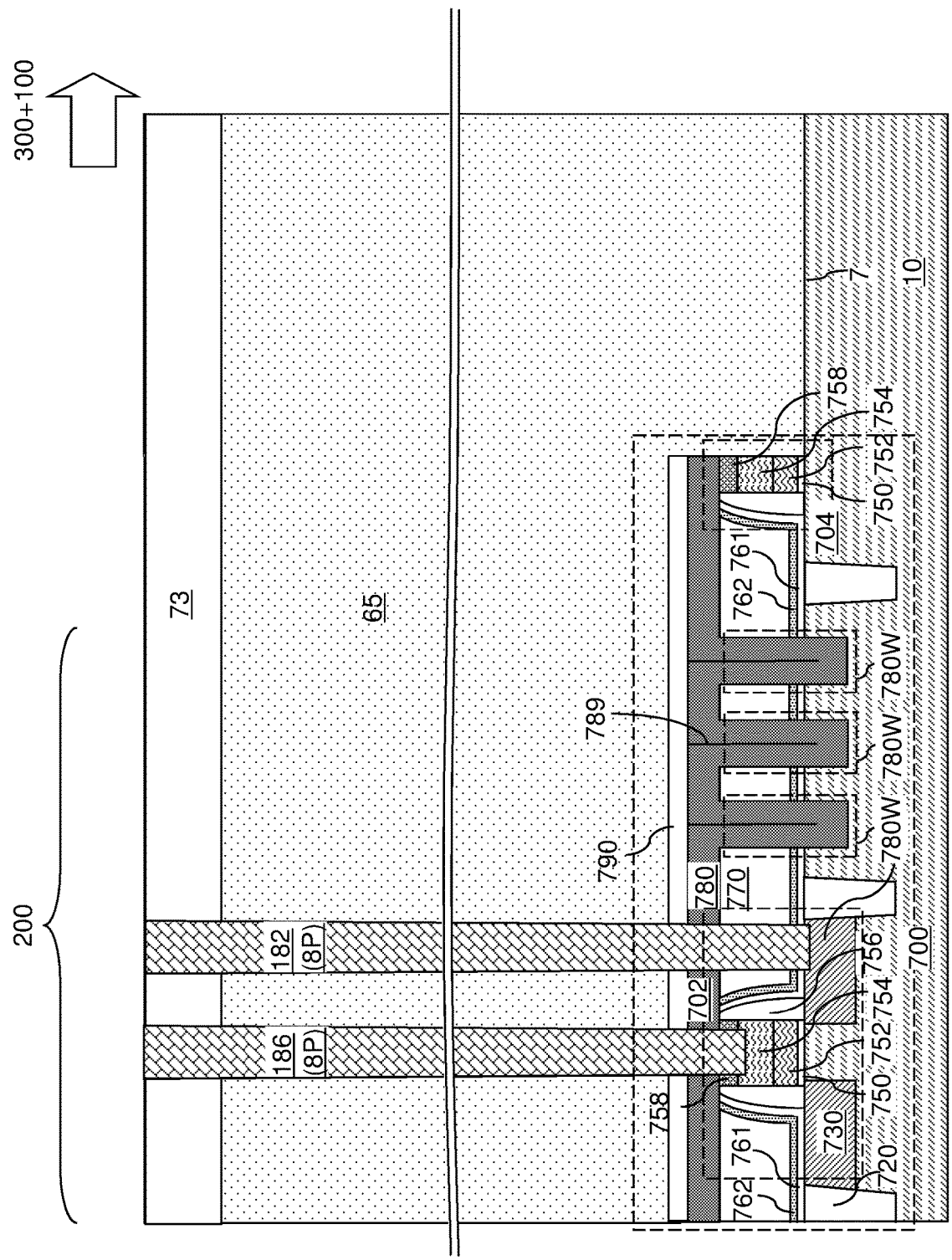
FIG. 32 is a vertical cross-sectional view of the peripheral device region of the second configuration of the exemplary structure after formation of peripheral contact via structures according to an embodiment of the present disclosure.
Figure 33:
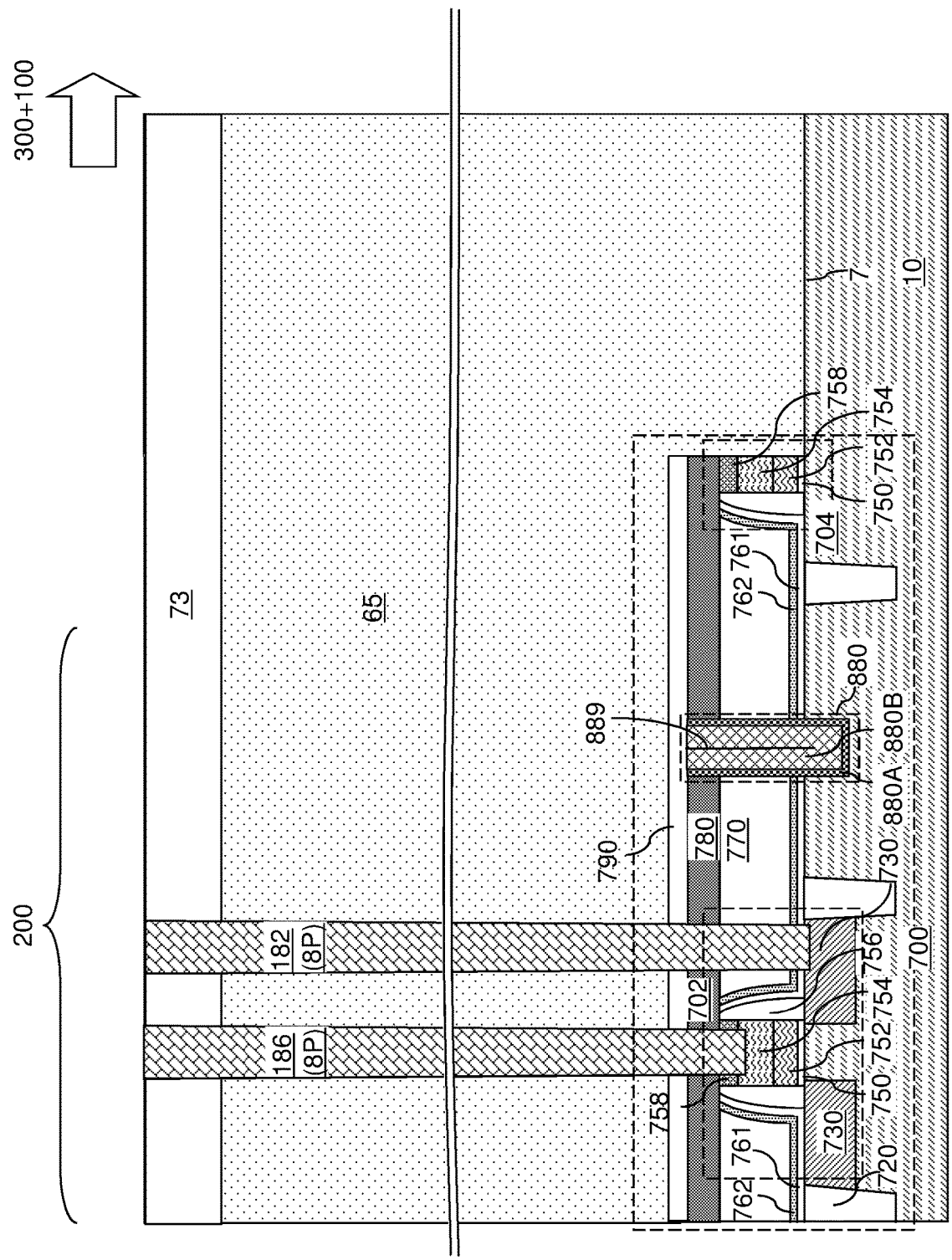
FIG. 33 is a vertical cross-sectional view of the peripheral device region of the third configuration of the exemplary structure after formation of peripheral contact via structures according to an embodiment of the present disclosure.
Figure 34:
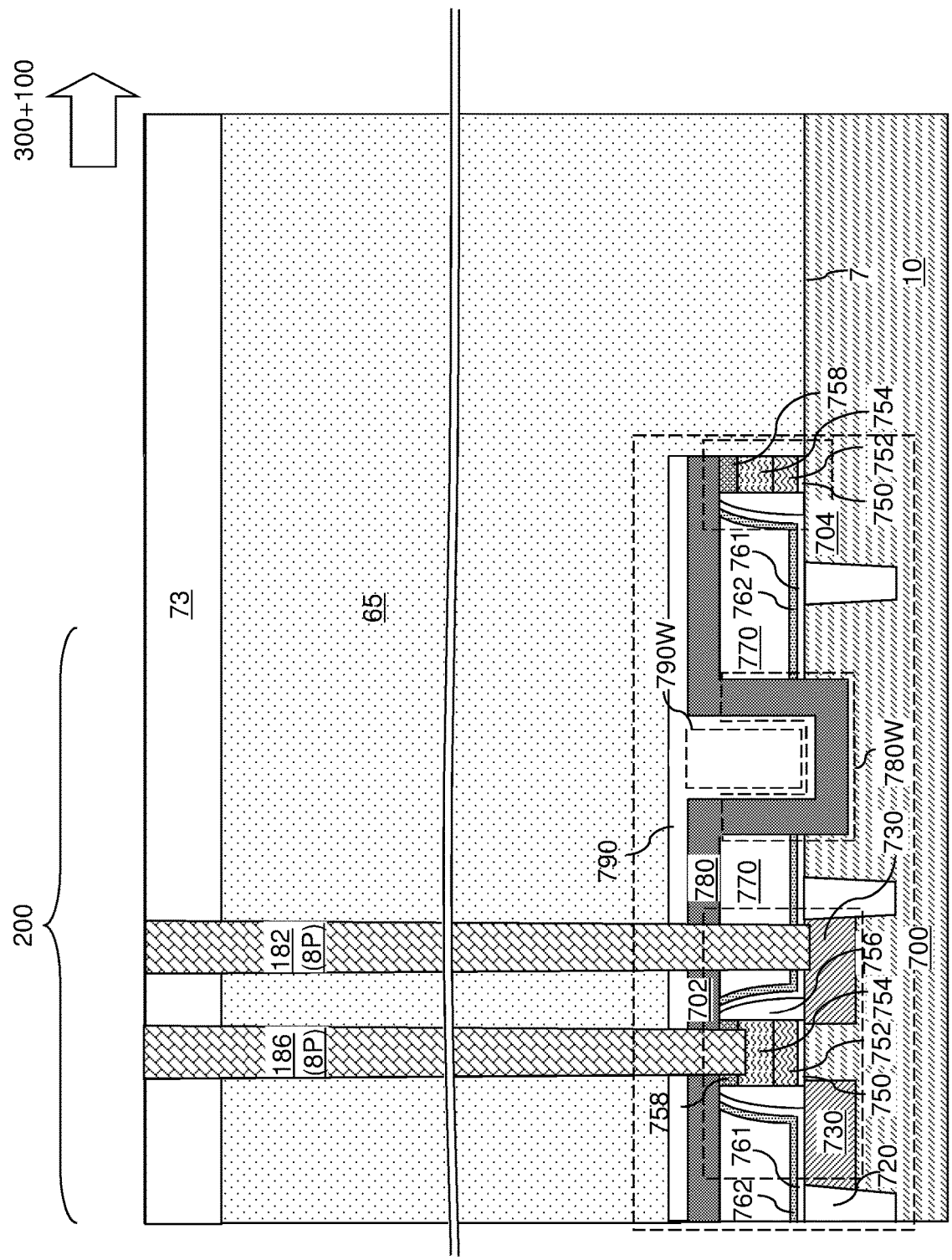
FIG. 34 is a vertical cross-sectional view of the peripheral device region of the fourth configuration of the exemplary structure after formation of peripheral contact via structures according to an embodiment of the present disclosure.

Referring to FIGS. 32-34, the peripheral device region 200 is shown for second, third, and fourth configurations of the exemplary structure at the processing steps of FIG. 31C.

Referring to all drawings and according to various embodiments of the present disclosure, a semiconductor structure is provided, which comprises: a device region 200 including field effect transistors 702 located on a semiconductor substrate 10; a planarization dielectric layer 770 overlying the field effect transistors 702; a horizontally-extending portion of a silicon nitride diffusion barrier layer 780 overlying the planarization dielectric layer 770; a moat trench 769 that extends at least from a bottom surface of the silicon nitride diffusion barrier layer 780 through the planarization dielectric layer 770 and into the semiconductor substrate 10, and laterally encloses the device region 200, wherein a bottom surface of the moat trench 769 is vertically recessed from a top surface of the semiconductor substrate 10 by a recess depth rd; and a ring-shaped hydrogen-diffusion-blocking material portion (780W, 880) located within the moat trench 769, and is adjoined to the horizontally-extending portion of the silicon nitride diffusion barrier layer 780.

In one embodiment, the ring-shaped hydrogen-diffusion-blocking material portion (780W, 880) contacts an annular bottom surface of the moat trench 769. In one embodiment, the ring-shaped hydrogen-diffusion-blocking material portion (780W, 880) contacts a set of inner sidewall surfaces of the semiconductor substrate 10 and a set of outer sidewall surfaces of the semiconductor substrate 10; the set of inner sidewall surfaces of the semiconductor substrate 10 comprises a first closed periphery that laterally surrounds the device region 200; and the set of outer sidewall surfaces of the semiconductor substrate 10 comprises a second closed periphery that laterally surrounds the device region 200.

In one embodiment, the moat trench 769 comprises: a first set of straight sidewalls (which may be vertical or tapered) that continuously extend from the bottom surface of the silicon nitride diffusion barrier layer 780 to an inner periphery of the annular bottom surface of the moat trench 769; and a second set of straight sidewalls (which may be vertical or tapered) that continuously extend from the bottom surface of the silicon nitride diffusion barrier layer 780 to an outer periphery of the annular bottom surface of the moat trench 769.

In one embodiment, the moat trench 769 has a width w that is less than twice a vertical thickness of the horizontally-extending portion of a silicon nitride diffusion barrier layer 780.

In one embodiment, the ring-shaped hydrogen-diffusion-blocking material portion (780W, 880) comprises a center seam (789, 889) that is equidistant from an inner sidewall of the moat trench and from an outer sidewall of the moat trench.

In one embodiment, the ring-shaped hydrogen-diffusion-blocking material portion 780W comprises a vertically-protruding portion of the silicon nitride diffusion barrier layer 780. In one embodiment, the ring-shaped hydrogen-diffusion-blocking material portion 780W consists of a vertically-protruding portion of the silicon nitride diffusion barrier layer 780.

In one embodiment, the semiconductor structure comprises: at least one additional moat trench 769 that extends from the bottom surface of the silicon nitride diffusion barrier layer 780 through the planarization dielectric layer 770 and into the semiconductor substrate 10, and laterally encloses the device region 200, and laterally encircles, or is laterally encircled by, the moat trench 769, wherein a bottom surface of each of the at least one additional moat trench 769 is vertically recessed from the top surface of the semiconductor substrate by the recess depth rd; and at least one additional ring-shaped hydrogen-diffusion-blocking material portion (780W, 880) that fills a respective one of the at least one additional moat trench 769, and is adjoined to the horizontally-extending portion of the silicon nitride diffusion barrier layer 780.

In one embodiment, the semiconductor structure comprises: a silicon oxide cap layer 790 located on, and over, the silicon nitride diffusion barrier layer 780, wherein the silicon oxide cap layer 790 comprises a downward-protruding annular portion 790W that protrudes into the moat trench 769; and the ring-shaped hydrogen-diffusion-blocking material portion 780W comprises an annular horizontal portion 781 that contacts an annular bottom surface of the moat trench 769, an inner sidewall portion 782 adjoined to an inner periphery of the annular horizontal portion 781, and an outer sidewall portion 783 adjoined to an outer periphery of the annular horizontal portion 781, wherein the downward-protruding annular portion 790W of the silicon oxide cap layer 790 is located between the inner sidewall portion 782 and the outer sidewall portion 783.

In one embodiment, the ring-shaped hydrogen-diffusion-blocking material portion 880 comprises a metallic material selected from an elemental metal, an intermetallic alloy, a metal-semiconductor alloy, or a compound of at least one elemental metal and at least one non-metal element.

In one embodiment, the semiconductor structure comprises: a dummy gate structure 704 located on the semiconductor substrate 10 and laterally spaced from the device region 200 by the ring-shaped hydrogen-diffusion-blocking material portion (780W, 880); and a first portion of a silicon nitride liner 762 continuously extending over the field effect transistors 702 in the device region 200 and adjoining an inner sidewall of the ring-shaped hydrogen-diffusion-blocking material portion (780W, 880); and a second portion of the silicon nitride liner 762 laterally surrounding, and contacting an outer sidewall of, the ring-shaped hydrogen-diffusion-blocking material portion (780W, 880), and extending along an outer sidewall of a gate spacer 756 located on one side of the dummy gate structure 704 and contacting the horizontally-extending portion of the silicon nitride diffusion barrier layer 780.

In one embodiment, the semiconductor structure comprises a three-dimensional memory structure located on the semiconductor substrate 10 and including memory stack structures 55 that vertically extend through an alternating stack of insulating layers 32 and electrically conductive word line layers 46 and include a respective memory film 50 and a respective vertical semiconductor channel 60, wherein the three-dimensional memory structure is laterally spaced from the device region 200 by the moat trench 769.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising: a device region including field effect transistors located on a semiconductor substrate; a planarization dielectric layer overlying the field effect transistors; a horizontally-extending portion of a silicon nitride diffusion barrier layer overlying the planarization dielectric layer; a moat trench that extends from a bottom surface of the horizontally-extending portion of the silicon nitride diffusion barrier layer through the planarization dielectric layer and into the semiconductor substrate, and laterally encloses the device region, wherein a bottom surface of the moat trench is vertically recessed from a top surface of the semiconductor substrate by a recess depth; and a ring-shaped hydrogen-diffusion-blocking material portion located within the moat trench, and adjoined to the horizontally-extending portion of the silicon nitride diffusion barrier layer.

2. The semiconductor structure of claim 1, wherein the ring-shaped hydrogen-diffusion-blocking material portion contacts an annular bottom surface of the moat trench.

3. The semiconductor structure of claim 2, wherein:
the ring-shaped hydrogen-diffusion-blocking material portion contacts a set of inner sidewall surfaces of the semiconductor substrate and a set of outer sidewall surfaces of the semiconductor substrate;
the set of inner sidewall surfaces of the semiconductor substrate comprises a first closed periphery that laterally surrounds the device region; and
the set of outer sidewall surfaces of the semiconductor substrate comprises a second closed periphery that laterally surrounds the device region.

4. The semiconductor structure of claim 2 wherein the moat trench comprises:
a first set of straight sidewalls that continuously extend from the bottom surface of the silicon nitride diffusion barrier layer to an inner periphery of the annular bottom surface of the moat trench; and
a second set of straight sidewalls that continuously extend from the bottom surface of the silicon nitride diffusion barrier layer to an outer periphery of the annular bottom surface of the moat trench.

5. The semiconductor structure of claim 1, wherein the moat trench has a width that is less than twice a vertical thickness of the horizontally-extending portion of a silicon nitride diffusion barrier layer.

6. The semiconductor structure of claim 1, wherein the ring-shaped hydrogen-diffusion-blocking material portion comprises a center seam that is equidistant from an inner sidewall of the moat trench and from an outer sidewall of the moat trench.

7. The semiconductor structure of claim 1, wherein the ring-shaped hydrogen-diffusion-blocking material portion comprises a vertically-protruding portion of the silicon nitride diffusion barrier layer.

8. The semiconductor structure of claim 7, further comprising a silicon oxide liner in contact with a top surface of the semiconductor substrate and in contact with a sidewall of the ring-shaped hydrogen-diffusion-blocking material portion.

9. The semiconductor structure of claim 7, further comprising:
- at least one additional moat trench that extends from the bottom surface of the silicon nitride diffusion barrier layer through the planarization dielectric layer and into the semiconductor substrate, laterally encloses the device region, and laterally encircles, or is laterally encircled by, the moat trench, wherein a bottom surface of each of the at least one additional moat trench is vertically recessed from the top surface of the semiconductor substrate by the recess depth; and
- at least one additional ring-shaped hydrogen-diffusion-blocking material portion that fills a respective one of the at least one additional moat trench, and is adjoined to the horizontally-extending portion of the silicon nitride diffusion barrier layer.

10. The semiconductor structure of claim 7, further comprising a silicon oxide cap layer located on, and over, the silicon nitride diffusion barrier layer,
- wherein the silicon oxide cap layer comprises a downward-protruding annular portion that protrudes into the moat trench,
- wherein the ring-shaped hydrogen-diffusion-blocking material portion comprises an annular horizontal portion that contacts an annular bottom surface of the moat trench, an inner sidewall portion adjoined to an inner periphery of the annular horizontal portion, and an outer sidewall portion adjoined to an outer periphery of the annular horizontal portion, wherein the downward-protruding annular portion of the silicon oxide cap layer is located between the inner sidewall portion and the outer sidewall portion.

11. The semiconductor structure of claim 1, further comprising:
- a dummy gate structure located on the semiconductor substrate and laterally spaced from the device region by the ring-shaped hydrogen-diffusion-blocking material portion;
- a first portion of a silicon nitride liner continuously extending over the field effect transistors in the device region and adjoining an inner sidewall of the ring-shaped hydrogen-diffusion-blocking material portion; and
- a second portion of the silicon nitride liner laterally surrounding, and contacting an outer sidewall of, the ring-shaped hydrogen-diffusion-blocking material portion, and extending along an outer sidewall of a gate spacer located on one side of the dummy gate and contacting the horizontally-extending portion of the silicon nitride diffusion barrier layer.

12. The semiconductor structure of claim 1, further comprising a three-dimensional memory structure located on the semiconductor substrate and including memory stack structures that vertically extend through an alternating stack of insulating layers and electrically conductive word line layers and include a respective memory film and a respective vertical semiconductor channel, wherein the three-dimensional memory structure is laterally spaced from the device region by the moat trench.

* * * * *